(12) United States Patent
Jandl et al.

(10) Patent No.: US 12,362,188 B2
(45) Date of Patent: Jul. 15, 2025

(54) METHOD FOR PREVENTING LINE BENDING DURING METAL FILL PROCESS

(71) Applicant: Lam Research Corporation, Fremont, CA (US)

(72) Inventors: Adam Jandl, Needham, MA (US); Sema Ermez, Santa Clara, CA (US); Lawrence Schloss, Palo Alto, CA (US); Sanjay Gopinath, Fremont, CA (US); Michal Danek, Cupertino, CA (US); Siew Neo, Sunnyvale, CA (US); Joshua Collins, Sunnyvale, CA (US); Hanna Bamnolker, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 17/662,220

(22) Filed: May 5, 2022

(65) Prior Publication Data
US 2022/0262640 A1    Aug. 18, 2022

Related U.S. Application Data

(63) Continuation of application No. 16/724,231, filed on Dec. 21, 2019, now Pat. No. 11,355,345, which is a
(Continued)

(51) Int. Cl.
*H01L 21/285* (2006.01)
*H01L 21/768* (2006.01)
*H10B 12/00* (2023.01)

(52) U.S. Cl.
CPC .. *H01L 21/28562* (2013.01); *H01L 21/28568* (2013.01); *H01L 21/76816* (2013.01);
(Continued)

(58) Field of Classification Search
None
See application file for complete search history.

(56) References Cited

U.S. PATENT DOCUMENTS

| 1,012,671 A | 12/1911 | Long |
| 4,714,520 A | 12/1987 | Gwozdz |

(Continued)

FOREIGN PATENT DOCUMENTS

| CN | 1332267 A | 1/2002 |
| CN | 1798867 A | 7/2006 |

(Continued)

OTHER PUBLICATIONS

Seghete et al., Molybdenum Atomic Layer Deposition Using MoF6 and Si2H6 as the Reactants, Chem. Mater. 2011, 23, 1668-1678 (Year: 2011).*

(Continued)

*Primary Examiner* — Xiaoming Liu
(74) *Attorney, Agent, or Firm* — Weaver Austin Villeneuve & Sampson LLP

(57) ABSTRACT

Provided herein are methods and apparatuses for reducing line bending when depositing a metal such as tungsten, molybdenum, ruthenium, or cobalt into features on substrates by periodically exposing the feature to nitrogen, oxygen, or ammonia during atomic layer deposition, chemical vapor deposition, or sequential chemical vapor deposition to reduce interactions between metal deposited onto sidewalls of a feature. Methods are suitable for deposition into V-shaped features.

14 Claims, 31 Drawing Sheets

Related U.S. Application Data continuation of application No. 15/673,320, filed on Aug. 9, 2017, now Pat. No. 10,573,522.

(60) Provisional application No. 62/375,856, filed on Aug. 16, 2016.

(52) U.S. Cl.
CPC .. *H01L 21/76876* (2013.01); *H01L 21/76877* (2013.01); *H01L 21/76879* (2013.01); *H01L 21/76898* (2013.01); *H10B 12/488* (2023.02)

(56) References Cited

U.S. PATENT DOCUMENTS

| | | |
|---|---|---|
| 5,112,439 A | 5/1992 | Reisman et al. |
| 5,407,698 A | 4/1995 | Emesh |
| 5,502,005 A | 3/1996 | Mikagi |
| 5,643,394 A | 7/1997 | Maydan et al. |
| 5,785,796 A | 7/1998 | Lee |
| 5,963,827 A | 10/1999 | Enomoto et al. |
| 6,013,575 A | 1/2000 | Itoh |
| 6,103,609 A | 8/2000 | Lee et al. |
| 6,271,084 B1 | 8/2001 | Tu et al. |
| 6,284,653 B1 | 9/2001 | Tseng |
| 6,306,216 B1 | 10/2001 | Kim et al. |
| 6,359,160 B1 | 3/2002 | Sun et al. |
| 6,503,843 B1 | 1/2003 | Xia et al. |
| 6,635,965 B1 | 10/2003 | Lee et al. |
| 6,794,287 B2 | 9/2004 | Saanila et al. |
| 6,844,258 B1 | 1/2005 | Fair et al. |
| 6,958,174 B1 | 10/2005 | Klaus et al. |
| 7,005,372 B2 | 2/2006 | Levy et al. |
| 7,141,494 B2 | 11/2006 | Lee et al. |
| 7,250,367 B2 | 7/2007 | Vaartstra et al. |
| 7,262,125 B2 | 8/2007 | Wongsenakhum et al. |
| 7,560,581 B2 | 7/2009 | Gordon et al. |
| 7,589,017 B2 | 9/2009 | Chan et al. |
| 7,655,567 B1 | 2/2010 | Gao et al. |
| 7,691,749 B2 | 4/2010 | Levy et al. |
| 7,772,114 B2 | 8/2010 | Chan et al. |
| 7,955,972 B2 | 6/2011 | Chan et al. |
| 8,053,365 B2 | 11/2011 | Humayun et al. |
| 8,058,170 B2 | 11/2011 | Chandrashekar et al. |
| 8,089,128 B2 | 1/2012 | Ramaswamy et al. |
| 8,101,521 B1 | 1/2012 | Gao et al. |
| 8,129,270 B1 | 3/2012 | Chandrashekar et al. |
| 8,278,216 B1 | 10/2012 | Alers et al. |
| 8,409,985 B2 | 4/2013 | Chan et al. |
| 9,034,768 B2 | 5/2015 | Chandrashekar et al. |
| 9,076,646 B2 | 7/2015 | Sims et al. |
| 9,082,826 B2 | 7/2015 | Chandrashekar et al. |
| 9,159,571 B2 | 10/2015 | Humayun et al. |
| 9,165,824 B2 | 10/2015 | Chandhok et al. |
| 9,175,023 B2 | 11/2015 | Odedra et al. |
| 9,236,297 B2 | 1/2016 | Chen et al. |
| 9,240,347 B2 | 1/2016 | Chandrashekar et al. |
| 9,349,637 B2 | 5/2016 | Na et al. |
| 9,548,266 B2 | 1/2017 | Ajuria et al. |
| 9,583,385 B2 | 2/2017 | Lee et al. |
| 9,595,470 B2 | 3/2017 | Bamnolker et al. |
| 9,613,818 B2 | 4/2017 | Ba et al. |
| 9,653,353 B2 | 5/2017 | Chandrashekar et al. |
| 9,659,998 B1 | 5/2017 | Lung |
| 9,748,137 B2 | 8/2017 | Lai et al. |
| 9,899,372 B1 | 2/2018 | Bi et al. |
| 9,978,605 B2 | 5/2018 | Bamnolker et al. |
| 9,997,405 B2 | 6/2018 | Chandrashekar et al. |
| 10,079,144 B2 | 9/2018 | Kim et al. |
| 10,094,021 B2 | 10/2018 | Lansalot-Matras et al. |
| 10,103,058 B2 | 10/2018 | Chandrashekar et al. |
| 10,121,671 B2 | 11/2018 | Fu et al. |
| 10,170,320 B2 | 1/2019 | Wang et al. |
| 10,193,059 B2 | 1/2019 | Lee et al. |
| 10,211,099 B2 | 2/2019 | Wang et al. |
| 10,242,879 B2 | 3/2019 | Na et al. |
| 10,256,142 B2 | 4/2019 | Chandrashekar et al. |
| 10,283,404 B2 | 5/2019 | Na et al. |
| 10,395,984 B2 | 8/2019 | Backes et al. |
| 10,505,111 B1 | 12/2019 | Ok et al. |
| 10,510,590 B2 | 12/2019 | Thombare et al. |
| 10,510,951 B1 | 12/2019 | Yu et al. |
| 10,566,211 B2 | 2/2020 | Chandrashekar et al. |
| 10,573,522 B2 * | 2/2020 | Jandl .............. H01L 21/76876 |
| 10,580,654 B2 | 3/2020 | Wang et al. |
| 10,580,695 B2 | 3/2020 | Chandrashekar et al. |
| 10,622,375 B2 | 4/2020 | Chun et al. |
| 10,643,826 B2 | 5/2020 | Kim et al. |
| 10,643,904 B2 | 5/2020 | Xie et al. |
| 10,731,250 B2 | 8/2020 | Kim et al. |
| 10,734,238 B2 | 8/2020 | Zhou et al. |
| 10,777,453 B2 | 9/2020 | Thombare et al. |
| 10,916,434 B2 | 2/2021 | Wang et al. |
| 10,995,405 B2 | 5/2021 | Dezelah et al. |
| 11,075,115 B2 | 7/2021 | Chandrashekar et al. |
| 11,211,253 B2 | 12/2021 | Zhou et al. |
| 11,355,345 B2 * | 6/2022 | Jandl .................. C23C 16/045 |
| 11,549,175 B2 | 1/2023 | Butail et al. |
| 11,821,071 B2 | 11/2023 | Blakeney |
| 11,970,776 B2 | 4/2024 | Collins et al. |
| 12,074,029 B2 | 8/2024 | Van Cleemput et al. |
| 2001/0002326 A1 | 5/2001 | Yang et al. |
| 2002/0009872 A1 | 1/2002 | Hoshino et al. |
| 2002/0024140 A1 | 2/2002 | Nakajima et al. |
| 2002/0045355 A1 | 4/2002 | Chong et al. |
| 2002/0090811 A1 | 7/2002 | Kim et al. |
| 2002/0132472 A1 | 9/2002 | Park |
| 2003/0019428 A1 | 1/2003 | Ku et al. |
| 2003/0082296 A1 | 5/2003 | Elers et al. |
| 2003/0082902 A1 | 5/2003 | Fukui et al. |
| 2003/0190802 A1 | 10/2003 | Wang et al. |
| 2003/0194825 A1 | 10/2003 | Law et al. |
| 2003/0194850 A1 | 10/2003 | Lewis et al. |
| 2003/0203123 A1 | 10/2003 | Shang et al. |
| 2003/0209193 A1 | 11/2003 | Van Wijck |
| 2003/0222346 A1 | 12/2003 | Yun et al. |
| 2004/0149386 A1 | 8/2004 | Numasawa et al. |
| 2004/0202786 A1 | 10/2004 | Wongsenakhum et al. |
| 2005/0014365 A1 | 1/2005 | Moon et al. |
| 2005/0031786 A1 | 2/2005 | Lee et al. |
| 2005/0179141 A1 | 8/2005 | Yun et al. |
| 2005/0186342 A1 * | 8/2005 | Sager .................. C25D 7/0614 427/248.1 |
| 2005/0212139 A1 | 9/2005 | Leinikka et al. |
| 2005/0277296 A1 | 12/2005 | Adetutu et al. |
| 2005/0282384 A1 | 12/2005 | Nawafune et al. |
| 2006/0040052 A1 | 2/2006 | Fang et al. |
| 2006/0046521 A1 | 3/2006 | Vaartstra et al. |
| 2006/0075966 A1 | 4/2006 | Chen et al. |
| 2006/0102950 A1 | 5/2006 | Takebuchi et al. |
| 2006/0115590 A1 | 6/2006 | Suzuki et al. |
| 2007/0009658 A1 | 1/2007 | Yoo et al. |
| 2007/0066060 A1 | 3/2007 | Wang |
| 2007/0077712 A1 | 4/2007 | Joo et al. |
| 2007/0166989 A1 | 7/2007 | Fresco et al. |
| 2007/0215852 A1 | 9/2007 | Lung |
| 2007/0232015 A1 | 10/2007 | Liu |
| 2007/0264105 A1 | 11/2007 | Pharand et al. |
| 2008/0014352 A1 | 1/2008 | Xi et al. |
| 2008/0054468 A1 | 3/2008 | Choi et al. |
| 2008/0061282 A1 | 3/2008 | Sato et al. |
| 2008/0116437 A1 | 5/2008 | Oh et al. |
| 2008/0124926 A1 | 5/2008 | Chan et al. |
| 2008/0170984 A1 | 7/2008 | Tenne et al. |
| 2008/0197335 A1 | 8/2008 | Yu |
| 2008/0206987 A1 | 8/2008 | Gelatos et al. |
| 2008/0227291 A1 | 9/2008 | Lai et al. |
| 2008/0254623 A1 | 10/2008 | Chan et al. |
| 2008/0268642 A1 | 10/2008 | Yanagita et al. |
| 2008/0280390 A1 | 11/2008 | Kim et al. |
| 2008/0303014 A1 | 12/2008 | Goux et al. |
| 2008/0317972 A1 | 12/2008 | Hendriks et al. |
| 2009/0004848 A1 | 1/2009 | Kim et al. |
| 2009/0053426 A1 | 2/2009 | Lu et al. |

(56) References Cited

U.S. PATENT DOCUMENTS

| | | |
|---|---|---|
| 2009/0053893 A1 | 2/2009 | Khandelwal et al. |
| 2009/0081374 A1 | 3/2009 | Yang et al. |
| 2009/0149022 A1 | 6/2009 | Chan et al. |
| 2009/0163025 A1 | 6/2009 | Humayun et al. |
| 2009/0183984 A1 | 7/2009 | Sakuma et al. |
| 2009/0212280 A1 | 8/2009 | Werner et al. |
| 2009/0239368 A1 | 9/2009 | Park et al. |
| 2009/0304914 A1 | 12/2009 | Nalla et al. |
| 2010/0072623 A1 | 3/2010 | Prindle et al. |
| 2010/0107927 A1 | 5/2010 | Stewart et al. |
| 2010/0130002 A1 | 5/2010 | Dao et al. |
| 2010/0144140 A1 | 6/2010 | Chandrashekar et al. |
| 2010/0159694 A1 | 6/2010 | Chandrashekar et al. |
| 2010/0167527 A1 | 7/2010 | Wu et al. |
| 2010/0168404 A1 | 7/2010 | Girolami et al. |
| 2010/0176512 A1 | 7/2010 | Yang et al. |
| 2010/0207245 A1 | 8/2010 | Cheng et al. |
| 2010/0213541 A1 | 8/2010 | Jeon et al. |
| 2010/0267230 A1 | 10/2010 | Chandrashekar et al. |
| 2010/0267235 A1 | 10/2010 | Chen et al. |
| 2010/0320607 A1 | 12/2010 | Suzuki |
| 2011/0020546 A1 | 1/2011 | Hamalainen et al. |
| 2011/0021024 A1 | 1/2011 | Calvo-Munoz et al. |
| 2011/0111533 A1 | 5/2011 | Varadarajan et al. |
| 2011/0146568 A1* | 6/2011 | Haukka ............ C23C 16/45525 118/200 |
| 2011/0151615 A1 | 6/2011 | Gordon et al. |
| 2011/0151670 A1 | 6/2011 | Lee et al. |
| 2011/0155993 A1 | 6/2011 | Chen |
| 2011/0223763 A1 | 9/2011 | Chan et al. |
| 2011/0233778 A1 | 9/2011 | Lee et al. |
| 2011/0256645 A1 | 10/2011 | Tam et al. |
| 2011/0287184 A1 | 11/2011 | Shenai-Khatkhate et al. |
| 2012/0045589 A1 | 2/2012 | Ivanov et al. |
| 2012/0077342 A1 | 3/2012 | Gao et al. |
| 2012/0119177 A1 | 5/2012 | Erbetta |
| 2012/0177845 A1 | 7/2012 | Odedra et al. |
| 2012/0187305 A1 | 7/2012 | Elam et al. |
| 2012/0231626 A1 | 9/2012 | Lee et al. |
| 2012/0305872 A1 | 12/2012 | Yoon |
| 2013/0062677 A1 | 3/2013 | Li et al. |
| 2013/0109172 A1 | 5/2013 | Collins et al. |
| 2013/0164928 A1 | 6/2013 | Lim et al. |
| 2013/0189837 A1 | 7/2013 | Haukka et al. |
| 2013/0260555 A1 | 10/2013 | Zope et al. |
| 2013/0270703 A1* | 10/2013 | Zierath ............ H01L 21/76831 438/653 |
| 2013/0302980 A1 | 11/2013 | Chandrashekar et al. |
| 2014/0106083 A1 | 4/2014 | Wu et al. |
| 2014/0138604 A1 | 5/2014 | Liu et al. |
| 2014/0147589 A1 | 5/2014 | Khandelwal et al. |
| 2014/0217590 A1 | 8/2014 | Nalla et al. |
| 2014/0231896 A1 | 8/2014 | Matsumori et al. |
| 2014/0264932 A1 | 9/2014 | Ting et al. |
| 2014/0370192 A1* | 12/2014 | Odedra .................. C23C 16/18 427/255.6 |
| 2015/0093890 A1 | 4/2015 | Blackwell et al. |
| 2015/0162214 A1 | 6/2015 | Thompson et al. |
| 2015/0170961 A1 | 6/2015 | Romero et al. |
| 2015/0179461 A1 | 6/2015 | Bamnolker et al. |
| 2015/0262939 A1 | 9/2015 | Sakata |
| 2015/0294906 A1 | 10/2015 | Wu et al. |
| 2015/0325475 A1 | 11/2015 | Bamnolker et al. |
| 2015/0348840 A1 | 12/2015 | Bamnolker et al. |
| 2015/0354064 A1 | 12/2015 | Kolics et al. |
| 2015/0361547 A1 | 12/2015 | Lin et al. |
| 2016/0027614 A1 | 1/2016 | Manna et al. |
| 2016/0040289 A1 | 2/2016 | Gatineau et al. |
| 2016/0056074 A1* | 2/2016 | Na .................... H01L 21/76843 438/666 |
| 2016/0056077 A1 | 2/2016 | Lai et al. |
| 2016/0064409 A1 | 3/2016 | Yaegashi |
| 2016/0077435 A1 | 3/2016 | Ban et al. |
| 2016/0093528 A1 | 3/2016 | Chandrashekar et al. |
| 2016/0104624 A1 | 4/2016 | Fu et al. |
| 2016/0109800 A1 | 4/2016 | Bae et al. |
| 2016/0118345 A1 | 4/2016 | Chen et al. |
| 2016/0141419 A1 | 5/2016 | Baenninger et al. |
| 2016/0168699 A1* | 6/2016 | Fukazawa ............ C23C 16/405 427/576 |
| 2016/0172211 A1 | 6/2016 | Demos et al. |
| 2016/0181272 A1 | 6/2016 | Rabkin et al. |
| 2016/0190008 A1 | 6/2016 | Chandrashekar et al. |
| 2016/0225632 A1 | 8/2016 | Shaikh et al. |
| 2016/0293467 A1 | 10/2016 | Caveney et al. |
| 2016/0300952 A1 | 10/2016 | Toriumi et al. |
| 2016/0309596 A1 | 10/2016 | Shaviv et al. |
| 2016/0343612 A1 | 11/2016 | Wang et al. |
| 2016/0351401 A1 | 12/2016 | Ba et al. |
| 2016/0351444 A1 | 12/2016 | Schloss et al. |
| 2017/0040214 A1 | 2/2017 | Lai et al. |
| 2017/0062224 A1 | 3/2017 | Fu et al. |
| 2017/0062714 A1 | 3/2017 | Kau |
| 2017/0069527 A1 | 3/2017 | Haukka et al. |
| 2017/0117155 A1 | 4/2017 | Bamnolker et al. |
| 2017/0125548 A1 | 5/2017 | Hung et al. |
| 2017/0229341 A1* | 8/2017 | Chang .................. H01L 23/528 |
| 2017/0268107 A1 | 9/2017 | Lansalot-Matras et al. |
| 2017/0278749 A1 | 9/2017 | Chandrashekar et al. |
| 2017/0294381 A1 | 10/2017 | Briggs et al. |
| 2017/0306479 A1 | 10/2017 | Raisanen et al. |
| 2017/0306490 A1 | 10/2017 | Chan et al. |
| 2017/0350008 A1 | 12/2017 | Collins et al. |
| 2017/0358482 A1 | 12/2017 | Chen et al. |
| 2017/0365513 A1 | 12/2017 | Yang et al. |
| 2018/0019165 A1 | 1/2018 | Baum et al. |
| 2018/0053660 A1 | 2/2018 | Jandl et al. |
| 2018/0142345 A1 | 5/2018 | Meng et al. |
| 2018/0151497 A1 | 5/2018 | Makala et al. |
| 2018/0166276 A1 | 6/2018 | Nakao et al. |
| 2018/0174901 A1 | 6/2018 | Wang et al. |
| 2018/0240675 A1 | 8/2018 | Bamnolker et al. |
| 2018/0240676 A1 | 8/2018 | Chan et al. |
| 2018/0247832 A1 | 8/2018 | Fischer et al. |
| 2018/0261503 A1 | 9/2018 | Meng et al. |
| 2018/0277431 A1 | 9/2018 | Chandrashekar et al. |
| 2018/0286668 A1 | 10/2018 | Baum et al. |
| 2018/0294187 A1 | 10/2018 | Thombare et al. |
| 2018/0308701 A1 | 10/2018 | Na et al. |
| 2018/0342390 A1 | 11/2018 | Xiao et al. |
| 2018/0355484 A1 | 12/2018 | Lansalot-Matras et al. |
| 2019/0003050 A1 | 1/2019 | Dezelah et al. |
| 2019/0006226 A1 | 1/2019 | Khare et al. |
| 2019/0019725 A1 | 1/2019 | Chandrashekar et al. |
| 2019/0067003 A1 | 2/2019 | Zope et al. |
| 2019/0067014 A1 | 2/2019 | Shrestha et al. |
| 2019/0067094 A1 | 2/2019 | Zope et al. |
| 2019/0080914 A1 | 3/2019 | Wang et al. |
| 2019/0088474 A1 | 3/2019 | MacDonald et al. |
| 2019/0088555 A1 | 3/2019 | Xie et al. |
| 2019/0157102 A1 | 5/2019 | Jian et al. |
| 2019/0157141 A1 | 5/2019 | Liao et al. |
| 2019/0161853 A1 | 5/2019 | Aoyama et al. |
| 2019/0177838 A1 | 6/2019 | Cadot et al. |
| 2019/0189456 A1 | 6/2019 | Mullick et al. |
| 2019/0189688 A1 | 6/2019 | Lille |
| 2019/0206731 A1 | 7/2019 | Chandrashekar et al. |
| 2019/0226086 A1 | 7/2019 | Wright, Jr. et al. |
| 2019/0256467 A1 | 8/2019 | Anthis et al. |
| 2019/0273019 A1 | 9/2019 | Mullick et al. |
| 2019/0326168 A1 | 10/2019 | Yang et al. |
| 2019/0368039 A1 | 12/2019 | Arteaga et al. |
| 2019/0371662 A1 | 12/2019 | Chen et al. |
| 2020/0006073 A1 | 1/2020 | Smith et al. |
| 2020/0010954 A1 | 1/2020 | Bhuyan et al. |
| 2020/0075403 A1 | 3/2020 | Thombare et al. |
| 2020/0105515 A1 | 4/2020 | Maes et al. |
| 2020/0111675 A1 | 4/2020 | Takatsuki et al. |
| 2020/0144066 A1 | 5/2020 | Jandl et al. |
| 2020/0152870 A1 | 5/2020 | Lin et al. |
| 2020/0185225 A1 | 6/2020 | Wang et al. |
| 2020/0185273 A1 | 6/2020 | Chandrashekar et al. |
| 2020/0194670 A1 | 6/2020 | Allegra |
| 2020/0199743 A1 | 6/2020 | Wright, Jr. et al. |

(56) References Cited

U.S. PATENT DOCUMENTS

| | | |
|---|---|---|
| 2020/0219933 A1 | 7/2020 | Cheng |
| 2020/0227275 A1 | 7/2020 | Mullick et al. |
| 2020/0242209 A1 | 7/2020 | Bowes et al. |
| 2020/0332416 A1 | 10/2020 | Fluit |
| 2020/0343136 A1 | 10/2020 | Yu et al. |
| 2020/0365456 A1 | 11/2020 | Thombare et al. |
| 2020/0402846 A1 | 12/2020 | Collins et al. |
| 2021/0047726 A1 | 2/2021 | Liu et al. |
| 2021/0057223 A1 | 2/2021 | Stevens et al. |
| 2021/0082750 A1 | 3/2021 | Yu et al. |
| 2021/0098532 A1 | 4/2021 | Wu |
| 2021/0140043 A1 | 5/2021 | Thombare et al. |
| 2021/0238736 A1 | 8/2021 | Butail et al. |
| 2021/0277517 A1 | 9/2021 | Liu et al. |
| 2021/0285102 A1 | 9/2021 | Yoon et al. |
| 2021/0313183 A1 | 10/2021 | Ba et al. |
| 2021/0320034 A1 | 10/2021 | Lei et al. |
| 2021/0327754 A1 | 10/2021 | Chandrashekar et al. |
| 2021/0348271 A1 | 11/2021 | Mishra et al. |
| 2021/0407809 A1 | 12/2021 | Zope et al. |
| 2022/0013365 A1 | 1/2022 | Van Cleemput et al. |
| 2022/0018017 A1 | 1/2022 | Kim et al. |
| 2022/0020641 A1 | 1/2022 | Chandrashekar et al. |
| 2022/0037163 A1 | 2/2022 | Yang et al. |
| 2022/0044929 A1 | 2/2022 | Xiao et al. |
| 2022/0102208 A1 | 3/2022 | Chandrashekar et al. |
| 2022/0139713 A1 | 5/2022 | Färm et al. |
| 2022/0170155 A1 | 6/2022 | Blakeney |
| 2022/0195598 A1 | 6/2022 | Collins et al. |
| 2022/0220136 A1 | 7/2022 | Leoncini et al. |
| 2022/0220139 A1 | 7/2022 | Leoncini et al. |
| 2022/0220607 A1 | 7/2022 | Leoncini et al. |
| 2022/0223471 A1 | 7/2022 | Thombare et al. |
| 2022/0285211 A1 | 9/2022 | Färm et al. |
| 2022/0298624 A1 | 9/2022 | Blakeney et al. |
| 2022/0328317 A1 | 10/2022 | Na et al. |
| 2022/0356579 A1 | 11/2022 | Collins et al. |
| 2022/0359211 A1 | 11/2022 | Van Cleemput et al. |
| 2022/0375792 A1 | 11/2022 | Schloss et al. |
| 2022/0389579 A1 | 12/2022 | Thombare et al. |
| 2023/0290680 A1 | 9/2023 | Collins et al. |
| 2023/0326790 A1 | 10/2023 | Tarafdar et al. |
| 2024/0052486 A1 | 2/2024 | Blakeney |
| 2024/0136192 A1 | 4/2024 | Schloss et al. |
| 2024/0234152 A9 | 7/2024 | Schloss et al. |
| 2024/0271281 A1 | 8/2024 | Collins et al. |
| 2024/0297075 A1 | 9/2024 | Thombare et al. |

FOREIGN PATENT DOCUMENTS

| | | |
|---|---|---|
| CN | 1957446 A | 5/2007 |
| CN | 101154576 A | 4/2008 |
| CN | 101213320 A | 7/2008 |
| CN | 101308794 A | 11/2008 |
| CN | 101313085 A | 11/2008 |
| CN | 101447427 A | 6/2009 |
| CN | 101752299 A | 6/2010 |
| CN | 101770978 A | 7/2010 |
| CN | 101899649 A | 12/2010 |
| CN | 102206387 A | 10/2011 |
| CN | 102224574 A | 10/2011 |
| CN | 102892922 A | 1/2013 |
| CN | 103125013 A | 5/2013 |
| CN | 102206387 B | 4/2014 |
| CN | 104272440 A | 1/2015 |
| CN | 104752339 A | 7/2015 |
| CN | 105097446 A | 11/2015 |
| CN | 105280549 A | 1/2016 |
| CN | 106575626 A | 4/2017 |
| CN | 107305838 A | 10/2017 |
| CN | 107710443 A | 2/2018 |
| CN | 107768304 A | 3/2018 |
| CN | 109072424 A | 12/2018 |
| CN | 109563621 A | 4/2019 |
| CN | 109661481 A | 4/2019 |
| EP | 1167567 A1 | 1/2002 |
| EP | 1672687 A1 | 6/2006 |
| EP | 1728894 A1 | 12/2006 |
| EP | 2779224 A2 | 9/2014 |
| JP | S595246 A | 1/1984 |
| JP | H02187031 A | 7/1990 |
| JP | H02231714 A | 9/1990 |
| JP | H04142061 A | 5/1992 |
| JP | H05226280 A | 9/1993 |
| JP | H0794488 A | 4/1995 |
| JP | H07147321 A | 6/1995 |
| JP | H07226393 A | 8/1995 |
| JP | H0922896 A | 1/1997 |
| JP | 2001172049 A | 6/2001 |
| JP | 2001257177 A | 9/2001 |
| JP | 2001274105 A | 10/2001 |
| JP | 2001284360 A | 10/2001 |
| JP | 2002016066 A | 1/2002 |
| JP | 2005150416 A | 6/2005 |
| JP | 2007019375 A | 1/2007 |
| JP | 2007182443 A | 7/2007 |
| JP | 2007251164 A | 9/2007 |
| JP | 2008177577 A | 7/2008 |
| JP | 2008205219 A | 9/2008 |
| JP | 2008211183 A | 9/2008 |
| JP | 2010251760 A | 11/2010 |
| JP | 2011035366 A | 2/2011 |
| JP | 2011199021 A | 10/2011 |
| JP | 2012246531 A | 12/2012 |
| JP | 2014074190 A | 4/2014 |
| JP | 2014511380 A | 5/2014 |
| JP | 2014183185 A | 9/2014 |
| JP | 2015021175 A | 2/2015 |
| JP | 2016098406 A | 5/2016 |
| JP | 2016516892 A | 6/2016 |
| JP | 2016164131 A | 9/2016 |
| JP | 2017053024 A | 3/2017 |
| JP | 2017525156 A | 8/2017 |
| JP | 2018035375 A | 3/2018 |
| JP | 2019044266 A | 3/2019 |
| JP | 2019527302 A | 9/2019 |
| JP | 2019186508 A | 10/2019 |
| JP | 2020513065 A | 4/2020 |
| JP | 2021523983 A | 9/2021 |
| JP | 2021535575 A | 12/2021 |
| JP | 7485736 B2 | 5/2024 |
| KR | 19980011846 U | 5/1998 |
| KR | 0138381 B1 | 6/1998 |
| KR | 20010030488 A | 4/2001 |
| KR | 20010048302 A | 6/2001 |
| KR | 20030043201 A | 6/2003 |
| KR | 100477840 B1 | 6/2005 |
| KR | 20050054122 A | 6/2005 |
| KR | 20050087428 A | 8/2005 |
| KR | 20060087844 A | 8/2006 |
| KR | 20070054100 A | 5/2007 |
| KR | 100757418 B1 | 9/2007 |
| KR | 20080001460 A | 1/2008 |
| KR | 20080061978 A | 7/2008 |
| KR | 20080094088 A | 10/2008 |
| KR | 20090068187 A | 6/2009 |
| KR | 20090074560 A | 7/2009 |
| KR | 20100067065 A | 6/2010 |
| KR | 20100068845 A | 6/2010 |
| KR | 20100096488 A | 9/2010 |
| KR | 20110024932 A | 3/2011 |
| KR | 20110108382 A | 10/2011 |
| KR | 20150063562 A | 6/2015 |
| KR | 20150077376 A | 7/2015 |
| KR | 20150108780 A | 9/2015 |
| KR | 20150128615 A | 11/2015 |
| KR | 20160098986 A | 8/2016 |
| KR | 101745074 B1 | 6/2017 |
| KR | 20170095801 A | 8/2017 |
| KR | 20180019487 A | 2/2018 |
| KR | 20190024834 A | 3/2019 |
| KR | 20190130046 A | 11/2019 |
| KR | 20200056543 A | 5/2020 |
| KR | 20200090108 A | 7/2020 |

(56) References Cited

FOREIGN PATENT DOCUMENTS

| | | | |
|---|---|---|---|
| KR | 20210156444 A | 12/2021 | |
| TW | 201120233 A | 6/2011 | |
| TW | 201123305 A | 7/2011 | |
| TW | 201130045 A | 9/2011 | |
| TW | 201405707 A | 2/2014 | |
| TW | 201405781 A | 2/2014 | |
| TW | 201525173 A | 7/2015 | |
| TW | 201542857 A | 11/2015 | |
| TW | 201626503 A | 7/2016 | |
| TW | 201705490 A | 2/2017 | |
| TW | 201710543 A | 3/2017 | |
| TW | 201738405 A | 11/2017 | |
| TW | 201741325 A | 12/2017 | |
| TW | 201812069 A | 4/2018 | |
| TW | 201812070 A | 4/2018 | |
| TW | 201907037 A | 2/2019 | |
| TW | 201920740 A | 6/2019 | |
| WO | WO-2006036865 A2 | 4/2006 | |
| WO | WO-2007005088 A2 | 1/2007 | |
| WO | WO-2011027834 A1 | 3/2011 | |
| WO | WO-2012047591 A1 | 4/2012 | |
| WO | WO-2013148444 A1 | 10/2013 | |
| WO | WO-2013148490 A1 | 10/2013 | |
| WO | WO-2013148880 A1 | 10/2013 | |
| WO | WO-2014052642 A1 | 4/2014 | |
| WO | WO-2014105477 A1 | 7/2014 | |
| WO | WO-2015023404 A1 | 2/2015 | |
| WO | WO-2016191432 A1 | 12/2016 | |
| WO | WO-2017070634 A1 | 4/2017 | |
| WO | WO-2017091571 A1 | 6/2017 | |
| WO | WO-2017143246 A1 | 8/2017 | |
| WO | WO-2018191183 A1 | 10/2018 | |
| WO | WO-2019099233 A1 | 5/2019 | |
| WO | WO-2019232344 A1 | 12/2019 | |
| WO | WO-2020023790 A1 | 1/2020 | |
| WO | WO-2020028587 A1 | 2/2020 | |
| WO | WO-2020106649 A1 | 5/2020 | |
| WO | WO-2020185618 A1 | 9/2020 | |
| WO | WO-2021035236 A1 | 2/2021 | |
| WO | WO-2021046058 A1 | 3/2021 | |
| WO | WO-2021076636 A1 | 4/2021 | |
| WO | WO-2021178399 A1 | 9/2021 | |
| WO | WO-2021237032 A1 | 11/2021 | |
| WO | WO-2022108762 A1 | 5/2022 | |
| WO | WO-2022150270 A1 | 7/2022 | |
| WO | WO-2022221210 A1 | 10/2022 | |

OTHER PUBLICATIONS

Advisory Action dated Sep. 1, 2021, in U.S. Appl. No. 16/294,736.
Advisory Action dated Sep. 1, 2021, in U.S. Appl. No. 16/457,353.
Chinese Fifth Office Action dated Aug. 24, 2018 issued in Application No. CN 201380022693.8.
Chinese First Office Action dated Apr. 2, 2021 issued in Application No. CN 201910499775.0.
Chinese First Office Action dated Dec. 12, 2017 issued in Application No. CN 201510518752.1.
Chinese First Office Action dated Dec. 20, 2017 issued in Application No. CN 201510644832.1.
Chinese First Office Action dated Feb. 26, 2016, issued in CN 201380022648.2.
Chinese First Office Action dated Jan. 4, 2021 issued in Application No. CN 201710700258.6.
Chinese first Office Action dated Jul. 27, 2018 issued in Application No. CN 201610332922.1.
Chinese First Office Action dated Jun. 3, 2019 issued in Application No. CN 201711372325.2.
Chinese First Office Action dated Mar. 18, 2016 issued in Application No. CN 201380022693.8.
Chinese First Office Action dated Oct. 27, 2020 issued in Application No. CN 201811491805.5.
Chinese Fourth Office Action dated Mar. 15, 2018 issued in Application No. CN 201380022693.8.
Chinese Second Office Action dated Aug. 17, 2018 issued in Application No. CN 201510644832.1.
Chinese Second Office Action dated Aug. 24, 2018 issued in Application No. CN 201510518752.1.
Chinese Second Office Action dated Jan. 23, 2017 issued in Application No. CN 201380022693.8.
Chinese Second Office Action dated Jun. 17, 2021 issued in Application No. CN 201710700258.6.
Chinese Second Office Action dated May 7, 2020 issued in Application No. CN 201711372325.2.
Chinese Third Office Action dated Dec. 1, 2020 issued in Application No. CN 201711372325.2.
Chinese Third Office Action dated Feb. 14, 2019 issued in Application No. CN 201510644832.1.
Chinese Third Office Action dated Sep. 25, 2017 issued in Application No. CN 201380022693.8.
Chinese Third Office [Decision of Final Rejection] Action dated Mar. 6, 2019 issued in Application No. CN 201510518752.1.
Chiu, H. et al., "Deposition of Molybdenum Carbonitride Thin Films from Mo(NBu$^t$)$_2$(NHBu$^t$)$_2$", J. Mater. Res, Jul. 1994, vol. 9, No. 7, pp. 1622-1624.
CN Office action dated Apr. 7, 2022 in CN Application No. CN201910499775.
CN Office action dated Oct. 25, 2021 in CN Application No. CN201910499775 with English translation.
Co-pending U.S. Appl. No. 17/497,702, filed Oct. 8, 2021.
Co-pending U.S. Appl. No. 17/589,416, filed Jan. 31, 2022.
Co-pending U.S. pending U.S. Appl. No. 17/763,529, filed Mar. 24, 2022.
Final Office Action dated May 23, 2019 issued in U.S. Appl. No. 15/948,143.
Final Office Action dated Sep. 2, 2021 issued in U.S. Appl. No. 16/947,286.
International Preliminary Report on Patentability dated Mar. 10, 2022, in Application No. PCT/US2020/070434.
International Preliminary Report on Patentability dated Mar. 3, 2022, in Application No. PCT/US2020/070390.
International Search Report and Written Opinion dated Feb. 3, 2021, in Application No. PCT/US2020/055596.
International Preliminary Report on Patentability dated Apr. 28, 2022, in PCT Application No. PCT/US2020/055596.
International Preliminary Report on Patentability dated Aug. 12, 2021, issued in Application No. PCT/US2020/015241.
International Preliminary Report on Patentability dated Feb. 4, 2021 in Application No. PCT/US2019/043514.
International Preliminary Report on Patentability dated Jun. 17, 2021 issued in Application No. PCT/US2019/064768.
International Preliminary Report on Patentability dated Jun. 3, 2021 in Application No. PCT/US2019/062067.
International Preliminary Report on Patentability dated Jun. 4, 2020 in Application No. PCT/US2018/061803.
International Preliminary Report on Patentability dated Mar. 17, 2022 in PCT Application No. PCT/US2020/048951.
International Preliminary Report on Patentability dated Nov. 12, 2020 in Application No. PCT/US2019/030712.
International Preliminary Report on Patentability dated Oct. 24, 2019 in Application No. PCT/US2018/026746.
International Preliminary Report on Patentability dated Sep. 23, 2021 issued in Application No. PCT/US2020/021543.
International Search Report and Written Opinion dated Aug. 19, 2019 in Application No. PCT/US2019/030712.
International Search Report and Written Opinion dated Dec. 4, 2020, in PCT Application No. PCT/US2020/048951.
International Search Report and Written Opinion dated Feb. 4, 2021, in PCT Application No. PCT/US2020/070390.
International Search Report and Written Opinion dated Jul. 1, 2020 in Application No. PCT/US2020/021543.
International Search Report and Written Opinion dated Jul. 27, 2018 in Application No. PCT/US2018/026746.
International Search Report and Written Opinion dated Jun. 3, 2020, issued in Application No. PCT/US2020/015241.
International Search Report and Written Opinion dated Mar. 27, 2020 issued in Application No. PCT/US2019/064768.

(56) References Cited

OTHER PUBLICATIONS

International Search Report and Written Opinion dated Mar. 8, 2019 in Application No. PCT/US2018/061803.
International Search Report and Written Opinion dated Mar. 9, 2020 in Application No. PCT/US2019/062067.
International Search Report and Written Opinion dated Nov. 11, 2019 in Application No. PCT/US2019/043514.
International Search Report and Written Opinion dated Nov. 11, 2020 issued in Application No. PCT/US2020/070434.
Jamie, W. et al., "In Situ Atomic Layer Deposition and Electron Tunneling Characterization of Monolayer $Al_2O_3$ on Fe for Magnetic Tunnel Junctions", AIP Advances, 2018, vol. 8, No. 125218, pp. 1-9.
Japanese First Office Action dated Jun. 13, 2019 issued in Application No. JP 2015-162354.
Japanese Notification of Reasons for Rejection dated Dec. 20, 2016 issued in Application No. JP 2015-503547.
Japanese Office Action dated Jan. 24, 2017, issued in JP 2015-514160.
Japanese Second Office Action dated Feb. 16, 2020 issued in Application No. JP 2015-162354.
Johnson, R.W., Hultqvist, A., Bent, S.F., "A brief review of atomic layer deposition: from fundamentals to applications", Materials today, (Jun. 1, 2014), 17(5):236-46.
JP Office Action dated Apr. 19, 2022 in Application No. JP20200504286 with English translation.
Korean Decision for Grant dated Apr. 7, 2020 issued in Application No. KR 10-2020-7000199.
Korean Decision for Grant dated Jan. 15, 2020 issued in Application No. KR 10-2014-7029798.
Korean Final Office Action dated Sep. 19, 2017, issued in Application No. KR 10-2013-0054726.
Korean First Office Action dated Apr. 18, 2019 issued in Application No. KR 10-2014-7030125.
Korean First Office Action dated Sep. 26, 2016, issued in Application No. KR 10-2013-0054726.
Korean Office Action dated Jun. 18, 2019 issued in Application No. KR 10-2014-7029798.
Korean Provisional Rejection dated Nov. 16, 2012, issued in Application No. KR 2011-0068603.
Korean Second Office Action dated May 30, 2017, issued in Application No. KR 10-2013-0054726.
Korean Second Office Action dated Oct. 25, 2019 issued in Application No. KR 10-2014-7029798.
KR Office Action dated Feb. 8, 2022, in Application No. 10-2017-0172906 with English translation.
KR Office Action dated Feb. 21, 2022, in Application No. KR10-2017-0102113 with English Translation.
Kurek et al. "Recent advances using guanidinate ligands for chemical vapour deposition (CVD) and atomic layer deposition (ALD) applications," Australian Journal of Chemistry, vol. 67, Jun. 2014, pp. 989-996.
Li, Z. et al., "Atomic Layer Deposition of Ultrathin Copper Metal Films from a Liquid Copper(I) Amidinate Precursor", Journal of The Electrochemical Society, 2006, vol. 153, No. 11, pp. C787-C794.
Lim, B. et al., "Atomic Layer Deposition of Transition Metals", Nature Materials, 2003, vol. 2, pp. 749-754.
Lin, S. et al., "Effect of Nitrogen on the Physical Properties and work Function of $MoN_x$ Cap Layers on $HfO_2$ Gate Dielectrics", ECS Journal of Solid State Science and Technology, 2014, vol. 3, No. 12, pp. N161-N165.
Majumder et al. "Investigation on the diffusion barrier properties of sputtered Mo/W-N thin films in Cu interconnects," Applied Physics Letters, vol. 91 (2007), pp. 162108-1-162108-3.
Miikkulainen, V. et al., "Atomic Layer Deposition of Molybdenum Nitride from Bis(tert-butylimido)-bis(dimethylamido)molybdenum and Ammonia onto Several Types of Substrate Materials with Equal Growth per Cycle", Chemistry of Materials, 2007, vol. 19, pp. 263-269.
Miikkulainen, V. et al., "Bis(tert-butylimido)-bis(dialkylamido) Complexes of Molybdenum as Atomic Layer Deposition (ALD) Precursors for Molybdenum Nitride: the Effect of the Alkyl Group", Chemical Vapor Deposition, 2008, vol. 14, pp. 71-77.
Mohimi, E, et al., "Low temperature chemical vapor deposition of superconducting molybdenum carbonitride thin films", Journal of Vacuum Science & Technology A, 2019, vol. 37, No. 2, 021503, 6 pages.
Nandi, D.K. et al., "Atomic Layer Deposited Molybdenum Nitride Thin Film: A Promising Anode Material for Li Ion Batteries", ACS Applied Material Interfaces, 2014, vol. 6, pp. 6606-6615.
Notice of Allowance dated Apr. 27, 2020 issued in U.S. Appl. No. 16/676,169.
Notice of Allowance dated Aug. 6, 2019 issued in U.S. Appl. No. 15/948,143.
Notice of Allowance dated Oct. 5, 2020 issued in U.S. Appl. No. 16/786,513.
Office Action dated Apr. 27, 2021 issued in U.S. Appl. No. 16/947,286.
Office Action dated Aug. 12, 2021 issued in U.S. Appl. No. 16/764,812.
Office Action dated Feb. 4, 2019 issued in U.S. Appl. No. 15/948,143.
Office Action dated Mar. 27, 2020 issued in U.S. Appl. No. 16/786,513.
Office Action Requirement for Restriction/Election dated Sep. 22, 2021 issued in U.S. Appl. No. 17/250,452.
Otsuka et al. A novel molybdenum thiolato compound, tetrakis (tertbutylthiolato molybdenum(IV),preparation and crystal and molecular structure Journal of American chemistry society, 1981, pp. 3011-3014.
PCT International Preliminary Report on Patentability and Written Opinion, dated Oct. 9, 2014, issued in PCT/US2013/033174.
PCT International Preliminary Report on Patentability and Written Opinion, dated Oct. 9, 2014, issued in PCT/US2013/034167.
PCT International Search Report and Written Opinion, dated Jul. 26, 2013, issued in PCT/US2013/034167.
PCT International Search Report and Written Opinion, dated Jun. 28, 2013, issued in PCT/US2013/033174.
Ranade, P. et al., "Work Function Engineering of Molybdenum Gate Electrodes by Nitrogen Implantation", Electrochemical and Solid-State Letters, 2001, vol. 4, No. 11, pp. G85-G87.
Shimizu, H. et al., "Precursor-based designs of nano-structures and their processing for Co(W) alloy films as a single layered barrier/liner layer in future Cu-interconnect", Journal of Materials Chemistry C, 2015, vol. 3, pp. 2500-2510.
Specification of U.S. Appl. No. 62/425,704 (Electronically filed Nov. 23, 2016).
Taiwan Office Action and Search Report dated Nov. 22, 2016 issued in Application No. TW 102110937.
Taiwan Office Action dated Oct. 25, 2016 issued in Application No. TW 102110947.
Taiwanese First Office Action dated Apr. 18, 2019 issued in Application No. TW 104127083.
Taiwanese First Office Action dated Apr. 21, 2021 issued in Application No. TW 106144306.
Taiwanese First Office Action dated Jul. 23, 2021 issued in Application No. TW 107113100.
Taiwanese First Office Action dated Mar. 28, 2019 issued in Application No. TW 104132010.
Taiwanese First Office Action dated Sep. 5, 2019 issued in Application No. TW 105115121.
Taiwanese Second Office Action dated Feb. 6, 2020 issued in Application No. TW 104132010.
Taiwanese Second Office Action dated Mar. 16, 2020 issued in Application No. TW 104127083.
TW Office Action dated Oct. 18, 2021, in application No. TW107112210 with English translation.
U.S Advisory Action dated May 3, 2022 in U.S. Appl. No. 16/764,812.
U.S. Corrected Notice of Allowance dated Feb. 16, 2022, in U.S. Appl. No. 16/724,231.
U.S. Final Office Action, dated Apr. 14, 2017, issued in U.S. Appl. No. 14/965,806.
U.S. Final Office Action dated Apr. 8, 2021 issued in U.S. Appl. No. 16/793,464.

(56) References Cited

OTHER PUBLICATIONS

U.S. Final Office Action dated Aug. 13, 2018 issued in U.S. Appl. No. 15/492,976.
U.S. Final Office Action dated Dec. 15, 2020 issued in U.S. Appl. No. 16/124,050.
U.S. Final Office Action dated Feb. 6, 2020 issued in U.S. Appl. No. 16/124,050.
U.S. Final Office Action, dated Jan. 18, 2017, issued in U.S. Appl. No. 13/774,350.
U.S. Final Office Action dated Jan. 31, 2022 in U.S. Appl. No. 16/764,812.
U.S. Final Office Action, dated Jul. 17, 2015, issued in U.S. Appl. No. 14/502,817.
U.S. Final Office Action dated Jul. 5, 2019 issued in U.S. Appl. No. 15/991,413.
U.S. Final Office Action, dated Jul. 6, 2018, issued in U.S. Appl. No. 13/774,350.
U.S. Final Office Action dated Jun. 10, 2019 issued in U.S. Appl. No. 15/673,320.
U.S. Final Office Action, dated Jun. 14, 2021, issued in U.S. Appl. No. 16/294,736.
U.S. Final Office Action dated Jun. 14, 2021, issued in U.S. Appl. No. 16/457,353.
U.S. Final Office Action, dated Jun. 18, 2018, issued in U.S. Appl. No. 15/384,175.
U.S. Final Office Action dated Mar. 29, 2021 issued in U.S. Appl. No. 16/724,231.
U.S. Final Office Action, dated Nov. 2, 2018, issued in U.S. Appl. No. 15/640,940.
U.S. Final Office Action dated Oct. 19, 2017 issued in U.S. Appl. No. 14/866,621.
U.S. Non Final Office Action dated Mar. 21, 2022, in U.S. Appl. No. 17/250,452.
U.S. Non-Final Office Action dated Dec. 15, 2021 in U.S. Appl. No. 17/250,014.
U.S. Non-Final Office Action dated Nov. 19, 2021, in U.S. Appl. No. 17/250,452.
U.S. Notice of Allowance dated Apr. 27, 2017 issued in U.S. Appl. No. 14/873,152.
U.S. Notice of Allowance dated Apr. 27, 2022 in U.S. Appl. No. 16/457,353.
U.S. Notice of Allowance dated Aug. 10, 2018 issued in U.S. Appl. No. 15/156,129.
U.S. Notice of Allowance, dated Aug. 3, 2016, issued in U.S. Appl. No. 13/851,885.
U.S. Notice of Allowance, dated Dec. 14, 2016, issued in U.S. Appl. No. 13/851,885.
U.S. Notice of Allowance dated Feb. 13, 2018 issued in U.S. Appl. No. 14/866,621.
U.S. Notice of Allowance dated Feb. 2, 2022 in U.S. Appl. No. 16/724,231.
U.S. Notice of Allowance dated Jan. 14, 2016 issued in U.S. Appl. No. 14/465,610.
U.S. Notice of Allowance dated Jan. 9, 2012 issued in U.S. Appl. No. 13/016,656.
U.S. Notice of Allowance, dated Jun. 6, 2018, issued in U.S. Appl. No. 15/482,271.
U.S. Notice of Allowance, dated Mar. 12, 2019, issued in U.S. Appl. No. 15/640,940.
U.S. Notice of Allowance dated Mar. 17, 2021 issued in U.S. Appl. No. 16/124,050.
U.S. Notice of Allowance dated Mar. 23, 2022 in U.S. Appl. No. 16/294,736.
U.S. Notice of Allowance, dated Mar. 24, 2017, issued in U.S. Appl. No. 13/851,885.
U.S. Notice of Allowance dated Nov. 13, 2018 issued in U.S. Appl. No. 15/492,976.
U.S. Notice of Allowance, dated Nov. 30, 2018, issued in U.S. Appl. No. 13/774,350.
U.S. Notice of Allowance dated Oct. 21, 2016 issued in U.S. Appl. No. 14/866,621.
U.S. Notice of Allowance dated Oct. 23, 2019 issued in U.S. Appl. No. 16/189,368.
U.S. Notice of Allowance dated Oct. 24, 2019 issued in U.S. Appl. No. 15/991,413.
U.S. Notice of Allowance, dated Oct. 3, 2018, issued in U.S. Appl. No. 15/384,175.
U.S. Notice of Allowance, dated Sep. 25, 2015, issued in U.S. Appl. No. 14/502,817.
U.S. Notice of Allowance dated Sep. 26, 2019 issued in U.S. Appl. No. 15/673,320.
U.S. Notice of allowance dated Sep. 29, 2021 issued in U.S. Appl. No. 16/724,231.
U.S. Office Action dated Apr. 6, 2020, issued in U.S. Appl. No. 16/457,353.
U.S. Office Action dated Apr. 8, 2019 issued in U.S. Appl. No. 16/189,368.
U.S. Office Action, dated Dec. 12, 2017, issued in U.S. Appl. No. 15/482,271.
U.S. Office Action dated Dec. 15, 2017 issued in U.S. Appl. No. 15/156,129.
U.S. Office Action, dated Dec. 18, 2014, issued in U.S. Appl. No. 14/502,817.
U.S. Office Action dated Dec. 21, 2018 issued in U.S. Appl. No. 15/673,320.
U.S. Office Action, dated Dec. 23, 2014, issued in U.S. Appl. No. 13/851,885.
U.S. Office Action, dated Dec. 7, 2020, issued in U.S. Appl. No. 16/294,736.
U.S. Office Action dated Dec. 8, 2020, issued in U.S. Appl. No. 16/457,353.
U.S. Office Action dated Feb. 5, 2019 issued in U.S. Appl. No. 15/991,413.
U.S. Office Action, dated Jan. 15, 2015, issued in U.S. Appl. No. 13/774,350.
U.S. Office Action, dated Jun. 2, 2016, issued in U.S. Appl. No. 13/774,350.
U.S. Office Action dated Jun. 23, 2020 issued in U.S. Appl. No. 16/124,050.
U.S. Office Action dated Mar. 21, 2018 issued in U.S. Appl. No. 15/492,976.
U.S. Office Action, dated Mar. 26, 2018, issued in U.S. Appl. No. 15/640,940.
U.S. Office Action, dated May 15, 2020, issued in U.S. Appl. No. 16/294,736.
U.S. Office Action dated May 18, 2017 issued in U.S. Appl. No. 14/866,621.
U.S. Office Action dated May 25, 2016 issued in U.S. Appl. No. 14/866,621.
U.S. Office Action dated Nov. 1, 2016 issued in U.S. Appl. No. 14/873,152.
U.S. Office Action, dated Nov. 20, 2017, issued in U.S. Appl. No. 15/384,175.
U.S. Office Action dated Nov. 25, 2011 issued in U.S. Appl. No. 13/016,656.
U.S. Office Action dated Oct. 30, 2020 issued in U.S. Appl. No. 16/793,464.
U.S. Office Action, dated Oct. 8, 2015, issued in U.S. Appl. No. 13/774,350.
U.S. Office Action, dated Sep. 11, 2017, issued in U.S. Appl. No. 14/965,806.
U.S. Office Action, dated Sep. 2, 2016, issued in U.S. Appl. No. 14/965,806.
U.S. Office Action, dated Sep. 20, 2017, issued in U.S. Appl. No. 13/774,350.
U.S. Office Action dated Sep. 22, 2020 issued in U.S. Appl. No. 16/724,231.
U.S. Office Action, dated Sep. 24, 2019, issued in U.S. Appl. No. 16/124,050.
U.S. Office Action dated Sep. 3, 2015 issued in U.S. Appl. No. 14/465,610.

(56) References Cited

OTHER PUBLICATIONS

U.S. Office Action Restriction/Election dated Sep. 9, 2021 issued in U.S. Appl. No. 17/250,014.
U.S. Appl. No. 17/310,293, inventors Collins et al., filed Jul. 27, 2021.
U.S. Appl. No. 17/436,944, inventors Blakeney et al., filed Sep. 7, 2021.
U.S. Appl. No. 17/639,846, inventors Na Jeong-Seok et al., filed Mar. 2, 2022.
U.S. Appl. No. 17/753,042, filed Feb. 16, 2022.
Van Zant, P., "Microchip fabrication: a practical guide to semiconductor processing" 4th ed., (2000) p. 263. [ISBN 0-07-135636-3].
Williams et al., "Etch Rates for Micromachining Processing-Part II" Journal of Microelectromechanical Systems, vol. 12, No. 6, Dec. 2003, pp. 761-778.
Anonymous, "Lam Research enables next-generation memory with industry's first ALD process for low-fluorine tungsten fill" Semiconductor Digest News and Industry Trends for Solid State Technology, Aug. 2016, 2 Pages.
CN Office Action dated Feb. 28, 2023 in Application No. 201880038116.0 with English translation.
CN Office Action dated Jan. 13, 2023 in CN Application No. CN201980049916.7 with English Translation.
CN Office Action dated Jan. 16, 2023 in Application No. CN202080020646.X with English translation.
CN Office Action dated Nov. 17, 2022, in Application No. CN202080011300.3 with English translation.
Coventor Brochure "3D NAND: Challenges Beyond 96-Layer Memory Arrays", Oct. 12, 2018, pp. 1-4.
Dominique, S. et al., "An alternative to Tungsten in 3D-NAND technology", IEEE International Interconnect Technology Conference (IITC), 2021, pp. 1-3.
International Preliminary Report on Patentability dated Dec. 1, 2022, in PCT Application No. PCT/US2021/033564.
International Search Report and Written Opinion dated Jun. 9, 2022 in International Application No. PCT/US2022/017005.
International Search Report and Written Opinion dated Sep. 9, 2021 in Application No. PCT/US2021/033564.
International Search Report and Written Opinion dated Apr. 7, 2023 in PCT Application No. PCT/US2022/080705.
International Search Report and Written Opinion dated Apr. 27, 2023 in PCT Application No. PCT/US2022/080863.
International Search Report and Written Opinion dated Sep. 7, 2022 in Application No. PCT/US2022/028845.
Kim, K. et al., "Simulation of Residual Stress and Its Impact on a Poly-Silicon Channel for Three-Dimensional, Stacked, Vertical-NAND Flash Memories", Journal of the Korean Physical Society, 2017, vol. 70 (12), pp. 1041-1048.
KR Office Action dated Jan. 27, 2023 in Application No. KR10-2017-0102113 with English Translation.
KR Office Action dated May 30, 2022, in Application No. KR10-2019-7033130 With English Translation.
KR Office Action dated Oct. 27, 2022 in Application No. KR10-2022-7026373 with English translation.
KR Office Action dated Sep. 27, 2022 in Application No. KR10-2017-0102113 with English translation.
Lee, B. et al., "ALD Tungsten Solves Capacity Challenges in 3D NAND Device Manufacturing", Lam Brochure, Jan. 2019, pp. 1-4.
McCain, M.N. et al., "Aerosol-Assisted Chemical Vapor Deposition of Lubricating MoS2 Films. Ferrous Substrates and Titanium Film Doping", Chemistry of Materials, 2008, vol. 20, No. 16, pp. 5438-5443.
SG Search Report and Written Opinion dated Feb. 10, 2023 in Application No. SG11202109796Q.
Singapore Written Opinion dated Mar. 15, 2023 issued in Application No. SG11202108217U.
TW Office Action dated Aug. 16, 2022, in Application No. TW107141042 with English translation.
TW Office Action dated Feb. 10, 2023 in Application No. TW107112210 with English translation.
TW Office Action dated Feb. 23, 2023 in Application No. TW108126326 with English translation.
TW Office Action dated May 24, 2022, in Application No. TW20180112210 with English translation.
TW Office Action dated Sep. 14, 2022, in Application No. TW107112210 with English translation.
U.S. Advisory Action dated Oct. 18, 2022, in U.S. Appl. No. 17/250,452.
U.S. Corrected Notice of Allowance dated May 11, 2022, in U.S. Appl. No. 16/724,231.
U.S. Final office Action dated Jul. 25, 2022 in U.S. Appl. No. 17/250,452.
U.S. Final Office Action dated Feb. 2, 2023 in U.S. Appl. No. 17/436,944.
U.S. Final Office Action dated Mar. 1, 2023 in U.S. Appl. No. 17/250,452.
U.S. Final Office Action dated Nov. 30, 2022 in U.S. Appl. No. 16/764,812.
U.S. Non-Final Office Action dated Feb. 2, 2023 in U.S. Appl. No. 17/589,416.
U.S. Non-Final Office Action dated Jun. 24, 2022, in U.S. Appl. No. 17/436,944.
U.S. Non-Final Office Action dated May 16, 2022 in U.S. Appl. No. 16/764,812.
U.S. Non-Final Office Action dated Nov. 30, 2022 in U.S. Appl. No. 17/814,207.
U.S. Notice of Allowance dated Jun. 7, 2022 in U.S. Appl. No. 17/250,014.
U.S. Notice of Allowance dated Sep. 16, 2022 in U.S. Appl. No. 17/250,014.
U.S. Appl. No. 17/999,255, inventors Tarafdar et al., filed Nov. 18, 2023.
U.S. Appl. No. 62/362,582, inventors Meng et al., filed Jul. 14, 2016.
U.S. Supplemental Notice of Allowance dated Dec. 14, 2022 in U.S. Appl. No. 17/250,014.
Juppo, et al., "Deposition of Molybdenum Thin Films by an Alternate Supply of MoCl 5 and Zn," Journal of Vac. Sci. & Technol. A, vol. 16, Sep./Oct. 1998, doi: 10.1116/1.581430, pp. 2845-2850.
Becker, J., et al., "Diffusion Barrier Properties of Tungsten Nitride Films Grown by Atomic Layer Deposition From bis(tert-butylimido) bis(dimethylamido)tungsten and ammonia," Applied Physics Letters, 2003, vol. 82 (14), pp. 2239-2241.
CN Office Action dated Jan. 18, 2024 in CN Application No. 202080020646.X with English translation.
CN Office Action dated Sep. 24, 2023, in Application No. CN202080020646.X with English translation.
CN Office Action dated Sep. 28, 2023, in application No. CN201980049916.7 with English translation.
EP Partial Supplementary European Search report dated Sep. 13, 2023, in Application No. EP20854552.5.
Gall D., "Electron Mean Free Path in Elemental Metals," Journal of Applied Physics, Feb. 23, 2016, vol. 119, 6 Pages.
International Preliminary Report on Patentability dated Jul. 20, 2023, in PCT Application No. PCT/US2022/011053.
International Search Report and Written Opinion dated Apr. 25, 2022, for International Application No. PCT/US2022/011053.
International Search Report and Written Opinion dated Aug. 2, 2022 in Application No. PCT/US2022/024295.
International Search Report and Written Opinion dated Feb. 7, 2024 in PCT Application No. PCT/US2023/034858.
International Search Report and Written Opinion dated Feb. 16, 2024 in PCT Application No. PCT/US2023/035873.
International Search Report and Written Opinion dated Sep. 6, 2023, in Application No. PCT/US2023/0230233.
Jang, Y., et al., "Highly-conformal Nanocrystalline Molybdenum Nitride Thin Films by Atomic Layer Deposition as a Diffusion Barrier Against Cu," Journal of Alloys and Compounds, 2016, vol. 663, pp. 651-658.
JP Office Action dated Feb. 6, 2024 in JP Application No. 2021-543355 with English translation.

(56) References Cited

OTHER PUBLICATIONS

JP Office Action dated Feb. 20, 2024 in JP Application No. 2023-547183 with English translation.
JP Office Action dated Feb. 27, 2024 in Application No. JP2022-522581 with English Translation.
JP Office Action dated Mar. 5, 2024 in JP Application No. 2022-141887, with English Translation.
JP Office Action dated Mar. 19, 2024 in JP Application No. 2020-561743, with English Translation.
JP Office Action dated Mar. 26, 2024 in JP Application No. 2022-524041 with English translation.
JP Office Action dated Oct. 3, 2023 in Application No. JP2022-522581 with English Translation.
JP Office Action dated Oct. 3, 2023 in Application No. JP2023-95239 with English Translation.
KR Office Action dated Dec. 15, 2023 in KR Application No. 10-2023-7028915, with English Translation.
KR Office Action dated Mar. 1, 2024 in KR Application No. 10-2021-7018803, with English Translation.
KR Office Action dated Mar. 29, 2024 in KR Application No. 10-2020-7017697 with English translation.
Pol, V. G., et al., "Fabrication of Magnetic Nanoparticles Using Rapet Technique With or Without Employing External Magnetic Field," The Journal of Physical Chemistry C, 2008, vol. 112, pp. 6627-6637.
Qu Jingxin, et al., "Surface Engineering Handbook," Chemical Industry Publishing House, Mar. 31, 1998, p. 277.
SG Office Action dated Oct. 11, 2023, in application No. SG11202201453T.
SG Office Action dated Sep. 19, 2023, in application No. SG11202202087P.
SG Written Opinion dated Oct. 4, 2023 in Application No. SG11202109796Q.
Shirazi, M., et al., "Initial Stage of Atomic Layer Deposition of 2D-$MoS_2$ on a $SiO_2$ surface: a DFT study," Physical Chemistry Chemical Physics, 2018, vol. 20 (24), pp. 1-18.
Stephenson T A., et al., "487. Molybdenum(II) Carboxylates," Journal of the Chemical Society, 1964, pp. 2538-2541.
Sun Yicai, et al., "Design Manufacturing and Application," Metallurgical Industry Publishing House, Apr. 30, 2000, p. 166.
TW Office Action dated Aug. 31, 2023, in Application No. TW109102778 with English translation.
U.S. Final Office Action dated Apr. 12, 2024 in U.S. Appl. No. 17/814,206.
U.S. Final Office Action dated Feb. 12, 2024 in U.S. Appl. No. 17/589,416.
U.S. Non-Final Office Action dated Feb. 29, 2024 in U.S. Appl. No. 17/294,378.
U.S. Non-Final Office Action dated Jan. 17, 2024 in U.S. Appl. No. 17/814,207.
U.S. Notice of Allowance dated Apr. 4, 2024 in U.S. Appl. No. 17/310,293.
U.S. Notice of Allowance dated Mar. 27, 2024 in U.S. Appl. No. 17/814,209.
U.S. Notice of Allowance dated Oct. 4, 2023, in U.S. Appl. No. 17/436,944.
U.S. Appl. No. 18/258,973, inventors Na J S, et al., filed Jun. 22, 2023.
U.S. Appl. No. 18/286,994, inventors Thombare S V, et al., filed Oct. 13, 2023.
Werndrup P., et al., A Single-source-precursor Approach to Late Transition Metal Molybdate Materials: the Structural Role of Chelating Ligands in the Formation of Heterometallic Heteroleptic Alkoxide Complexes, European Journal of Inorganic Chemistry, 2006, vol. 2006 (7), 1413-1422.
CN Office Action dated Dec. 28, 2023 in CN Application No. 202080059499.7 with English Translation.
EP Extended European Search report dated Dec. 14, 2023, in Application No. EP20854552.5.
International Preliminary Report on Patentability and Written Opinion dated Nov. 23, 2023 in PCT Application No. PCT/US2022/028845.
International Preliminary Report on Patentability dated Oct. 26, 2023, in PCT Application No. PCT/US2022/024295.
JP Office Action dated Dec. 12, 2023 in JP Application No. 2021-527153 with English Translation.
JP Office Action dated Dec. 26, 2023, in application No. JP20220141888 with English translation.
KR Office Action dated Dec. 15, 2023 in KR Application No. 10-2023-7028915.
KR Office Action dated Nov. 14, 2023, in KR Application No. 10-2022-7031314 with English Translation.
TW Office Action dated Dec. 5, 2023 in TW Application No. 109107661 with English translation.
TW Office Action dated Dec. 21, 2023 in Application No. TW108126326 with English translation.
TW Office Action dated Oct. 19, 2023 in Application No. TW107112210 with English translation.
U.S. Non-Final Office Action dated Nov. 6, 2023, in U.S. Appl. No. 17/814,206.
U.S. Non-Final Office Action dated Nov. 30, 2023 in U.S. Appl. No. 17/250,452.
U.S. Non-Final Office Action dated Oct. 26, 2023, in U.S. Appl. No. 17/589,416.
U.S. Notice of Allowance dated Jan. 2, 2024 in U.S. Appl. No. 17/310,293.
U.S. Notice of Allowance dated Nov. 14, 2023 in U.S. Appl. No. 17/814,209.
U.S. Appl. No. 18/559,783, inventor Bhadauriya S, filed Nov. 23, 2023.
Barry, S.T., "Amidinates, Guanidinates and Iminopyrrolidinates: Understanding Precursor Thermolysis to Design a Better Ligand," Coordination Chemistry Reviews, Dec. 2013, vol. 257(23-24), pp. 3192-3201.
Barry, S.T., et al., "The Chemistry of Inorganic Precursors during the Chemical Deposition of Films on Solid Surfaces," Accounts of chemical research, 2018, vol. 51, pp. 800-809.
Colaianni, M.L., et al., "The Adsorption and Dissociation of Carbon Monoxide on Clean and Oxygen-Modified Mo(110) Surfaces," Journal of the American Chemical Society, 1992, vol. 114(10), pp. 3735-3743.
Cotton, F.A., "Strong Homonuclear Metal-Metal Bonds," Accounts of Chemical Research, 1969, vol. 2 (8), pp. 240-247.
Dezelah IV, C.L., et al., "A Low Valent Metalorganic Precursor for the Growth of Tungsten Nitride Thin Films by Atomic Layer Deposition," Journal of Materials Chemistry, 2007, vol. 17, pp. 1109-1116.
Dezelah IV, C.L., et al., "Atomic Layer Deposition of Tungsten(III) Oxide Thin Films from $W_2(NMe_2)_6$ and Water: Precursor-Based Control of Oxidation State in the Thin Film Material," Journal of the American Chemical Society, Aug. 2, 2006, vol. 128(30), pp. 9638-9639.
International Preliminary Report on Patentability dated Jun. 1, 2023, in Application No. PCT/US2021/058099.
International Preliminary Report on Patentability dated Sep. 7, 2023, in PCT Application No. PCT/US2022/017005.
International Search Report and Written Opinion dated Aug. 11, 2023, in Application No. PCT/US2023/019795.
International Search Report and Written Opinion dated Aug. 16, 2023, in Application No. PCT/US2023/017635.
International Search Report and Written Opinion dated Aug. 16, 2023, in Application No. PCT/US2023/019800.
International Search Report and Written Opinion dated Aug. 16, 2023, in Application No. PCT/US2023/019000.
International Search Report and Written Opinion dated Jun. 19, 2023, in Application No. PCT/US2023/062877.
International Search Report and Written Opinion dated Mar. 3, 2022, in Application No. PCT/US2021/058099.
Ishihara, S., et al., "MOCVD of Monolayer MoS2 using Novel Molybdenum Precursor i-Pr2DADMo(CO)3," Materials Research Society, 2018, vol. 3, pp. 379-384.

(56) References Cited

OTHER PUBLICATIONS

JP Office Action dated Jun. 6, 2023 in Application No. JP2020561743 With English translation.
JP Office Action dated Sep. 5, 2023, in Application No. JP2022-145721 with English translation.
Karunarathne, M.C., et al., "Synthesis, Structural Characterization, and Volatility Evaluation of Zirconium and Hafnium Amidate Complexes," Journal of Organometallic Chemistry, 2017, vol. 847, pp. 204-212.
Kerrigan, M.M., et al., "Low Temperature, Selective Atomic Layer Deposition of Cobalt Metal Films Using Bis(1,4-di-tert-butyl-1,3-diazadienyl)cobalt and Alkylamine Precursors," Chemistry of Materials, 2017, vol. 29(17), pp. 7458-7466.
Kerrigan, M.M., et al., "Low Temperature, Selective Atomic Layer Deposition of Nickel Metal Thin Films," ACS Applied Materials & Interfaces, 2018, vol. 10(16), pp. 14200-14208.
Kim, T., et al., "Thermal Chemistry of Cu(I)-Iminopyrrolidinate and Cu(I)-Guanidinate Atomic Layer Deposition (ALD) Precursors on Ni(110) Single-Crystal Surfaces," Chemistry of Materials, 2013, vol. 25, pp. 3630-3639.
Knisley, T.J., et al., "Volatility and High Thermal Stability in Mid to Late First Row Transition Metal Diazadienyl Complexes," Organometallics, 2011, vol. 30(18), pp. 5010-5017.
KR Office Action dated Jul. 28, 2023, in Application No. KR10-2023-0081299 with English Translation.
Makela, M., et al., "Thermal Atomic Layer Deposition of Continuous and Highly Conducting Gold Thin Films," Chemistry of Materials, 2017, vol. 29, pp. 6130-6136.
Muhtade, M., et al., "Time Influence on Thickness and Grains for Molybdenum Thin Film," 2017, e-ISSN: 2289-8131, vol. 9, No. 2-13.
Ouyang, T., et al., "A Surface Chemistry Route to Molybdenum Sulfide and Germanide Films Using the Single-Source Precursor Tetrakis(diethylaminodithiocarbomato)molybdate(IV)," The Journal of Physical Chemistry B, 2004, vol. 108(5), pp. 17537-17545.
U.S. Final office Action dated Jun. 26, 2023 in U.S. Appl. No. 17/589,416.
U.S. Final Office Action dated May 31, 2023, in U.S. Appl. No. 17/814,207.
U.S. Non-Final Office Action dated Aug. 29, 2023, in U.S. Appl. No. 17/310,293.
U.S. Non-Final Office Action dated Jul. 20, 2023, in U.S. Appl. No. 17/814,209.
U.S. Non-Final Office Action dated Jun. 20, 2023, in U.S. Appl. No. 17/250,452.
U.S. Notice of Allowance dated Aug. 3, 2023, in U.S. Appl. No. 17/436,944.
U.S. Notice of Allowance dated Jul. 14, 2023 in U.S. Appl. No. 17/436,944.
U.S. Appl. No. 18/253,038, inventors Lai C.S, et al., filed May 16, 2023.
U.S. Appl. No. 18/310,523, inventors Collins et al., filed May 1, 2023.
Zhao, Y., et al., "Synthesis and Structures of Mono- and Dinuclear Molybdenum Complexes with Reduced a-Diimine Ligands," European Journal of Inorganic Chemistry, 2016, pp. 5411-5417.
CN Office Action dated Jul. 9, 2024 in CN Application No. 201980049916.7 with English translation.
CN Office Action dated Jun. 7, 2024 in CN Application No. 201880074995.2, with English Translation.
CN Office Action dated Jun. 27, 2024 in CN Application No. 201980076277.3 with English translation.
CN Office Action dated May 31, 2024 in CN Application No. 201980038600.8 with English translation.
International Preliminary Report on Patentability and Written Opinion dated Jun. 27, 2024 in PCT Application No. PCT/US2022/080705.
International Preliminary Report on Patentability and Written Opinion dated Jun. 27, 2024 in PCT Application No. PCT/US2022/080863.
International Preliminary Report on Patentability and Written Opinion dated Sep. 6, 2024 in PCT Application No. PCT/US2023/062877.
International Search Report and Written Opinion dated Jul. 23, 2024 in PCT Application No. PCT/US2024/023361.
JP Office Action dated Aug. 6, 2024 in JP Application No. 2023-547183, with English Translation.
JP Office Action dated Aug. 20, 2024 in JP Application No. 2022-514153, with English Translation.
JP Office Action dated Jul. 16, 2024 in JP Application No. 2021-527153, with English Translation.
JP Office Action dated Jun. 11, 2024 in JP Application No. 2023-95239, with English Translation.
JP Office Action dated Sep. 3, 2024 in JP Application No. 2022-141888 with English translation.
JP Office Action dated Sep. 3, 2024 in JP Application No. 2022-509591, with English Translation.
KR Notice of Allowances dated Aug. 28, 2024 in KR Application No. 10-2023-7028915 with English Translation.
KR Office Action dated Jun. 27, 2024 in KR Application No. 10-2023-0081299, with English Translation.
KR Office Action dated May 7, 2024 in KR Application No. 10-2020-7034800, with English Translation.
SG Search Report and Written Opinion dated Aug. 22, 2024 in SG Application No. 11202203845Q.
TW Office Action dated Apr. 24, 2024 in TW Application No. 109130013, With English Translation.
TW Office Action dated May 9, 2024 in TW Application No. 109107661 with English translation.
TW Office Action dated May 22, 2024 in TW Application No. 109135654, with English Translation.
U.S. Final Office Action dated May 8, 2024 in U.S. Appl. No. 17/250,452.
U.S. Final Office Action dated May 9, 2024 in U.S. Appl. No. 17/814,207.
U.S. Non-Final Office Action dated Aug. 7, 2024 in U.S. Appl. No. 18/310,523.
U.S. Non-Final Office Action dated Jul. 24, 2024 in U.S. Appl. No. 17/763,529.
U.S. Non-Final Office Action dated Jun. 21, 2024 in U.S. Appl. No. 17/639,846.
U.S. Non-Final Office Action dated Jun. 21, 2024 in U.S. Appl. No. 18/379,397.
U.S. Non-Final Office Action dated Sep. 5, 2024 in U.S. Appl. No. 17/814,206.
U.S. Notice of Allowance dated Jul. 3, 2024 in U.S. Appl. No. 17/294,378.
U.S. Appl. No. 18/714,506, inventors Mandia D.J., et al., filed May 29, 2024.
U.S. Appl. No. 18/716,846, inventors Mandia D.J, et al., filed Jun. 5, 2024.
U.S. Appl. No. 18/799,905, inventors Thombare S.V, et al., filed Aug. 9, 2024.
U.S. Appl. No. 18/837,560, inventors Hsieh Y, et al., filed Aug. 9, 2024.
U.S. Restriction requirement dated May 13, 2024, in U.S. Appl. No. 18/310,523.

* cited by examiner

Constrictions
351

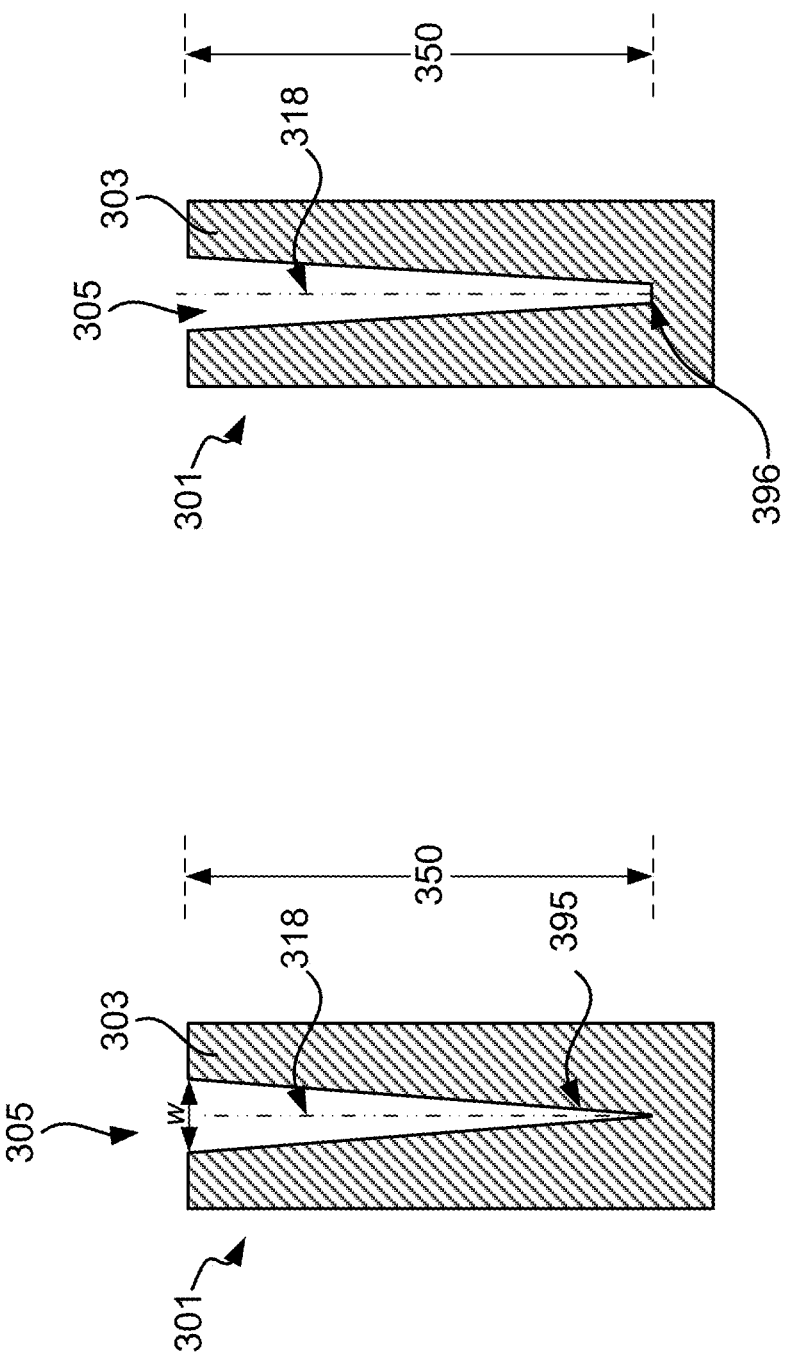

METHOD FOR PREVENTING LINE BENDING DURING METAL FILL PROCESS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes.

BACKGROUND

Deposition of tungsten-containing materials is an integral part of many semiconductor fabrication processes. These materials may be used for horizontal interconnects, vias between adjacent metal layers, contacts between metal layers and devices on the silicon substrate, and high aspect ratio features. In a conventional tungsten deposition process on a semiconductor substrate, the substrate is heated to a process temperature in a vacuum chamber, and a very thin portion of tungsten film, which serves as a seed or nucleation layer, is deposited. Thereafter, the remainder of the tungsten film (the bulk layer) is deposited on the nucleation layer by exposing the substrate to two reactants simultaneously. The bulk layer is generally deposited more rapidly than the nucleation layer. However, as devices shrink and more complex patterning schemes are utilized in the industry, deposition of thin tungsten films becomes a challenge.

SUMMARY

Provided herein are methods and apparatus for depositing metal into features on substrates. One aspect involves a method of filling features on a substrate to form lines, the method including: (a) providing a substrate having a plurality of features spaced apart with a pitch between adjacent features of about 20 nm and about 40 nm, each feature having a feature opening width whereby the width of the feature narrows from the top of the feature to the bottom of the feature; (b) depositing a first amount of tungsten in the plurality of features on the substrate; (c) after depositing the first amount of tungsten, exposing the first amount of tungsten in the plurality of features to nitrogen gas; and (d) depositing a second amount of tungsten over the first amount of tungsten in the plurality of features.

In various embodiments, the nitrogen gas reduces tungsten-tungsten bonding interactions between tungsten formed on sidewalls of each feature.

In various embodiments, the width of the bottom of each feature is between 0 nm and 90% of the width at the top of the each feature.

The method may also include filling the features with tungsten to thereby form the lines, whereby the total variance of the lines within the substrate calculated by $\sigma=(\sigma_1^2+\sigma_2^2)^{1/2}$ where $\sigma_1$ is variable line-to-line width variance and $\sigma_2$ is within-line width variance is less than about 5 nm.

In various embodiments, the width at the bottom 50% of the depth of the feature is between 0 nm and 20 nm.

In various embodiments, the first amount of tungsten is exposed to the nitrogen gas at a substrate temperature less than about 500° C.

In some embodiments, the first amount of tungsten is exposed to the nitrogen gas during the depositing of the second amount of tungsten over the first amount of tungsten.

In some embodiments, the second amount of tungsten is deposited by alternating pulses of hydrogen and a tungsten-containing precursor. The first amount of tungsten may be exposed to the nitrogen gas during the pulse of hydrogen. In some embodiments, the first amount of tungsten is exposed to the nitrogen gas during the pulse of the tungsten-containing precursor. In some embodiments, the first amount of tungsten is exposed to argon between the alternating pulses of the hydrogen and the tungsten-containing precursor. The first amount of tungsten may be exposed to the nitrogen when the feature is exposed to the argon between the alternating pulses of the hydrogen and the tungsten-containing precursor.

Another aspect involves a method filling features on a substrate to form lines including: (a) providing a substrate having a plurality of features spaced apart with a pitch between adjacent features of about 20 nm and about 40 nm, each feature having a feature opening width whereby the width of the feature narrows from the top of the feature to the bottom of the feature; (b) depositing a first amount of a metal in the plurality of features on the substrate; (c) after depositing the first amount of the metal, exposing the first amount of the metal in the plurality of features to an inhibition gas; and (d) depositing a second amount of the metal over the first amount of the metal in the plurality of features. The metal may be any one or more of ruthenium, molybdenum, and cobalt. The inhibition gas may be any of nitrogen, oxygen, ammonia, and combinations thereof.

In various embodiments, the inhibition gas reduces metal-metal bonding interactions between metal formed sidewalls of each feature. In some embodiments, the width of the bottom of each feature is between 0 nm and 90% of the width at the top of the each feature. The method may also include filling the features with the metal to thereby form the lines, wherein the total variance of the lines within the substrate calculated by $\sigma=(\sigma_1^2+\sigma_2^2)^{1/2}$ where $\sigma_1$ is variable line-to-line width variance and $\sigma_2$ is within-line width variance is less than about 5 nm. The width at the bottom 50% of the depth of the feature may be between 0 nm and 20 nm.

Another aspect involves an apparatus for processing semiconductor substrates, the apparatus having (a) at least one process chamber including a pedestal configured to hold a substrate; (b) at least one outlet for coupling to a vacuum; (c) one or more process gas inlets coupled to one or more process gas sources; and (d) a controller for controlling operations in the apparatus, including machine-readable instructions for: providing a substrate having a plurality of features spaced apart with a pitch between adjacent features of about 20 nm and about 40 nm, each feature having a feature opening whereby the width of the feature narrows from the top of the feature to the bottom of the feature, introducing a tungsten-containing precursor and a reducing agent to deposit a first amount of tungsten in the plurality of features on the substrate; after depositing the first amount of tungsten, introducing a nitrogen gas to the first amount of tungsten in the plurality of features, and introducing the tungsten-containing precursor and the reducing agent to deposit a second amount of tungsten over the first amount of tungsten in the plurality of features.

These and other aspects are described further below with reference to the drawings.

BRIEF DESCRIPTION OF THE DRAWINGS

FIGS. 3A-3I are schematic examples of various structures in which a metal such as tungsten may be deposited in accordance with certain disclosed embodiments.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with specific embodiments, it will be understood that it is not intended to limit the disclosed embodiments.

Metal fill, such as tungsten (W) fill, of features is often used in semiconductor device fabrication to form electrical contacts. There are various challenges in tungsten fill as devices scale to smaller technology nodes and more complex patterning structures are used. One challenge is reducing the fluorine concentration or content in the deposited tungsten film. As compared to larger features, a smaller feature having the same fluorine concentration in the tungsten film as a larger feature affects the performance of the device more substantially. For example, the smaller the feature, the thinner the films are deposited. As a result, fluorine in the deposited tungsten film is more likely to diffuse through the thinner films, thereby potentially causing device failure.

Figure 1:
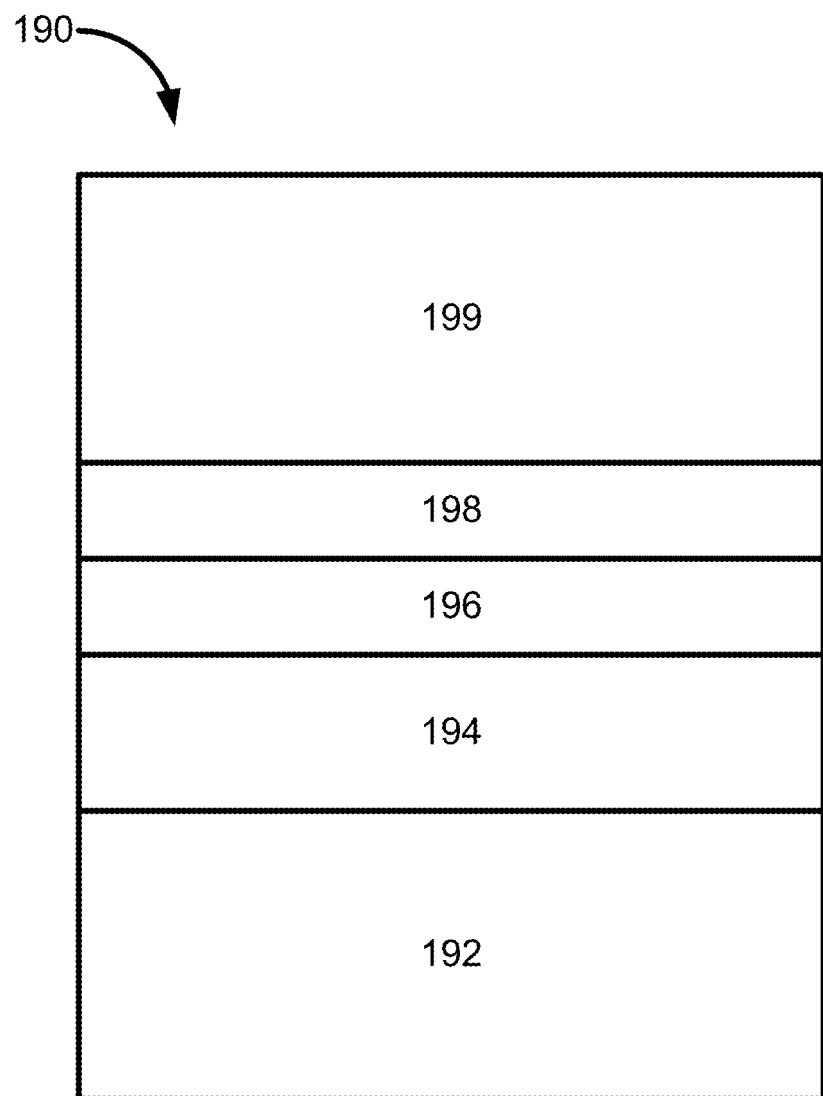
FIG. 1 is a schematic illustration of example films on a substrate.

One method of preventing fluorine diffusion includes depositing one or more barrier layers prior to depositing tungsten to prevent fluorine from diffusing from tungsten to other layers of the substrate such as an oxide layer. For example, FIG. 1 shows an example stack of layers deposited on a substrate 190. Substrate 190 includes a silicon layer 192, an oxide layer 194 (e.g., titanium oxide (TiOx), tetraethyl orthosilicate (TEOS) oxide, etc.), a barrier layer 196 (e.g., titanium nitride (TiN)), a tungsten nucleation layer 198, and a bulk tungsten layer 199. Barrier layer 196 is deposited to prevent fluorine diffusion from the bulk tungsten layer 199 and the tungsten nucleation layer 198 to the oxide layer. However, as devices shrink, barrier layers become thinner, and fluorine may still diffuse from the deposited tungsten layers. Although chemical vapor deposition of bulk tungsten performed at a higher temperature results in lower fluorine content, such films have poor step coverage.

Another challenge is reducing resistance in the deposited tungsten films. Thinner films tend to have higher resistance than thicker films. As features become smaller, the tungsten contact or line resistance increases due to scattering effects in the thinner tungsten films. Low resistivity tungsten films minimize power losses and overheating in integrated circuit designs. Tungsten nucleation layers typically have higher electrical resistivities than the overlying bulk layers. Barrier layers deposited in contacts, vias, and other features, may also have high resistivities. Further, thin barrier and tungsten nucleation films occupy a larger percentage of smaller features, increasing the overall resistance in the feature. Resistivity of a tungsten film depends on the thickness of the film deposited, such that resistivity increases as thickness decreases due to boundary effects.

Another challenge is reducing stress on deposited films. Thinner tungsten films tend to have increased tensile stress. Conventional techniques for depositing bulk tungsten films by chemical vapor deposition have a tensile stress greater than 2.5 GPa for a 200 Å film. High thermal tensile stress causes the substrate to curl, which makes subsequent processing difficult. For example, subsequent processes may include chemical mechanical planarization, deposition of materials, and/or clamping of the substrate to a substrate holder to perform processes in a chamber. However, these processes often rely on the substrate being flat, and a curled substrate results in nonuniform processing or inability to process the substrate. Although there are existing methods for reducing stress in films of other materials such as annealing, tungsten does not have the surface mobility to allow grains to be moved or altered once it is deposited due to its high melting point.

Another challenge is reducing line bending, a phenomenon found in, for example, substrates having multiple features with narrow pitch, or in substrates multiple high aspect ratio features adjacent to one another. Line bending in dynamic random-access memory (DRAM) buried wordline structures (bWL) during tungsten fill is believed to be caused by grain boundary merging (which may be referred to as a "zipping mechanism"). When the grain boundaries are formed, the tungsten-tungsten bonding between adjacent tungsten surfaces (such as the growing tungsten film on sidewalls of a feature) causes strain that leads to bending of the silicon fins (lines) separating the bWL. Conventional ALD and chemical vapor deposition (CVD) tungsten fill techniques result in severe bending of the bWL structures. This line bending will cause tungsten recess non-uniformity and contact landing issues in downstream processes, which results in DRAM yield loss.

Conventional 2-D growth may exhibit low stress, low fluorine, and low resistivity tungsten films by ALD but only on surfaces that allow for such growth. As devices shrink and features are narrower, there may be a zipping mechanism, which can cause tensile stress, high incorporation of fluorine, and impact on resistivity resulting in rough morphology.

Figure 2A:
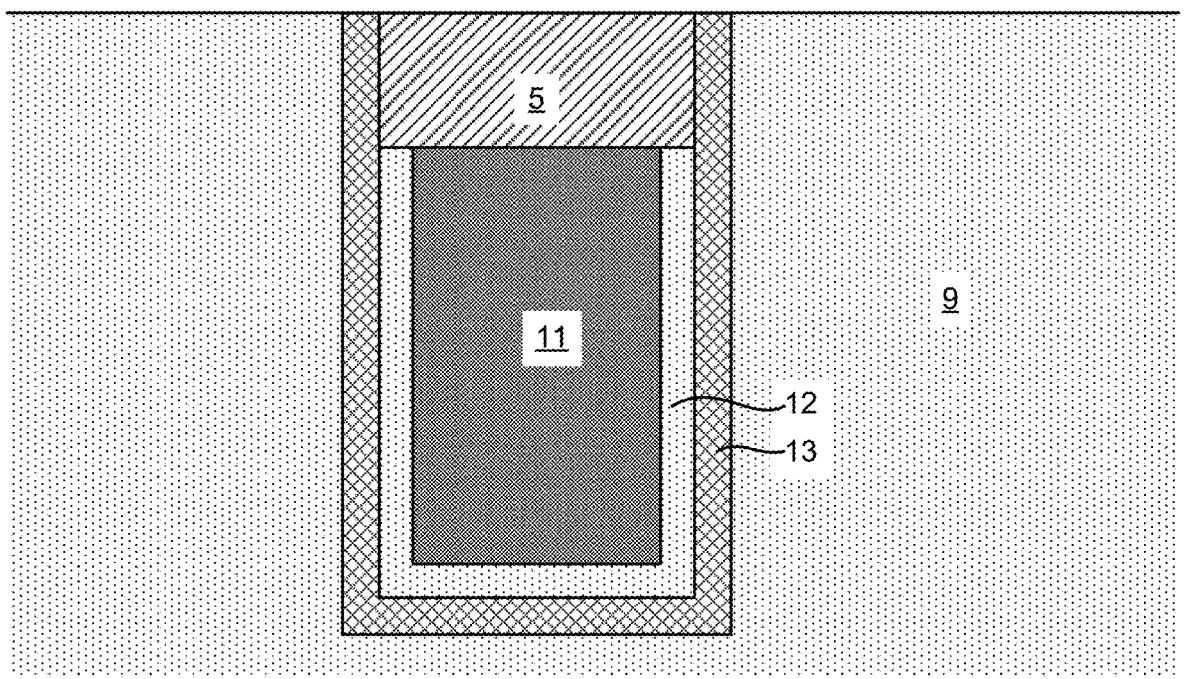
FIG. 2A depicts a schematic illustration of an example of a dynamic random access memory (DRAM) architecture including a buried wordline (bWL) in a silicon substrate.

Particular embodiments relate to methods and related apparatus for formation of tungsten wordlines in memory devices. FIG. 2A depicts a schematic example of a DRAM architecture including a buried wordline (bWL) 11 in a silicon substrate 9. The bWL 11 is formed in a trench etched in the silicon substrate 9. The bWL 11 is tungsten deposited in the silicon substrate 9 and is capped by SiN passivation 5. Lining the trench is a conformal barrier layer 12 and an insulating layer 13 that is disposed between the conformal barrier layer 12 and the silicon substrate 9. In the example of FIG. 2A, the insulating layer 13 may be a gate oxide layer, formed from a material such as a silicon oxide. Examples of conformal barrier layers include titanium nitride (TiN) and tungsten-containing barrier layers. Tungsten-containing conformal barrier layers are described in U.S. Patent Application Publication No. 2016/0233220 (Ser. No. 15/040,561), filed Feb. 10, 2016, titled "TUNGSTEN FOR WORDLINE APPLICATIONS," which is incorporated by reference herein.

Figure 2B:
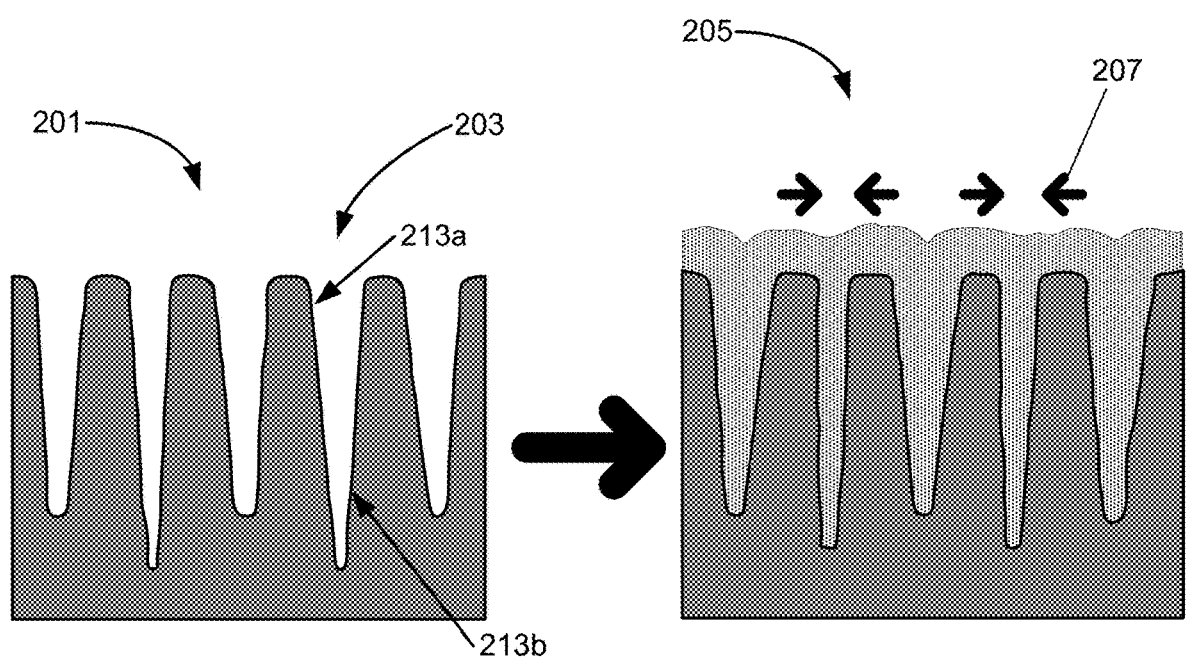
FIG. 2B depicts a schematic illustration of line bending.
Figure 2C:
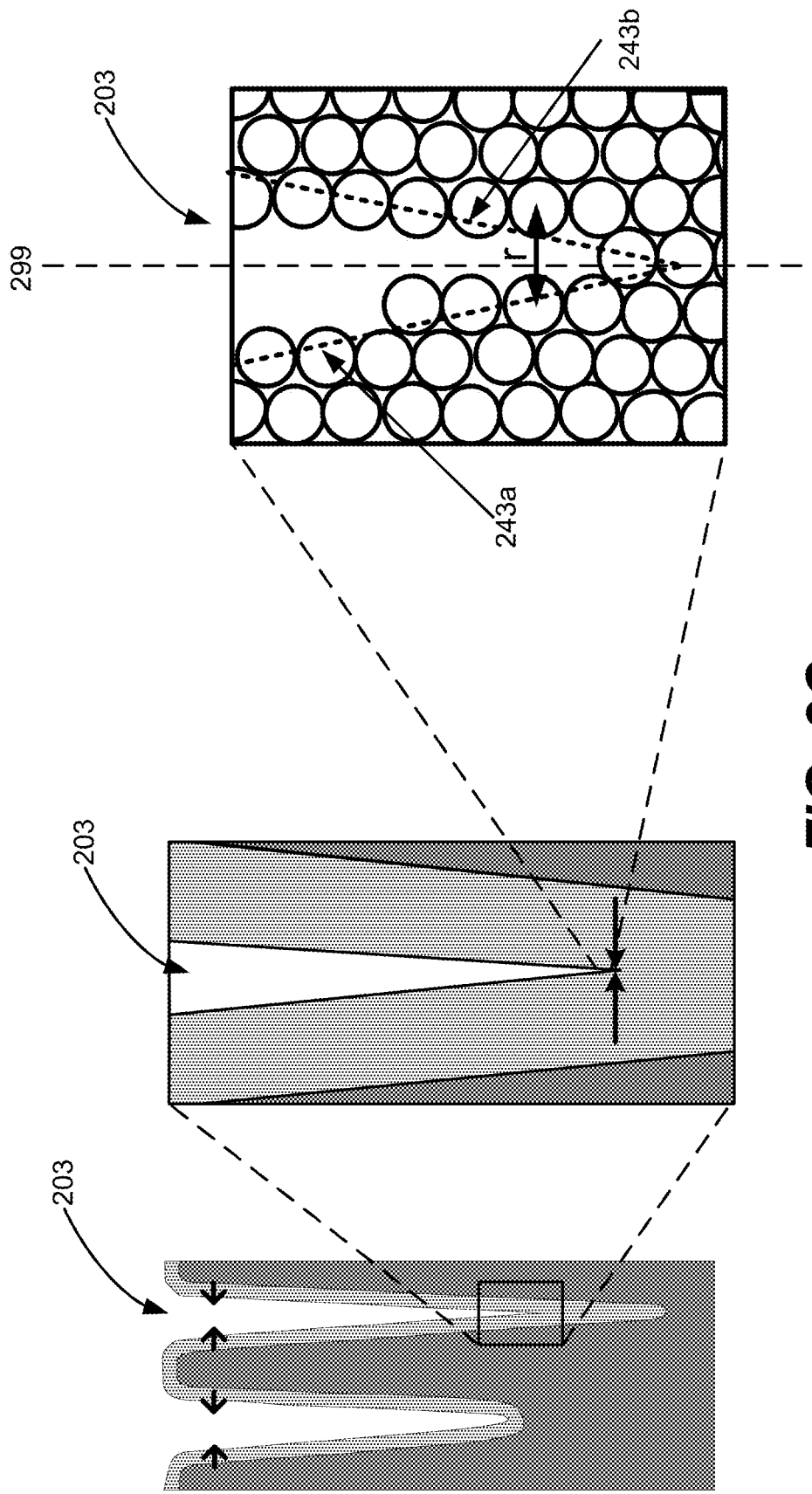
FIG. 2C depicts a schematic illustration of a zipping phenomenon.
Figure 2D:
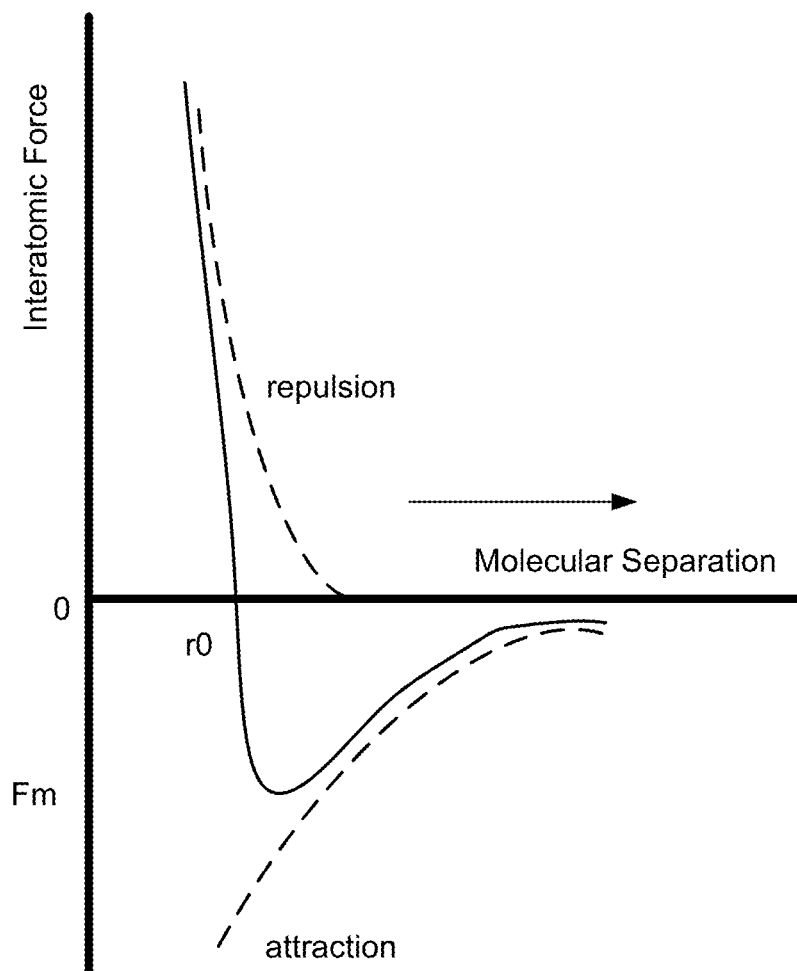
FIG. 2D is a graph showing the interatomic force as a function of tungsten-tungsten bond radius.

Conventional deposition processes for DRAM bWL trenches tend to distort the trenches such that the final trench width and resistance Rs are significantly non-uniform. FIG. 2B shows an unfilled (201) and filled (205) narrow asymmetric trench structure typical of DRAM bWL. As shown, multiple features are depicted on a substrate. These features may be spaced apart where adjacent features have a pitch between about 20 nm and about 40 nm. The pitch is defined as the distance between the middle axis of one feature to the middle axis of an adjacent feature. The unfilled features are generally V-shaped as shown in feature 203, having sloped sidewalls where the width of the feature narrows from the top of the feature to the bottom of the feature. The features widen from the feature bottom 213b to the feature top 213a. After tungsten fill, severe line bending is observed in substrate 205. Without being bound by a particular theory, it is believed that a cohesive force between opposing surfaces of a trench pulls the trench sides together as depicted by arrows 207. This phenomena is illustrated in FIG. 2C, and may be characterized as "zipping up" the feature. As the feature 203 is filled, more force is exerted from a center axis 299 of the feature 203, causing line bending. Deposited tungsten 243a and 243b on sidewalls of feature 203 thereby interact in close proximity, where tungsten-tungsten bond radius r is small, thereby causing cohesive interatomic forces between the smooth growing surfaces of tungsten and pulling the sidewalls together, thereby causing line bending. FIG. 2D illustrates the interatomic force as a function of tungsten-tungsten bond radius, r. As can be seen, a cohesive force exists at certain values of r.

Until recently, the bWL bending was believed to be caused by the intrinsic tungsten film stress during the fill. However, as noted above, the low stress tungsten films deposited by conventional ALD processes can cause severe line bending during the fill. An alternate explanation based on grain boundary zipping mechanism was proposed to explain the line bending.

Described herein are methods of filling features with metal and related systems and apparatuses for using an inhibition gas to reduce formation of metal-metal bonding and thereby reduce line bending. Inhibition gases include nitrogen, oxygen, ammonia, and combinations thereof, depending on the metal to be deposited and the conditions and chemistries used for deposition of the metal to be deposited. Various embodiments involve exposing the feature with partially filled metal to the inhibition gas without a plasma to reduce formation of metal-metal bonding in the feature. Certain disclosed embodiments are particularly suitable for filling V-shaped features as described herein.

Certain disclosed embodiments utilize the addition of nitrogen gas ($N_2$) during tungsten fill to disrupt the formation of tungsten-tungsten bonding, which reduces the strain in the bWL structure. Nitrogen addition can be done in a pulsed form (e.g., during a $H_2$ co-reactant pulse or purge pulse in a cyclic deposition technique such as atomic layer deposition (ALD), or sequential chemical vapor deposition (CVD), which are further described below) or in a continuous form during any suitable deposition technique, such as during an ALD cycle. Although various examples and embodiments herein are described with respect to tungsten, it will be understood that disclosed embodiments are suitable for depositing a variety of metals, including but not limited to ruthenium, molybdenum, cobalt, and more. Examples of applications include logic and memory contact fill, DRAM buried wordline fill, vertically integrated memory gate/wordline fill, and 3-D integration with through-silicon vias (TSVs). The methods described herein can be used to fill vertical features, such as in tungsten vias, and horizontal features, such as 3D-NAND wordlines. The methods may be used for conformal and bottom-up or inside-out fill.

Adding nitrogen during CVD and a pulsed nucleation layer (PNL) process is described in U.S. Pat. No. 8,551,885, filed on Aug. 29, 2008 and issued on Oct. 8, 2013, entitled "METHOD FOR REDUCING TUNGSTEN ROUGHNESS AND IMPROVING REFLECTIVITY" which is herein incorporated by reference in its entirety. As described there, nitrogen may be added to control the film roughness and improve tungsten fill.

Described herein are methods of preventing line bending by the addition of an inhibition gas such as nitrogen. Nitrogen addition is especially effective during ALD tungsten fill and sequential CVD tungsten fill since the film growth via a 2-D mechanism enhances the grain zipping mechanism.

Disclosed embodiments may block the surface of the growing tungsten film during the bWL fill process using nitrogen molecules. The W—$N_2$ bonding weakens the W—W interaction when the adjacent surfaces of the growing film merge, thus reducing the strain that would otherwise cause silicon line deflection. The process conditions can be modulated to minimize the nitrogen (N) incorporation into the film to maintain low resistivity of the tungsten fill.

Nitrogen is used in combination with a tungsten-containing precursor $WF_6$ to allow adsorbed $N_2$ molecules to disrupt W—W bonding interactions during the grain boundary merging such that the interactions will not cause increase stress on the film. The $H_2$ dose used to convert the tungsten-containing precursor to tungsten reacts to generate HF, which is desorbed and removed from the chamber. Weakly bonded $N_2$ molecules may remain on the tungsten surface in subsequent cycles of sequential CVD but may generally be used to reduce W—W bonding interactions at the grain boundary to promote gap fill progression without stress on the deposited tungsten film.

Disclosed embodiments include methods of depositing tungsten films having a low fluorine concentration using a sequential CVD process in combination with exposure to an inhibition gas such as nitrogen to reduce line bending. The deposited films may also have low stress. Certain methods involve introducing hydrogen and a tungsten-containing precursor such as tungsten hexafluoride in cycles. Disclosed embodiments may be integrated with other tungsten deposition processes to deposit a low stress tungsten film having substantially lower fluorine content than films deposited by conventional CVD. For example, sequential CVD processes may be integrated with nucleation layer deposition at low pressure, fluorine-free tungsten layer deposition, and/or non-sequential CVD processes. Disclosed embodiments have a wide variety of applications. Methods may be used to deposit tungsten into features with high step coverage, and may also be used to deposit tungsten into 3D NAND structures, including those with deep trenches. Further, the methods may be implemented for architectures that may otherwise be susceptible to line bending by the addition of nitrogen during the process.

Sequential CVD processes are distinguished from non-sequential CVD, pulsed CVD, atomic layer deposition (ALD), and nucleation layer deposition. Non-sequential CVD processes involve simultaneous exposure of two reactants, such that both reactants are flowed at the same time during deposition. For example, bulk tungsten may be deposited by exposing a substrate to hydrogen ($H_2$) and tungsten hexafluoride ($WF_6$) at the same time for a duration sufficient to fill features. Hydrogen and $WF_6$ react during the exposure to deposit tungsten into the features. In pulsed CVD processes, one reactant is continuously flowed while the other reactant is pulsed, but the substrate is exposed to both reactants during deposition to deposit material during each pulse. For example, a substrate may be exposed to a continuous flow of $H_2$ while $WF_6$ is pulsed, and $WF_6$ and $H_2$ react during the pulse to deposit tungsten.

In contrast, sequential CVD processes implement separate exposures to each reactant such that the reactants are not flowed into the chamber at the same time during deposition. Rather, each reactant flow is introduced to a chamber housing the substrate in temporally separated pulses in sequence, repeated one or more times in cycles. Generally, a cycle is the minimum set of operations used to perform a surface deposition reaction one time. The result of one cycle is the production of at least a partial film layer on a substrate surface. Cycles of sequential CVD are described in further detail below.

ALD and nucleation layer deposition also involve exposing the substrate to two reactants in temporally separated pulses in cycles. For example, in an ALD cycle, a first reactant is flowed into a chamber, the chamber is purged, a second reactant is flowed into the chamber, and the chamber is again purged. Such cycles are typically repeated to build film thickness. In conventional ALD and nucleation layer deposition cycles, the first reactant flow constitutes a first "dose" in a self-limiting reaction. For example, a substrate includes a limited number of active sites whereby a first reactant is adsorbed onto the active sites on the substrate and saturates the surface, and a second reactant reacts with the adsorbed layer to deposit material layer by layer in cycles.

However, in sequential CVD, reactants do not necessarily adsorb onto active sites on the substrate and in some embodiments, the reaction may not be self-limiting. For example, reactants used in sequential CVD may have a low adsorption rate. Moreover, reactants on the surface of the substrate may not necessarily react with a second reactant when the second reactant is introduced. Rather, in some embodiments of sequential CVD, some reactants on the substrate remain unreacted during the cycle, and are not reacted until a subsequent cycle. Some reactants may not react due to stoichiometric properties, steric hindrance, or other effects.

Methods described herein are performed on a substrate that may be housed in a chamber. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Substrates have features such as via or contact holes, which may be characterized by one or more of V-shaped sidewalls, narrow and/or re-entrant openings, constrictions within the feature, and high aspect ratios. A feature may be formed in one or more of the above described layers. For example, the feature may be formed at least partially in a dielectric layer. In some embodiments, a feature may have an aspect ratio of at least about 2:1, at least about 4:1, at least about 6:1, at least about 10:1, or higher. One example of a feature is a hole or via in a semiconductor substrate or a layer on the substrate. Features may be spaced apart on the substrate by a pitch between adjacent features of about 20 nm to about 40 nm.

Figure 3D:
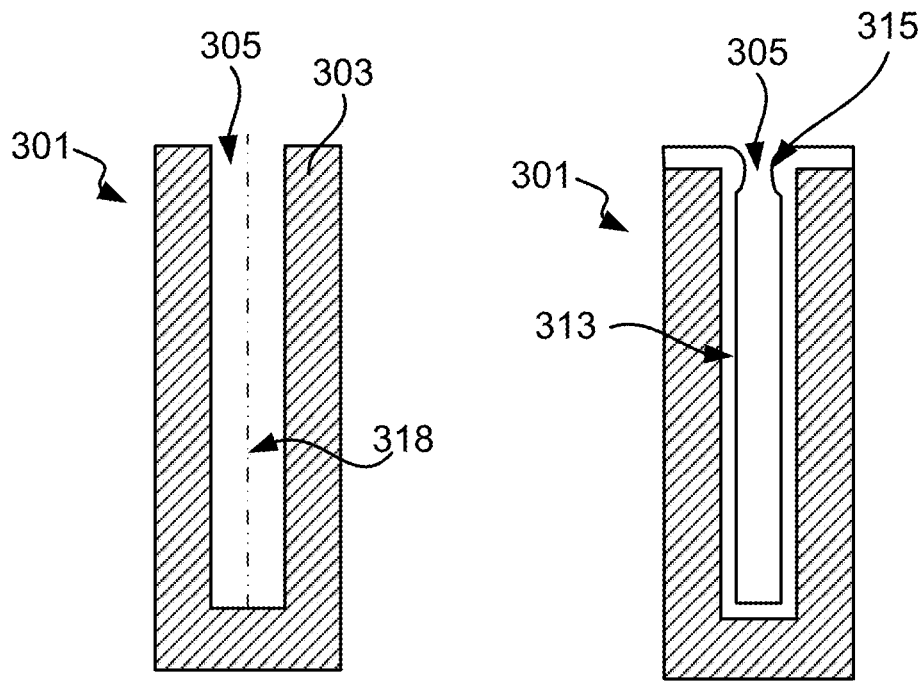
Figure 3D:
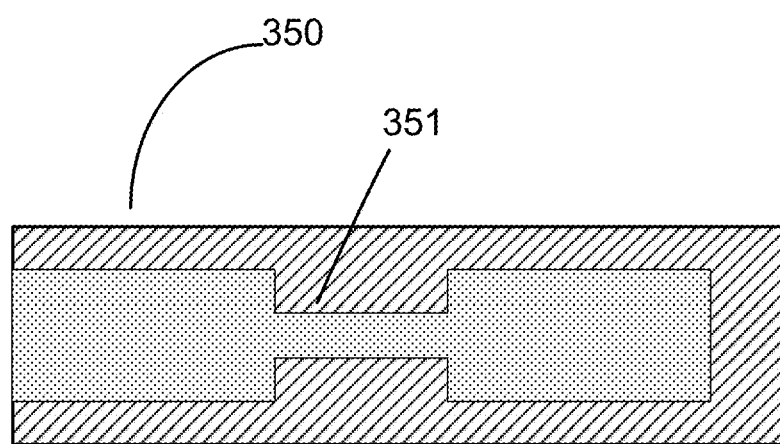

FIGS. 3A-3G are schematic examples of various structures in which tungsten may be deposited in accordance with disclosed embodiments. FIG. 3A shows an example of a cross-sectional depiction of a vertical feature 301 to be filled with tungsten. The feature 301 can include a feature hole 305 in a substrate 303. The hole 305 or other feature may have a dimension near the opening, e.g., an opening diameter or line width of between about 10 nm to 500 nm, for example between about 25 nm and about 300 nm. The feature hole 305 can be referred to as an unfilled feature or simply a feature. The feature 301, and any feature, may be characterized in part by an axis 318 that extends through the length of the feature through the center of the hole 305, with vertically-oriented features having vertical axes and horizontally-oriented features having horizontal axes.

In some embodiments, features are trenches in a 3D NAND structure. For example, a substrate may include a wordline structure having at least 60 lines, with 18 to 48 layers, or hundreds of layers, with trenches at least 200 Å deep or many microns dee. Another example is a trench in a substrate or layer. Features may be of any depth. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

FIG. 3B shows an example of a feature 301 that has a re-entrant profile. A re-entrant profile is a profile that narrows from a bottom, closed end, or interior of the feature to the feature opening. According to various implementations, the profile may narrow gradually and/or include an overhang at the feature opening. FIG. 3B shows an example of the latter, with an under-layer 313 lining the sidewall or interior surfaces of the feature hole 305 of feature 301. The under-layer 313 can be for example, a diffusion barrier layer, an adhesion layer, a nucleation layer, a combination of thereof, or any other applicable material. Non-limiting examples of under-layers can include dielectric layers and conducting layers, e.g., silicon oxides, silicon nitrides, silicon carbides, metal oxides, metal nitrides, metal carbides, and metal layers. In particular implementations an under-layer can be one or more of Ti, TiN, WN, TiAl, and W. The under-layer 313 forms an overhang 315 such that the under-layer 313 is thicker near the opening of the feature 301 than inside the feature 301.

Figure 3C:
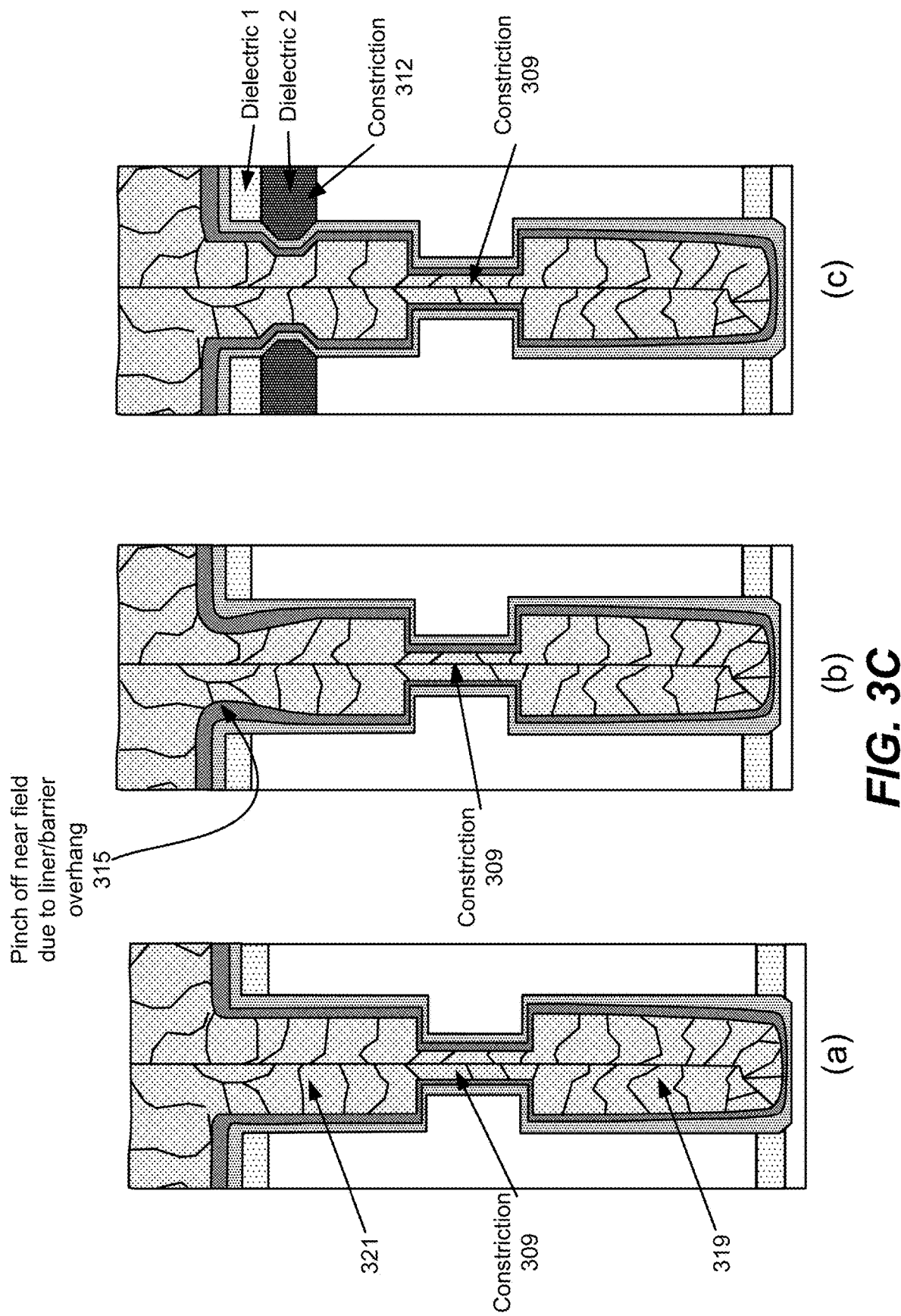

In some implementations, features having one or more constrictions within the feature may be filled. FIG. 3C shows examples of views of various filled features having constrictions. Each of the examples (a), (b) and (c) in FIG. 3C includes a constriction 309 at a midpoint within the feature. The constriction 309 can be, for example, between about 15 nm-20 nm wide. Constrictions can cause pinch off during deposition of tungsten in the feature using conventional techniques, with deposited tungsten blocking further deposition past the constriction before that portion of the feature is filled, resulting in voids in the feature. Example (b) further includes a liner/barrier overhang 315 at the feature opening. Such an overhang could also be a potential pinch-off point.

Example (c) includes a constriction 312 further away from the field region than the overhang 315 in example (b).

Horizontal features, such as in 3-D memory structures, can also be filled. FIG. 3D shows an example of a horizontal feature 350 that includes a constriction 351. For example, horizontal feature 350 may be a word line in a 3D NAND structure.

Figure 3E:
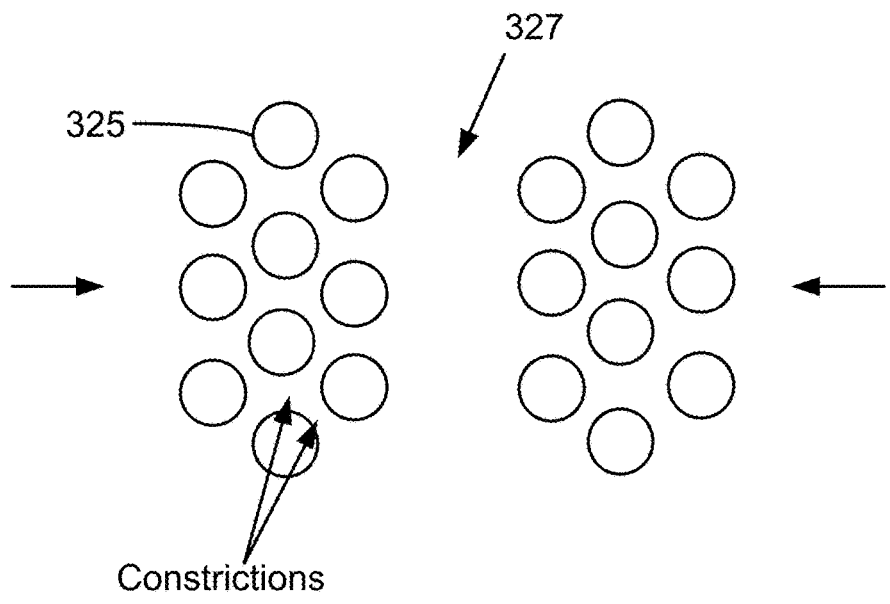
Figure 3F:
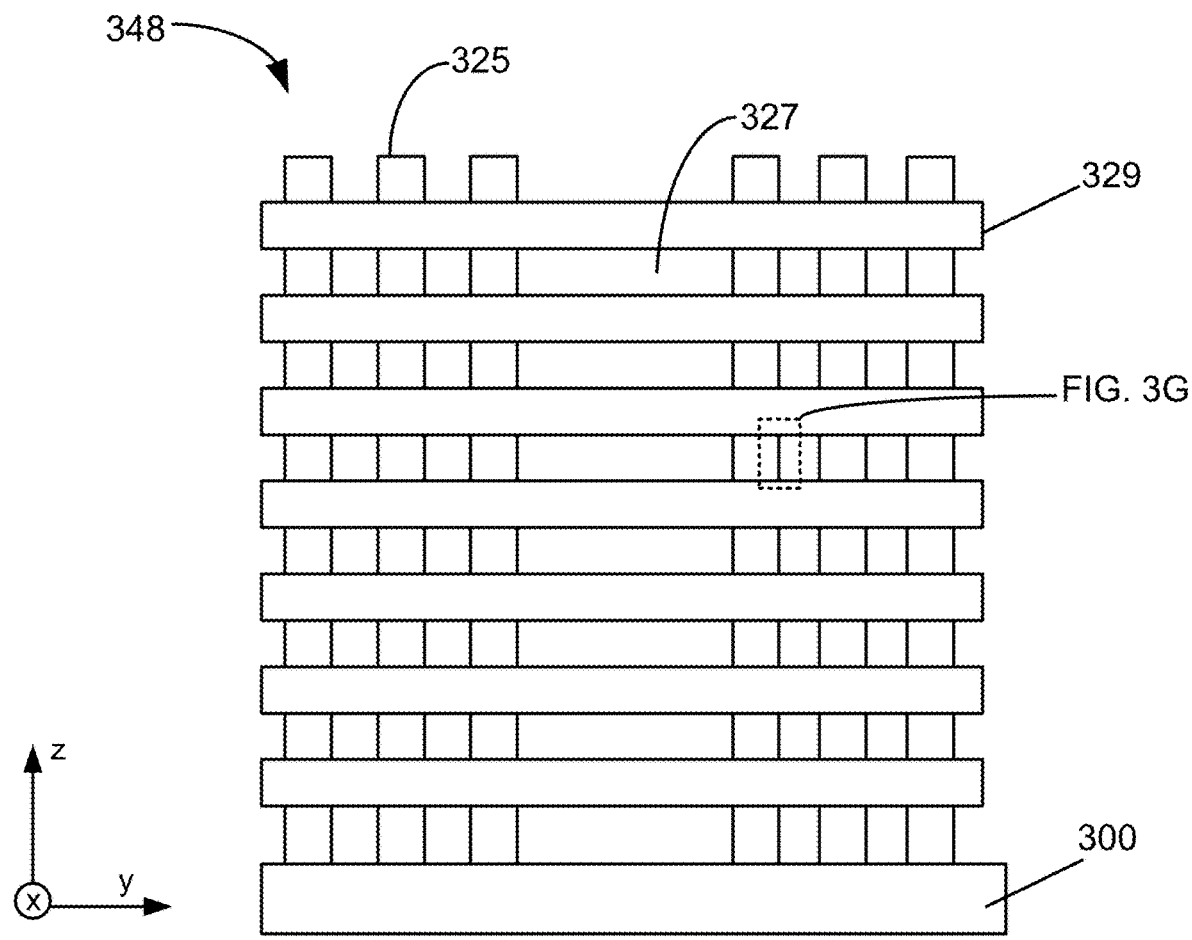

In some implementations, the constrictions can be due to the presence of pillars in a 3D NAND or other structure. FIG. 3E, for example, shows a plan view of pillars 325 in a 3D NAND or vertically integrated memory (VIM) structure 348, with FIG. 3F showing a simplified schematic of a cross-sectional depiction of the pillars 325. Arrows in FIG. 3E represent deposition material; as pillars 325 are disposed between an area 327 and a gas inlet or other deposition source, adjacent pillars can result in constrictions 351 that present challenges in void free fill of an area 327.

The structure 348 can be formed, for example, by depositing a stack of alternating interlayer dielectric layers 329 and sacrificial layers (not shown) on a substrate 300 and selectively etching the sacrificial layers. The interlayer dielectric layers may be, for example, silicon oxide and/or silicon nitride layers, with the sacrificial layers a material selectively etchable with an etchant. This may be followed by etching and deposition processes to form pillars 325, which can include channel regions of the completed memory device.

The main surface of substrate 300 can extend in the x and y directions, with pillars 325 oriented in the z-direction. In the example of FIGS. 3E and 3F, pillars 325 are arranged in an offset fashion, such that pillars 325 that are immediately adjacent in the x-direction are offset with each other in the y-direction and vice versa. According to various implementations, the pillars (and corresponding constrictions formed by adjacent pillars) may be arranged in any number of manners. Moreover, the pillars 325 may be any shape including circular, square, etc. Pillars 325 can include an annular semi-conducting material, or circular (or square) semi-conducting material. A gate dielectric may surround the semi-conducting material. The area between each interlayer dielectric layer 329 can be filled with tungsten; thus structure 348 has a plurality of stacked horizontally-oriented features that extend in the x and/or y directions to be filled.

Figure 3G:
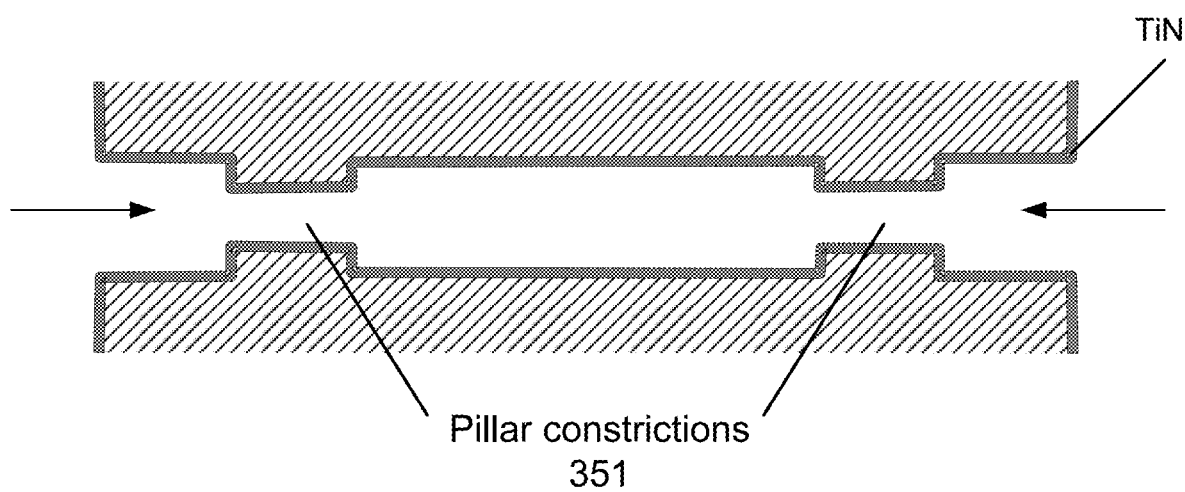

FIG. 3G provides another example of a view of a horizontal feature, for example, of a 3D NAND or other structure including pillar constrictions 351. The example in FIG. 3G is open-ended, with material to be deposited able to enter horizontally from two sides as indicated by the arrows. (It should be noted that example in FIG. 3G can be seen as a 2-D rendering 3-D features of the structure, with the FIG. 3G being a cross-sectional depiction of an area to be filled and pillar constrictions shown in the figure representing constrictions that would be seen in a plan rather than cross-sectional view.) In some implementations, 3-D structures can be characterized with the area to be filled extending along two or three dimensions (e.g., in the x and y or x, y and z-directions in the example of FIG. 3F), and can present more challenges for fill than filling holes or trenches that extend along one or two dimensions. For example, controlling fill of a 3-D structure can be challenging as deposition gasses may enter a feature from multiple dimensions.

FIG. 3H provides an example of a cross-sectional view of a V-shaped feature. FIG. 3H includes feature 301 to be filled with tungsten, including a feature hole 305 in a substrate 303. The hole has a dimension near the opening (e.g., an opening diameter or a line width w, which may be between about 10 nm and about 20 nm, or about 15 nm). The width is measured by the distance between sidewalls of a feature. The width may vary from the top of the feature at the feature opening (the opening diameter or line width w) to the bottom of the feature. The feature hole 305 is characterized in part by an axis 318. The V-shaped feature 301 includes a depth 350 which may be between about 80 nm and about 120 nm, or about 100 nm. In various embodiments, the sidewalls meet at a point 395 at the bottom of the feature or in some embodiments, the bottom of the feature plateaus to a flat bottom surface, which may have a distance from one sidewall to the other of between about 0.1 w and about 0.9 w, or as a percentage of line width w at the opening of about 10% of the width w to about 90% of the width w. Features may have an aspect ratio of between 2:1 and about 10:1, or between about 6:1 and about 8:1, or about 6:1, or about 8:1. The pitch of the lines may be between about 20 nm and about 40 nm. The bottom of the feature, which is characterized as the region in the bottom 50% to 70% of the depth of the feature, may have a width between sidewalls of between 0 nm and about 20 nm.

FIG. 3I provides another example of a cross-sectional view of a V-shaped feature. The V-shaped feature as described herein refers to features having narrowing width from the top field level of the substrate to the bottom of the feature. FIG. 3I includes feature 301 to be filled with a metal such as tungsten, including a feature hole 305 in a substrate 303. The hole has a dimension near the opening (e.g., an opening diameter or a line width w, which may be between about 10 nm and about 20 nm, or about 15 nm). The bottom of the feature 396 has a width narrower than that of w. For example, the bottom of the feature 396 may have a width between 1% and 90% of the width w, or between 1% and 50%, or between 10% and 20% of the width w.

Multiple V-shaped features are present on a substrate in various disclosed embodiments, such as shown in FIG. 2B. Multiple features on a substrate are defined as adjacent features having a distance no larger than between 20 nm and 40 nm of each other. In various embodiments, such multiple features includes all V-shaped features, which may have a shape such as depicted in FIG. 3H or 3I.

Examples of feature fill for horizontally-oriented and vertically-oriented features are described below. It should be noted that the examples applicable to both horizontally-oriented or vertically-oriented features. Moreover, it should also be noted that in the description below, the term "lateral" may be used to refer to a direction generally orthogonal to the feature axis and the term "vertical" to refer to a direction generally along the feature axis.

While the description below focuses on tungsten feature fill, aspects of the disclosure may also be implemented in filling features with other materials. For example, feature fill using one or more techniques described herein may be used to fill features with other materials including other tungsten-containing materials (e.g., tungsten nitride (WN) and tungsten carbide (WC)), titanium-containing materials (e.g., titanium (Ti), titanium nitride (TiN), titanium silicide (TiSi), titanium carbide (TiC) and titanium aluminide (TiAl)), tantalum-containing materials (e.g., tantalum (Ta), and tantalum nitride (TaN)), and nickel-containing materials (e.g., nickel (Ni) and nickel silicide (NiSi). Further, some of the methods and apparatus disclosed herein are not limited to feature fill, but can be used to deposit tungsten on any appropriate surface including forming blanket films on planar surfaces.

Figure 4A:
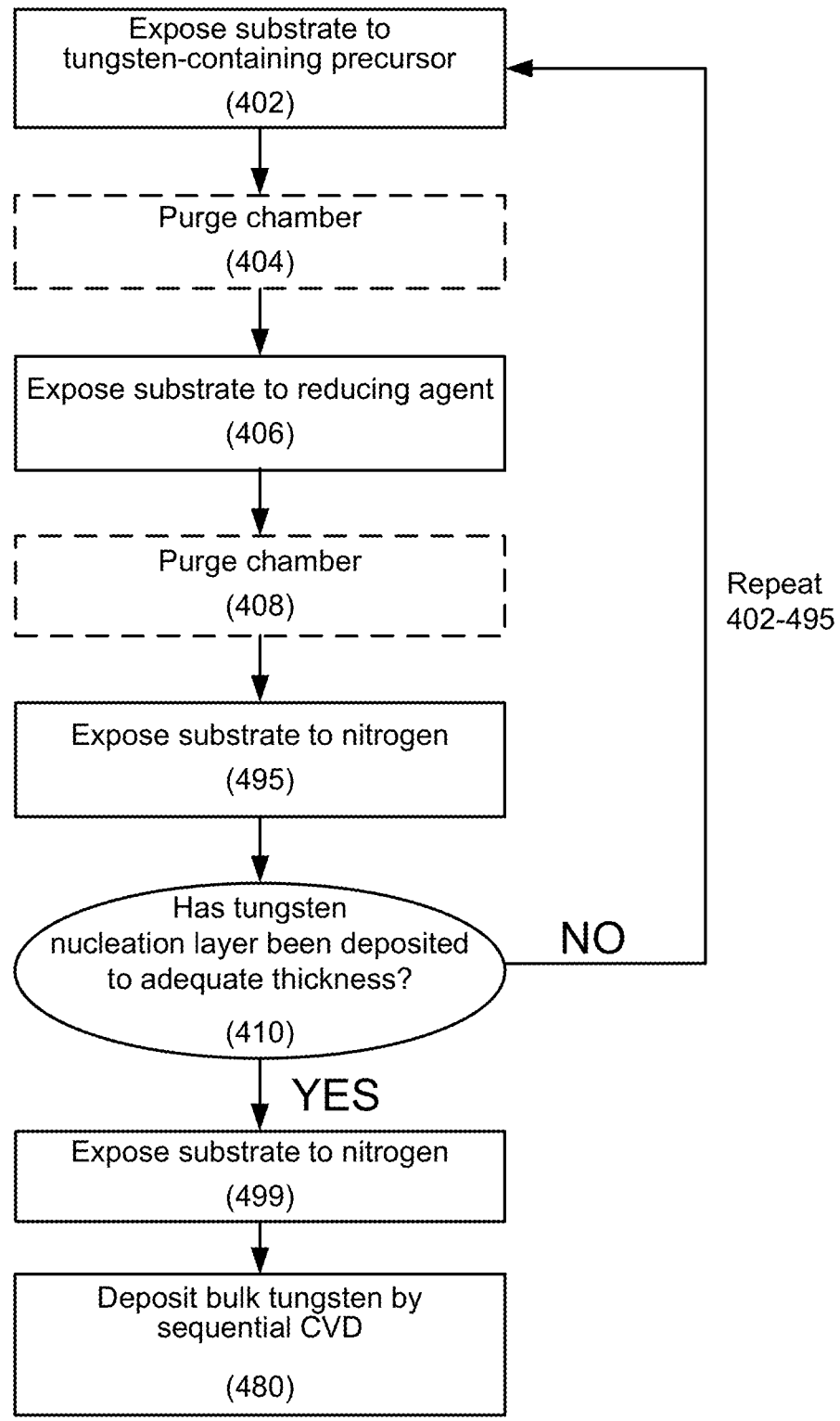
FIGS. 4A-4D are process flow diagrams depicting operations for methods performed in accordance with certain disclosed embodiments.

FIG. 4A provides a process flow diagram for a method performed in accordance with certain disclosed embodiments. Operations 402-410 of FIG. 4A are performed to deposit a tungsten nucleation layer by ALD. Operation 495 involves exposing the substrate to nitrogen. Operations 402, 404, 406, 408, 495, and 410 are performed to deposit a tungsten nucleation layer in accordance with various embodiments. In various embodiments described herein, operations 402-410 are performed at lower pressure than operation 480. For example, operations 402-410 may be performed at a low pressure less than about 10 Torr. In some examples, operations 402-410 are performed at a pressure of about 10 Torr, or a pressure of about 3 Torr. Without being bound by a particular theory, it is believed that performing operations 402-410 at a low pressure reduces fluorine concentration in the deposited tungsten film due to a lower partial pressure of a fluorine-containing precursor in the chamber when the film is deposited, such that less fluorine is incorporated into the film. Examples of processes for depositing a tungsten nucleation layer at low pressure to achieve low fluorine concentration in deposited tungsten are further described in U.S. patent application Ser. No. 14/723,275 filed on May 27, 2015.

In operation 402, the substrate is exposed to a tungsten-containing precursor such as $WF_6$. For purposes of the description herein, although $WF_6$ is used as an example of a tungsten-containing precursor, it should be understood that other tungsten-containing precursors may be suitable for performing disclosed embodiments. For example, a metal-organic tungsten-containing precursor may be used. Organometallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. Chlorine-containing tungsten precursors ($WCl_x$) such as tungsten pentachloride ($WCl_5$) and tungsten hexachloride ($WCl_6$) may be used.

In this example, the tungsten-containing precursor may include a combination of these compounds. In some embodiments, a carrier gas, such as nitrogen ($N_2$), argon (Ar), helium (He), or other inert gases, may be flowed during operation 402. The carrier gas with the tungsten-containing precursor may be diverted before delivery to the substrate in some embodiments.

While tungsten is described herein, it will be understood that in some embodiments, another metal may be deposited instead of tungsten, by using a suitable metal-containing precursor. For example, for deposition of molybdenum into features, a molybdenum-containing precursor such as molybdenum tetrachloride ($MoCl_4$) may be used.

Operation 402 may be performed for any suitable duration and at any suitable temperature. In some examples, operation 402 may be performed for a duration between about 0.25 seconds and about 30 seconds, about 0.25 seconds to about 5 seconds, or about 0.5 seconds to about 3 seconds. This operation may be performed in some embodiments for a duration sufficient to saturate the active sites on the surface of the substrate.

In operation 404, the chamber is optionally purged to remove excess $WF_6$ that did not adsorb to the surface of the substrate. A purge may be conducted by flowing an inert gas at a fixed pressure thereby reducing the pressure of the chamber and re-pressurizing the chamber before initiating another gas exposure.

In operation 406, the substrate is exposed to a reducing agent to deposit a tungsten nucleation layer. The reducing agent may be a borane, silane, or germane. Example boranes include borane ($BH_3$), diborane ($B_2H_6$), triborane, alkyl boranes, aminoboranes, carboranes, and haloborane. Example silanes include silane ($SiH_4$), disilane ($Si_2H_6$), trisilane ($Si_3H_8$), alkyl silanes, aminosilanes, carbosilanes, and halosilane. Germanes include $Ge_nH_{n+4}$, $Ge_nH_{n+6}$, $Ge_nH_{n+8}$, and $Ge_nH_m$, where n is an integer from 1 to 10, and n is a different integer than m. Other germanes may also be used, e.g., alkyl germanes, aminogermanes, carbogermanes, and halogermanes. In general, halogermanes may not have significant reducing potential but there may be process conditions and tungsten-containing precursors suitable for film formation using halogermanes.

Operation 406 may be performed for any suitable duration. In some examples, Example durations include between about 0.25 seconds and about 30 seconds, about 0.25 seconds to about 5 seconds, or about 0.5 seconds to about 3 seconds. In some embodiments, this operation may be sufficient to react with the adsorbed layer of $WF_6$ on the surface of the substrate. Operation 406 may be performed for a duration outside of these example ranges. In some embodiments, a carrier gas may be used, such as, for example, argon (Ar), helium (He), or nitrogen ($N_2$).

After operation 406, there may be an optional purge step to purge excess reducing agent still in gas phase that did not react with $WF_6$ on the surface of the feature. A purge may be conducted by flowing an inert gas at a fixed pressure thereby reducing the pressure of the chamber and re-pressurizing the chamber before initiating another gas exposure.

In operation 408, the chamber is purged to remove any reaction by-products. The chamber may be purged by introducing a purge gas, such as an inert gas, or may be performed by expunging the chamber. Example inert gases include but are not limited to hydrogen, argon, and helium.

In operation 495, the substrate is exposed to nitrogen. Nitrogen passivates the substrate, which can thereby reduce tungsten-tungsten bonding from the sidewalls of features on the substrate. In some embodiments, an inert gas may be flowed with the nitrogen to the substrate. Example inert gases include argon, helium, and hydrogen. In embodiments where a combination of nitrogen and hydrogen are introduced, the mixture of nitrogen and hydrogen may include at least about 10% nitrogen, or between about 1c % to about 100% nitrogen gas.

Operation 495 is performed at a temperature less than about 500° C. or less than about 450° C. At temperatures above 500° C., undesired nitrogen atoms may be incorporated into the tungsten film in the feature. Operation 495 may be performed at the same pressure as the pressure used in operations 402-408. In some embodiments, operation 495 is performed at a different pressure than the pressure used in operations 402-408 and the pressure is modulated between the two pressures for each cycle.

In various embodiments, other inhibition gases may be used instead of nitrogen. In various embodiments, oxygen may be used in lieu of nitrogen in some embodiments. In some embodiments, the inhibition gas may be nitrogen, oxygen, ammonia, or combinations thereof, depending on the metal to be deposited and the metal-containing precursor used for deposition. For example, in some embodiments, ammonia ($NH_3$) may be flowed instead of or in addition to nitrogen to prevent metal-metal bonding from deposited material on the sidewalls of the substrate. If ammonia is used, the tungsten-containing precursor is not co-flowed with ammonia so as to prevent reaction between the tungsten-containing precursor and ammonia. For example, as described further below, in some embodiments nitrogen is introduced continuously or in pulses. Where tungsten hexafluoride is used as the tungsten-containing precursor, ammonia is introduced only in pulses, or only when the tungsten hexafluoride is not introduced to the substrate.

In operation 410, it is determined whether the tungsten nucleation layer has been deposited to an adequate thickness. If not, operations 402-408 are repeated until a desired thickness of a tungsten nucleation layer is deposited on the surface of the feature. Additionally, operation 495 may be performed in every repeated cycle, or every 2 cycles, or every 3 cycles, or every 4 cycles, or less frequently. Each repetition of operations 402-408 may be referred to as an ALD "cycle." In some embodiments, the order of operations 402 and 406 may be reversed, such that reducing agent is introduced first.

After the tungsten nucleation layer is deposited to an adequate thickness, the substrate may be exposed to nitrogen (or oxygen or a nitrogen-containing gas such as ammonia) in operation 499. Following exposure to nitrogen in operation 499, in operation 480, bulk tungsten is deposited by sequential CVD. While sequential CVD is described herein, in some embodiments, bulk tungsten may be deposited by any suitable method, such as CVD or ALD. In various embodiments, operation 480 may be performed at a pressure greater than the pressure during operations 402-410. For example, operation 480 may be performed at a pressure greater than or equal to about 10 Torr, for example about 10 Torr, or about 40 Torr.

Figure 4B:
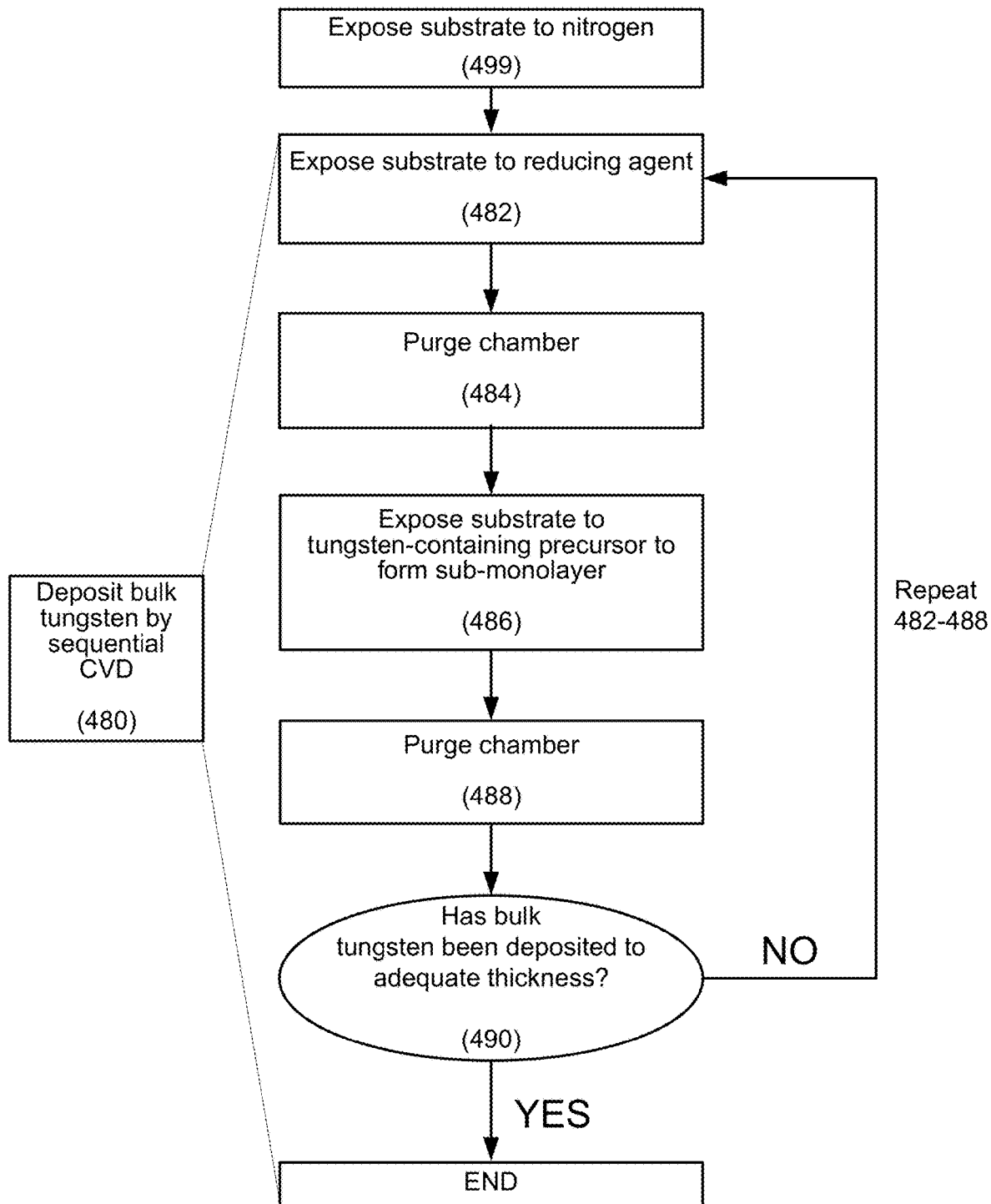

FIG. 4B provides a process flow diagram for operations that may be performed during operation 480 after exposure to nitrogen in operation 499. It will be understood that operation 499 may be performed continuously such that nitrogen gas is flowed continuously during bulk deposition of tungsten by sequential CVD, or in some embodiments may be pulsed periodically, such as pulsed only during reducing agent exposure, or pulsed only during a purge gas operation, or pulsed only during one purge gas operation, or pulsed only during a tungsten-containing precursor dose, or pulsed during one or more of the above operations. Pulsing may occur during every cycle, or every 2 cycles, or every 3 cycles, or every 4 cycles, or less frequently as desired. A combination of continuous and pulsed exposures may also be used in some embodiments. Further, as described above, where ammonia is used to mitigate reactions between tungsten deposited on opposite sidewalls of a feature, ammonia is not introduced in continuous or pulsed doses during tungsten-containing precursor exposure, such as during exposure to tungsten hexafluoride.

Note that operations of FIG. 4B may be performed without performing operations of FIG. 4A. In FIG. 4B, in operation 482, the substrate is exposed to a reducing agent, such as $H_2$. This operation may be referred to as a "pulse" or a "dose," which may be used interchangeably herein. In embodiments described herein, $H_2$ is provided as an example reducing agent, but it will be understood that other reducing agents, including silanes, boranes, germanes, phosphines, hydrogen-containing gases, and combinations thereof, may be used. Unlike non-sequential CVD, $H_2$ is pulsed without flowing another reactant. In some embodiments, a carrier gas may be flowed. The carrier gas may be any of those described above with respect to operation 404 in FIG. 4A, such as argon or helium. Operation 482 may be performed for any suitable duration. In some examples, Example durations include between about 0.25 seconds and about 30 seconds, about 0.25 seconds to about 5 seconds, or about 0.5 seconds to about 3 seconds.

Returning to FIG. 4B, in operation 484, the chamber is purged. In some embodiments, purging is optional. This purge operation may remove excess $H_2$ that remained in gas phase. A purge is conducted by flowing an inert gas at a fixed pressure thereby reducing the pressure of the chamber and re-pressurizing the chamber before initiating another gas exposure. The chamber may be purged for any suitable duration, for example, for a duration between about 0.1 seconds and about 3 seconds.

Returning to FIG. 4B, in operation 486, the substrate is exposed to a tungsten-containing precursor (e.g., $WF_6$) to form a sub-monolayer of film on the substrate. Other tungsten-containing precursors may be used in some embodiments. Although $WF_6$ is used as an example of a tungsten-containing precursor, it should be understood that other tungsten-containing precursors may be suitable for performing disclosed embodiments. For example, a metal-organic tungsten-containing precursor may be used. Organo-metallic precursors and precursors that are free of fluorine, such as MDNOW (methylcyclopentadienyl-dicarbonylnitrosyl-tungsten) and EDNOW (ethylcyclopentadienyl-dicarbonylnitrosyl-tungsten) may also be used. Chlorine-containing tungsten precursors ($WCl_x$) such as tungsten pentachloride ($WCl_5$) and tungsten hexachloride ($WCl_6$) may be used.

In this example, the tungsten-containing precursor may include a combination of these compounds. In some embodiments, a carrier gas, such as nitrogen ($N_2$), argon (Ar), helium (He), or other inert gases, may be flowed. The carrier gas may be diverted before delivery of the tungsten-containing precursor to the substrate in some embodiments.

While tungsten is described herein, it will be understood that in some embodiments, another metal may be deposited instead of tungsten, by using a suitable metal-containing precursor. For example, for deposition of molybdenum into features, a molybdenum-containing precursor such as molybdenum tetrachloride ($MoCl_4$) may be used.

For purposes of this example, $WF_6$ is used. In various embodiments, $WF_6$ is flowed to the chamber during this operation for a duration between about 0.1 seconds and about 3 seconds, or about 0.5 seconds. In some embodiments, $WF_6$ may be diverted to fill the gas line and line change before dosing. In some embodiments, $WF_6$ is flowed to the chamber but does not fully react with all Ha molecules on the surface of the substrate.

During operation 486 of FIG. 4B, some $WF_6$ may react with $H_2$ that remained on the surface from the prior dose. During operation 486 of FIG. 4B, some $WF_6$ may not fully react with $H_2$ that remained on the surface from the prior dose. During operation 486 of FIG. 4B, some $WF_6$ may not react with $H_2$ at all and may instead be physisorbed onto the surface of the substrate where no $H_2$ physisorbed or remained on the substrate surface. In some embodiments, $WF_6$ may remain on the substrate surface but may not be physisorbed or chemisorbed to the surface. Such examples are described below with respect to FIGS. 5A-5J in the example mechanism drawings.

Operation 486 of FIG. 4B may thereby form a sub-monolayer of tungsten in many embodiments. For example, a sub-monolayer having a thickness of about 0.3 Å may be deposited after performing operations 482-486.

In some embodiments, operations 486 and 482 may be reversed such that operation 486 is performed before 482. In some embodiments, operation 482 may be performed before operation 486.

In operation 488 of FIG. 4B, the chamber is purged to remove reacted byproducts and $WF_6$ in gas phase from the chamber. In some embodiments, a purge duration that is too short in operation 488 may increase non-sequential CVD reaction characteristics such that a higher stress film will be deposited. In some embodiments, the purge duration is between about 0.1 seconds and about 2 seconds and may prevent removing all of the $WF_6$ from the substrate surface due to the low adsorption rate of $WF_6$ to a surface of tungsten. In some embodiments, purge duration is between about 0.1 seconds and about 15 seconds, such as about 7 seconds. For example, for fabrication of a 3D NAND structure, the chamber may be purged for about 7 seconds during operation 288. The purge duration depends on the substrate and stress.

In operation 490 of FIG. 4B, it is determined whether bulk tungsten has been deposited to an adequate thickness. If not, operations 482-488 are repeated until a desired thickness is deposited. In some embodiments, operations 482-488 are repeated until a feature is filled. In some embodiments, operation 499 is also repeated in combination with operations 482-488 when repeating the deposition cycle to deposit bulk tungsten by sequential CVD.

Figure 4C:
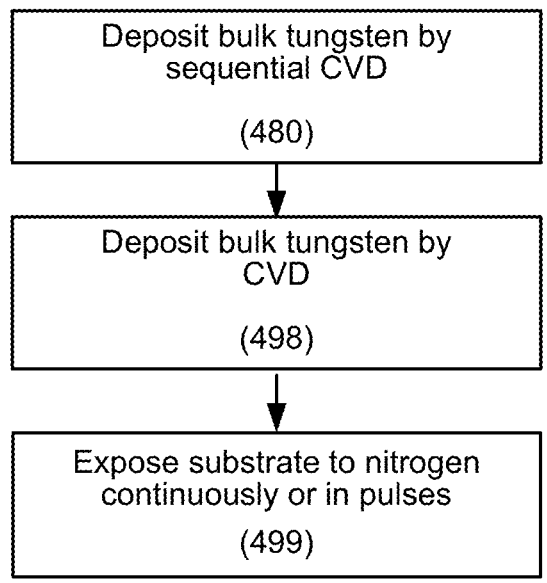

FIG. 4C provides a process flow diagram for a method performed in accordance with disclosed embodiments. In operation 480, bulk tungsten is deposited by sequential CVD. The process conditions and chemistries may be any of those described above with respect to FIGS. 4B and 5A-5J. In operation 498, bulk tungsten is deposited by non-sequential CVD. During non-sequential CVD, a substrate is exposed to a tungsten-containing precursor and a reducing agent simultaneously to deposit bulk tungsten. Example tungsten-containing precursors include fluorine-containing precursors (e.g., $WF_6$), chlorine-containing precursors (e.g., $WCl_x$), and tungsten hexacarbonyl ($W(CO)_6$). Example reducing agents include hydrogen. In some embodiments, non-sequential CVD is deposited by exposing the substrate to $WF_6$ and $H_2$. Operations 480 and 498 may be performed sequentially, or any of operation 480 may be performed one or more times before or after performing operation 498. In some embodiments, operations 480 and 498 are performed in pulses, such that operation 498 is performed every 2 or more cycles of performing operation 480. Bulk tungsten may thus be deposited using a combination of sequential CVD and non-sequential CVD. In operation 499, the substrate is exposed to nitrogen. In some embodiments, operation 499 is performed in combination with operation 480, 498, or both. In various embodiments, the substrate is exposed to nitrogen continuously during operations 480, 498, or both. In various embodiments, the substrate is exposed to pulses of nitrogen during operations 480, 498, or both. In various embodiments, oxygen or another nitrogen-containing gas such as ammonia is used instead of or in combination with nitrogen. Operations 480, 498, and 499 may be performed sequentially, or any of operation 480 or 499 may be performed one or more times before or after performing operation 498. In some embodiments, operation 480 and 498 and 499 are performed in pulses, such that operation 498 is performed every 2 or more cycles of performing operation 480, which is performed every 2 or more cycles of performing operation 499. Bulk tungsten may thus be deposited using a combination of sequential CVD and non-sequential CVD with continuous exposure to nitrogen, oxygen and combinations thereof. Bulk tungsten may thus be deposited using a combination of sequential CVD and non-sequential CVD with periodic pulses of exposure to nitrogen, oxygen, ammonia, and combinations thereof.

Figure 4D:
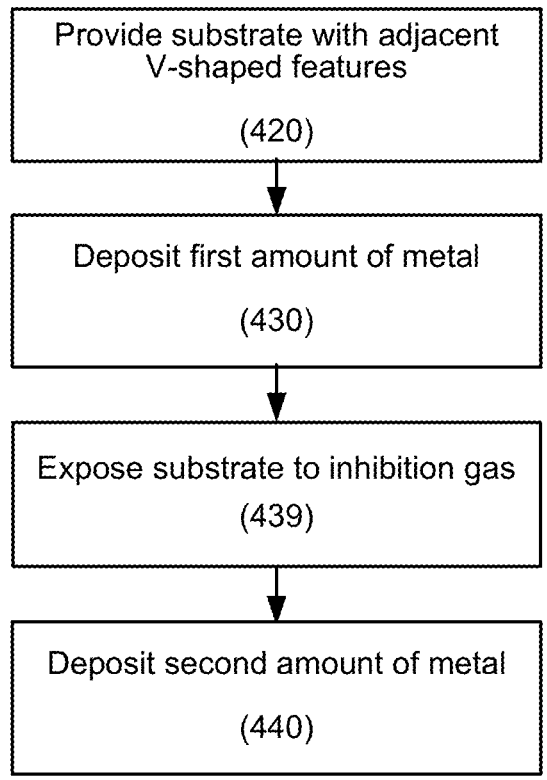

FIG. 4D provides a process flow diagram for a method performed in accordance with disclosed embodiments. In operation 420, a substrate having adjacent V-shaped features is provided. V-shaped features are as defined above with respect to FIGS. 3H and 3I. The distance between adjacent features on the substrate is no greater than a distance between about 20 nm and about 40 nm. In operation 430, a first amount of metal is deposited in the V-shaped features. In various embodiments, the metal is tungsten. In some embodiments, the metal is ruthenium, or cobalt, or molybdenum. The metal is deposited using any suitable technique, such as CVD, ALD, sequential CVD, and the like. In some embodiments, the metal is tungsten deposited by sequential CVD using a tungsten-containing precursor such as $WF_6$, $WCl_6$, or $WCl_5$. In operation 439, the substrate is exposed to an inhibition gas, which may be nitrogen, oxygen, ammonia, or combinations thereof depending on the metal to be deposited, the technique used to deposit it, and the precursor used to deposit it. For example, in some embodiments, the inhibition gas is nitrogen, and the metal deposited is tungsten using $WF_6$ as the tungsten-containing precursor. As noted above, it will be understood that if ammonia is uses as the inhibition gas and $WF_6$ as the tungsten-containing precursor for depositing tungsten, exposures to the inhibition gas and exposure to $WF_6$ to deposit the tungsten are separate temporally to reduce reaction between ammonia and $WF_6$. It will be understood that operation 439 may be part of operation 430 such that during deposition of the first amount of metal, the substrate is periodically or continuously exposed to an inhibition gas. Such examples are described further below with respect to FIGS. 8-11. In operation 440, a second amount of metal is deposited over the first amount of metal. Any suitable deposition technique may be used. In some embodiments, operation 440 is performed after performing 439. For example, in one embodiment, a first amount of tungsten is deposited by CVD, the deposited tungsten is exposed to nitrogen, and a second amount of tungsten is deposited over the nitrogen-exposed deposited tungsten to fill a V-shaped feature. In some embodiments, operation 439 is performed as part of operation 440. For example, where the second amount of metal is deposited by sequential CVD, the inhibition gas may be flowed with pulses of hydrogen, or with pulses of argon, or pulses of the tungsten-containing precursor, or continuously throughout a sequential CVD cycle, where a sequential CVD cycle includes the operations of exposure to hydrogen, exposure to argon, exposure to a tungsten-containing precursor, and exposure to argon.

Disclosed embodiments are suitable for reducing line bending. Line bending analysis is performed by measuring the line width and roughness of the trenches filled with metal (i.e. tungsten). The line bending analysis involves imaging the metal at the top of the device opening with plan-view microscopy and measuring the metal width at multiple points on multiple lines. For each line, the line width is measured across 100 points. From each line, one then calculates the average line width and the variation of the line width, which may also be defined as roughness. The "line width mean" is the average of all the individual lines' average line width measured during analysis.

For line bending, two main metrics are defined as follows: (i) line-to-line (LTL) variation is the standard deviation of the average line widths, thereby capturing the variation of line width changes across different lines on the image, and (ii) line width roughness (LWR) is the average of line roughness (variation of line width within each line) from all the measured lines, thereby capturing the average line width variation within single lines. These two metrics, LTL and LWR are combined into single variation metric, σ total, as determined by $\sigma=(\sigma_1^2+\sigma_2^2)^{1/2}$. Furthermore, LTL and σ total are normalized with respect to line width mean, described as LTL % and σ total %.

In various embodiments, disclosed embodiments result in substrates where total variance is less than about 5 nm, or less than about 1.5 nm, or in percentage, less than about 7.2%, where total variance percentage is calculated by normalizing total variance by the average line width. An experiment conducted to determine thickness of films versus line bending for top down SEM/top of trench images showed that as thickness of the metal increases in V-shaped features or trenches such as shown in and described above with respect to FIGS. 3H and 3I, line bending phenomenon becomes more severe. This analysis was based on a top down SEM/top of trench analysis.

Nitrogen exposure to reduce line bending can be used during deposition of the tungsten nucleation layer and/or bulk tungsten. For example, referring to FIG. 4A, nitrogen exposure may be performed during any of operations 402, 404, 406, 408, and combinations thereof, or during all of operations 402-408. Referring to FIG. 4B, nitrogen exposure may be performed during any of operations 482, 484, 486, 488, and combinations thereof, or during all of operations 482-488. In some embodiments, nitrogen exposure is performed during bulk tungsten deposition by sequential CVD to reduce line bending when features are being filled on a substrate with bulk tungsten.

FIGS. 5A-5J are schematic illustrations of an example mechanism for cycles of sequential CVD. It will be understood that FIGS. 5A-5J do not include example mechanisms for nitrogen exposure; such example is provided in FIG. 6.

Figure 5A:
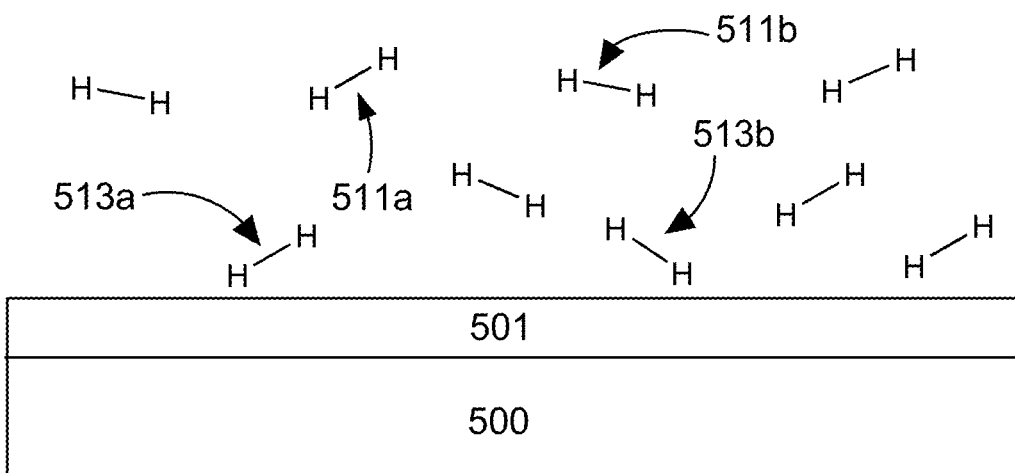
FIGS. 5A-5J and 6 are schematic diagrams of an example of a mechanism for depositing films in accordance with certain disclosed embodiments.

FIG. 5A depicts an example mechanism where $H_2$ is introduced to the substrate 500, which has a tungsten nucleation layer 501 deposited thereon. Hydrogen is introduced in gas phase (511a and 511b) and some $H_2$ (513a and 513b) is on the surface of the tungsten nucleation layer 301, but may not necessarily adsorb onto the surface. For example, $H_2$ may not necessarily chemisorb onto the nucleation layer 501, but in some embodiments, may physisorb onto the surface of the nucleation layer 501.

Figure 5B:
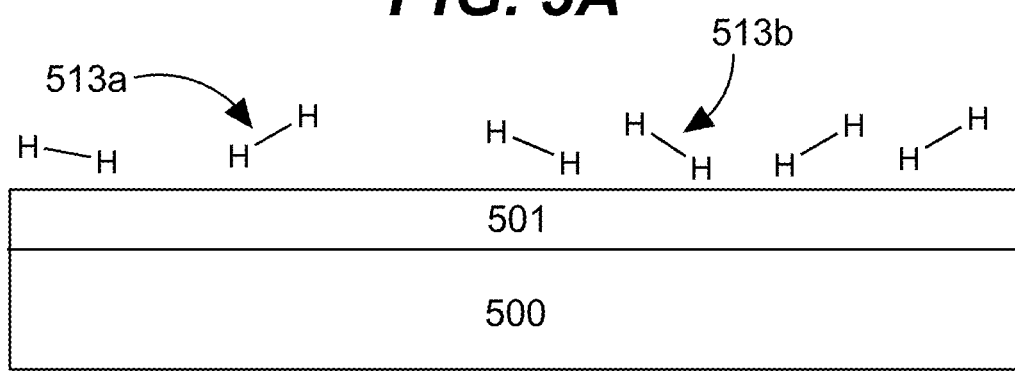

FIG. 5B shows an example illustration whereby $H_2$ previously in gas phase (511a and 511b in FIG. 5A) are purged from the chamber, and $H_2$ previously on the surface (513a and 513b) remain on the surface of the tungsten nucleation layer 501.

Figure 5C:
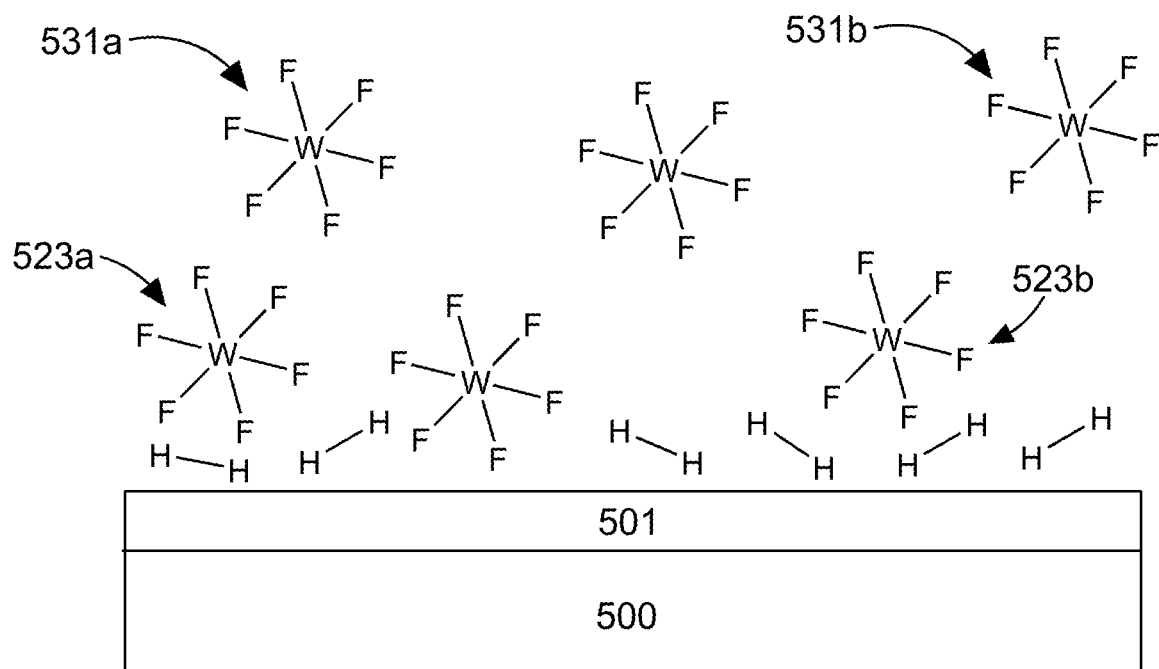

FIG. 5C shows an example schematic for operation 486 of FIG. 4B. In FIG. 5C, the substrate is exposed to $WF_6$, some of which is in gas phase (531a and 531b) and some of which is at or near the surface of the substrate (523a and 523b).

Figure 5D:
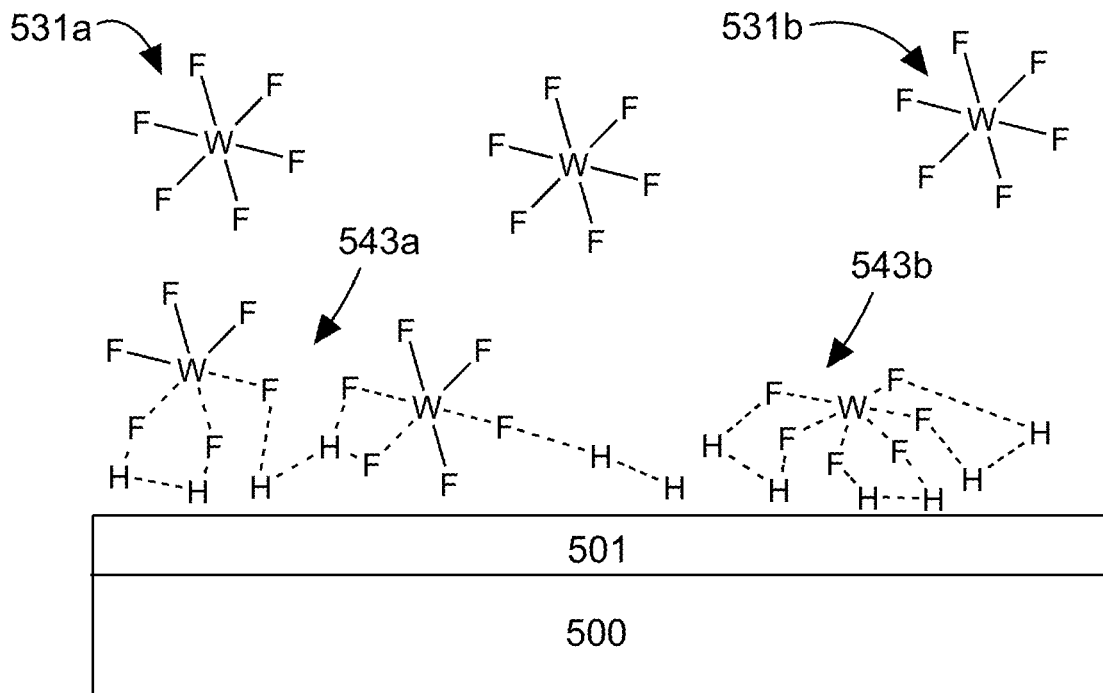
Figure 5E:
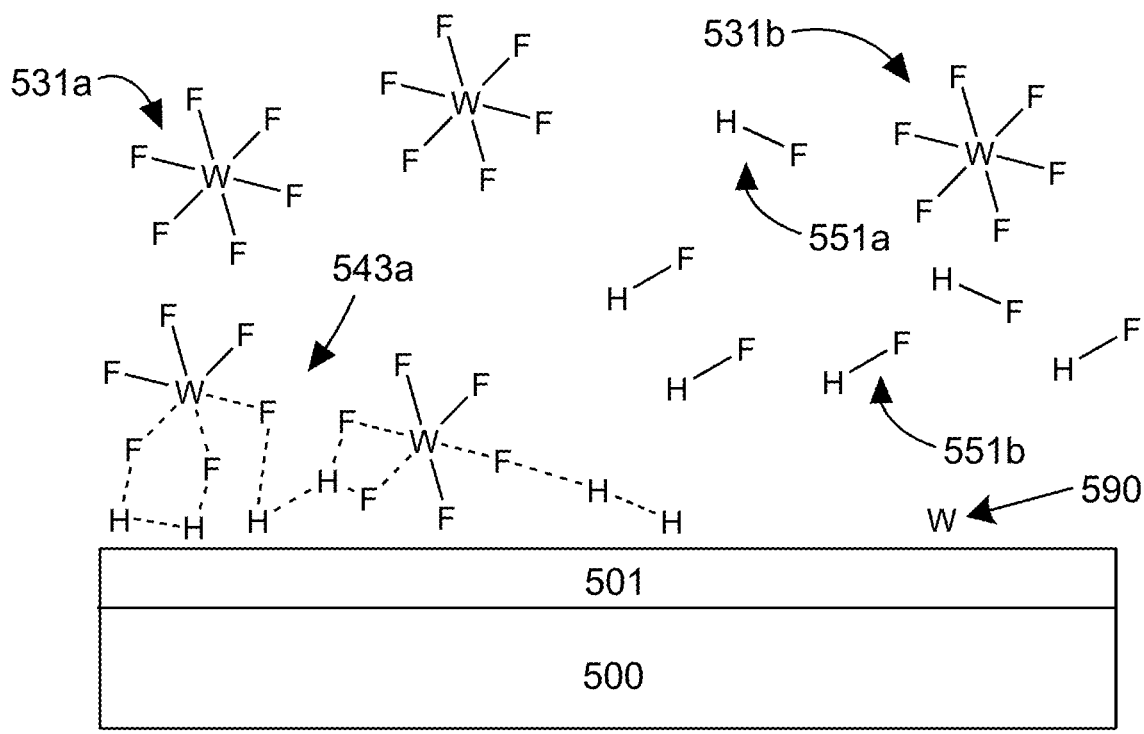

As described above with respect to operation 486 of FIG. 4B, and as shown in the example depicted in FIG. 5D, $WF_6$ may react with $H_2$ to temporarily form intermediate 543b, whereby in FIG. 5E, intermediate 543b fully reacts to leave tungsten 590 on the surface of the substrate 500 on the nucleation layer 501, and HF in gas phase (551a and 551b, for example).

As described above with respect to operation 486 of FIG. 4B, and as shown in FIG. 5D, $WF_6$ may partially react with $H_2$ to form intermediate 543a, whereby in FIG. 5E, intermediate 543a remains partially reacted on the surface of the substrate 500 on the nucleation layer 501. The reaction mechanism involving $WF_6$ and $H_2$ may be slower than a reaction between a borane or a silane or a germane with $WF_6$ for deposition of a tungsten nucleation layer due to activation energy barriers and steric effects. For example, without being bound by a particular theory, the stoichiometry of $WF_6$ may use at least three $H_2$ molecules to react with one molecule of $WF_6$. It is possible that $WF_6$ partially reacts with molecules of $H_2$ but rather than forming tungsten, an intermediate is formed. For example, this may occur if there is not enough Thin its vicinity to react with $WF_6$ based on stoichiometric principles (e.g., three $H_2$ molecules are used to react with one molecule of $WF_6$) thereby leaving an intermediate 543a on the surface of the substrate.

Figure 5F:
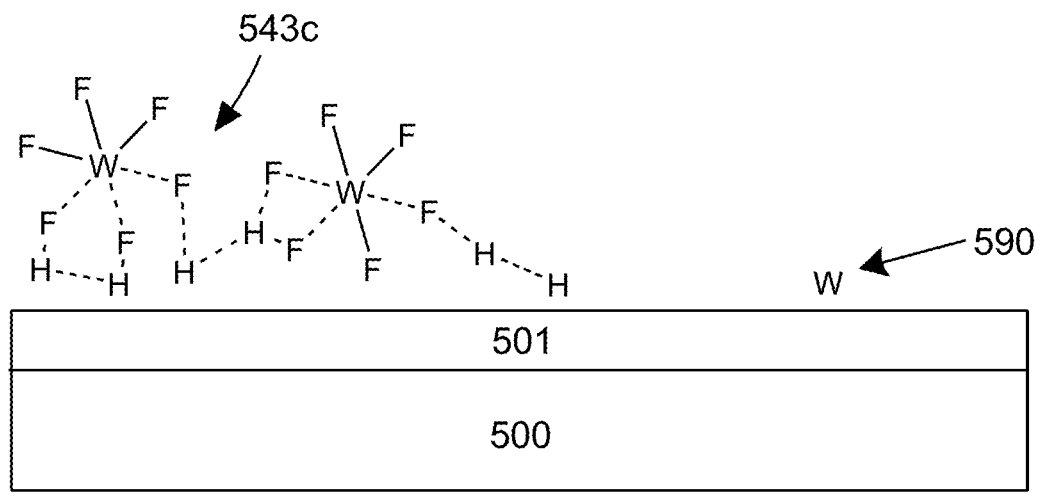

FIG. 5F provides an example schematic of the substrate when the chamber is purged. Note that compound 543c may be an intermediate formed but not completely reacted, while some tungsten 590 may be formed on the substrate. Each cycle thereby forms a sub-monolayer of tungsten on the substrate.

Figure 5G:
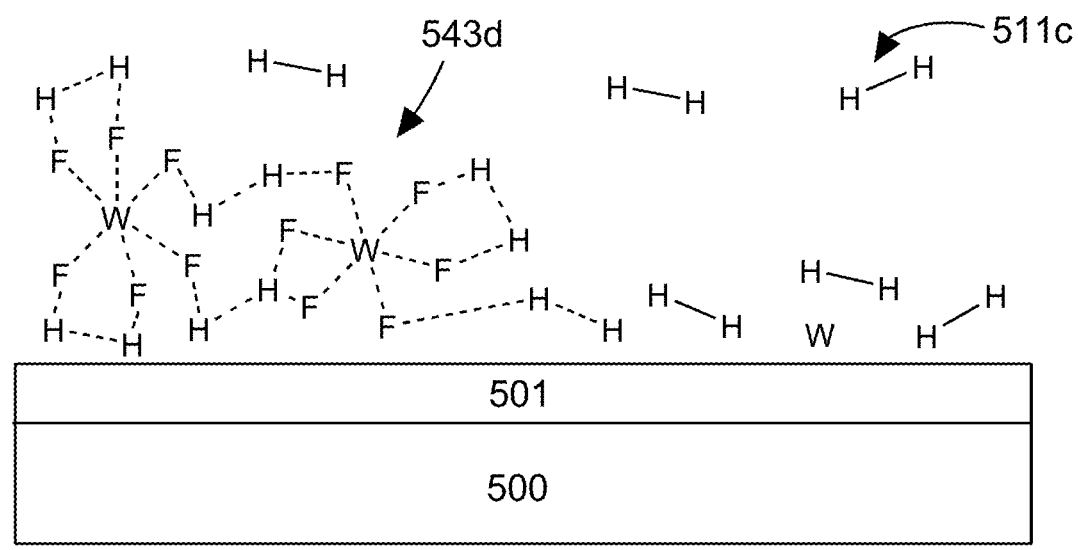
Figure 5H:
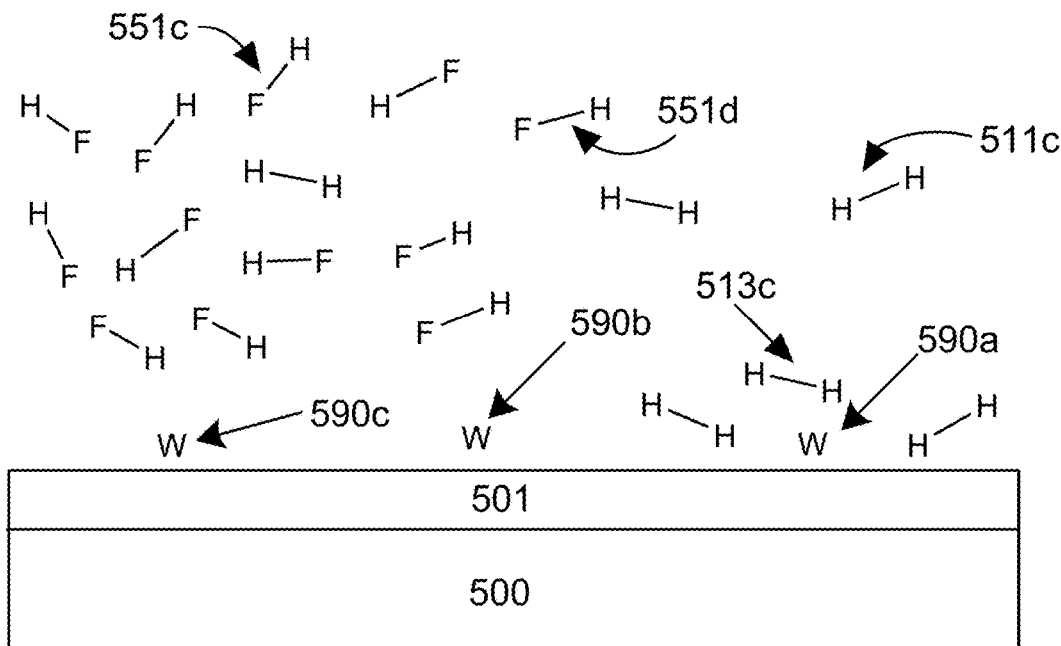
Figure 5I:
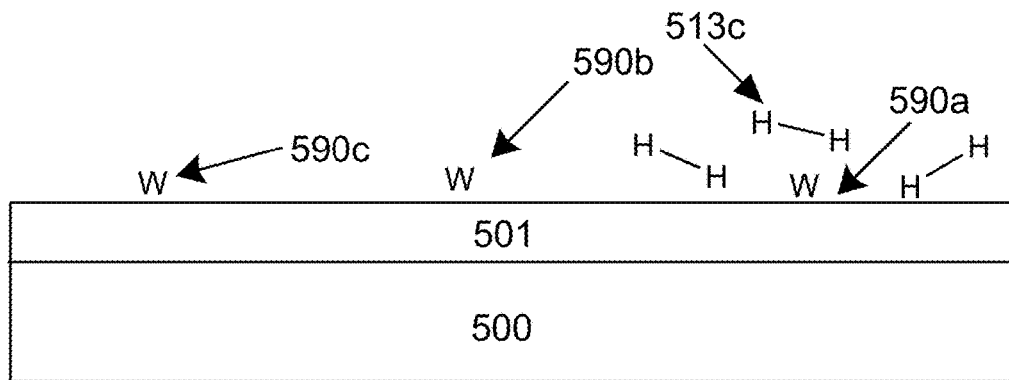
Figure 5J:
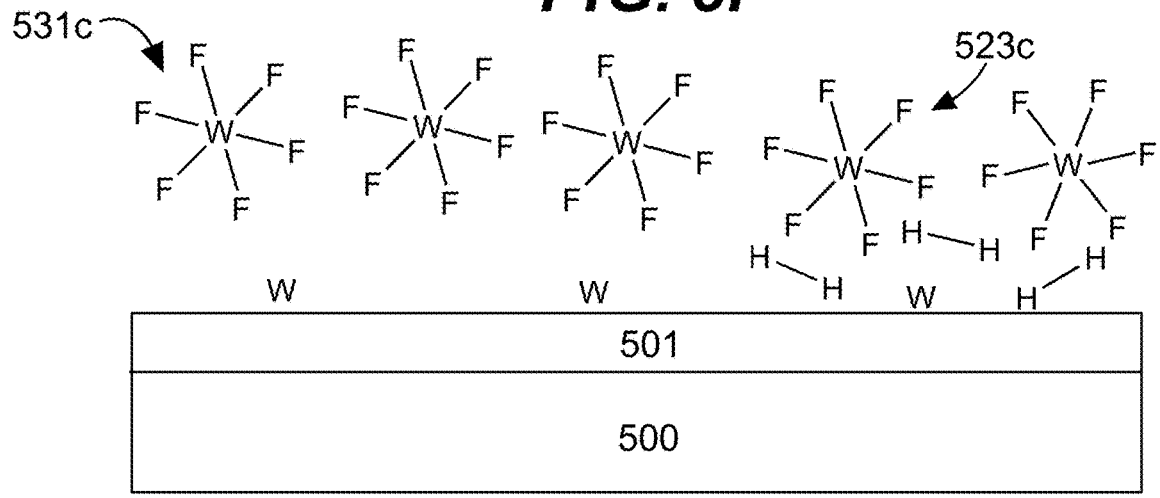

As an example, FIG. 5G shows operation 482 of FIG. 4B in the repeated cycle, whereby $H_2$ 511c in gas phase is introduced to the substrate with the deposited tungsten 590 and the partially reacted intermediate 543d thereon. Note that the $H_2$ introduced may now fully react with the intermediate 543d on the substrate such that, as shown in FIG. 5H, the reacted compound 543d leaves behind deposited tungsten 590b and 590c, and byproducts HF 551c and 551d are formed in gas phase. Some $H_2$ 511c may remain in gas phase, while some $H_2$ 513c may remain on the tungsten layer 590a. In FIG. 5I, the chamber is purged (thereby corresponding with operation 484 of FIG. 4B), leaving behind deposited tungsten 590a, 590b, and 590c, and some $H_2$ 513c. In FIG. 5J, $WF_6$ is again introduced in a dose such that molecules 531c and 523c may then adsorb and/or react with $H_2$ and the substrate. FIG. 5J may correspond to operation 486 of FIG. 4B. After the $WF_6$ dose, the chamber may again be purged and cycles may be repeated again until the desired thickness of tungsten is deposited.

Tungsten films deposited using disclosed embodiments have low fluorine concentrations, such as about two orders of magnitude less fluorine concentration than tungsten deposited by non-sequential CVD. Deposition conditions, such as temperature, pulse times, and other parameters, may vary depending on hardware or process modifications. Overall tensile stress of films may be less than about 1 GPa.

Figure 6:
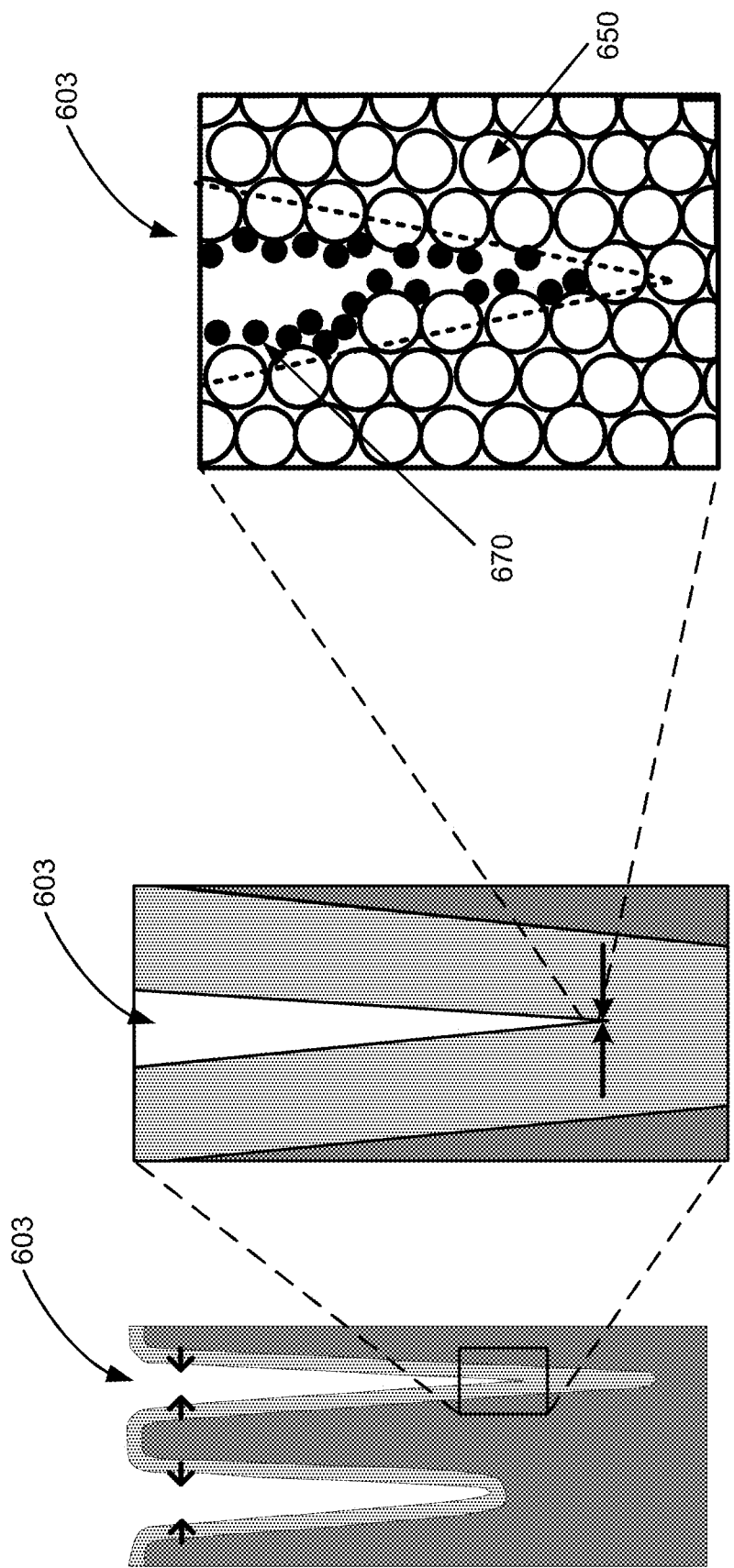

FIG. 6 shows an example of a substrate having a V-shaped feature 603 where nitrogen 670 on the surface of the deposited tungsten 650 along the sidewalls of the feature 603 prevents tungsten-tungsten bonding, thereby reducing line bending. Without being bound by a particular theory, it is believed that when additional tungsten is deposited, nitrogen desorbs and therefore little to no nitrogen is incorporated into the deposited tungsten film. Disclosed embodiments are suitable for depositing metal such as tungsten into multiple features, the features being spaced apart on a substrate where the pitch between adjacent features is between about 20 nm and about 40 nm.

FIGS. 7-11 provide example timing sequence diagrams for example cycles of performing certain disclosed embodiments for variations of continuous and pulsed nitrogen exposure in accordance with various embodiments.

Figure 7:
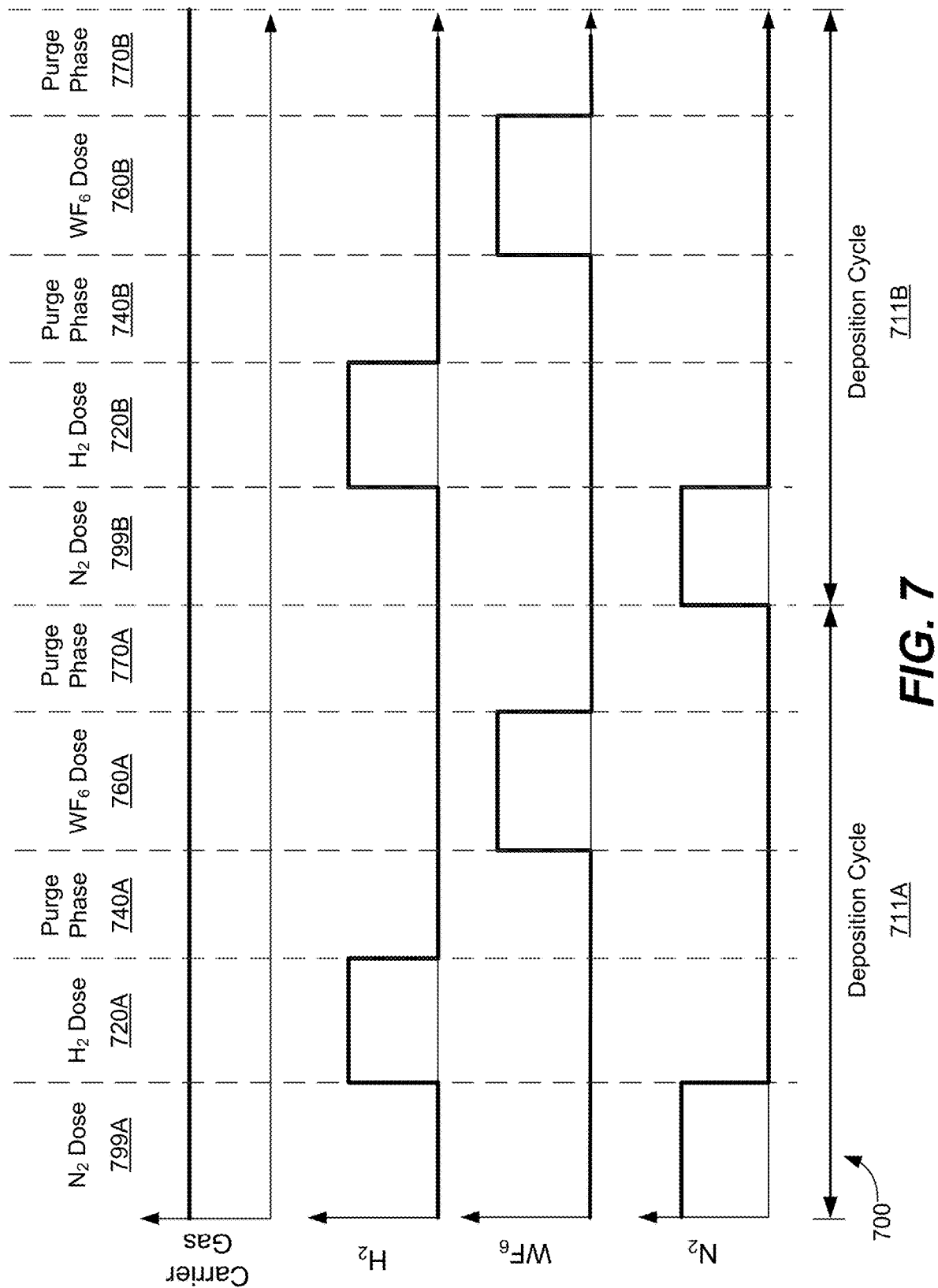
FIGS. 7-11 are timing sequence diagrams showing example cycles in various methods in accordance with certain disclosed embodiments.

FIG. 7 provides a timing sequence diagram depicting examples cycles of sequential CVD in a process 700 including periodic nitrogen exposure during each sequential CVD cycle. The phases depicted in the example in FIG. 7 includes various process parameters, such as carrier gas or purge gas flow, hydrogen flow, $WF_6$ flow (used as an example of a tungsten-containing precursor for depositing tungsten; other suitable metal-containing precursors may be used for depositing a suitable metal, such as ruthenium, or cobalt, or molybdenum), and nitrogen gas flow. The lines indicate when the flow is turned on and off. Note that in various embodiments, plasma is not ignited and is not depicted as a process parameter. Additional process parameters which are not depicted in FIG. 7 but may be modulated as necessary include substrate temperature and process chamber pressure.

Process 700 includes two deposition cycles 711A and 711B but it will be understood that more than two deposition cycles may be used in certain disclosed embodiments. Deposition cycle 711A includes five phases, including a nitrogen dose 799A, hydrogen dose 720A, purge phase 740A, WF$_6$ dose 760A, and purge phase 770A. Nitrogen dose 799A may correspond to operation 499 of FIG. 4B. During nitrogen dose 799A, the carrier gas flow may be turned on. Hydrogen gas flow and WF$_6$ gas flows are turned off and nitrogen flow is turned on. Hydrogen dose 720A may correspond to operation 482 of FIG. 4B. During hydrogen dose 799A, the carrier gas flow may be turned on. Hydrogen gas flow is turned on, while WF$_6$ gas flow and nitrogen gas flows are turned off. Purge phase 740A may correspond to operation 484 of FIG. 4B. During purge phase 740A, the carrier gas may continue to flow to act as a purge gas. In some embodiments, this involves allowing the carrier gas to flow into the chamber instead of diverting it as it may be diverted during a nitrogen, hydrogen, or WF$_6$ gas flow. During purge phase 740A, hydrogen, WF$_6$, and nitrogen gas flows are turned off. Tungsten hexafluoride dose 760A may correspond to operation 486 of FIG. 4B. Although WF$_6$ is depicted in FIG. 7, it will be understood that other tungsten-containing precursors may be used. Additionally, although tungsten is mentioned in combination with FIG. 7, it will be understood that other metal-containing precursors may be used to deposit other metal. For example, ruthenium-containing precursors may be used to deposit ruthenium, molybdenum-containing precursors may be used to deposit molybdenum, and cobalt-containing precursors may be used to deposit cobalt. During WF$_6$ dose 760A, the carrier gas may be flowed to introduce the WF$_6$ gas into the chamber, and WF$_6$ flow is also turned on. During this dose, hydrogen and nitrogen flows are turned off. Purge phase 770A may correspond to operation 488 of FIG. 4B. During purge phase 770A, carrier gas flow is turned on as the carrier gas acts as a purge gas, while hydrogen gas flow, WF$_6$ gas flow, and nitrogen gas flows are turned off.

It is determined as depicted in operation 490 of FIG. 4B that insufficient tungsten has been deposited, and the deposition cycle is repeated as depicted in deposition cycle 711B. Deposition cycle 711B includes nitrogen dose 799B, hydrogen dose 720B, purge phase 740B, WF$_6$ dose 760B, and purge phase 770B. During nitrogen dose 799B, nitrogen gas flow and carrier gas flow are turned on while hydrogen gas flow and WF$_6$ gas flow are turned off. During hydrogen dose 720B, carrier gas flow and hydrogen gas flows are turned on while WF$_6$ gas flow and nitrogen gas flows are turned off. During purge phase 740B, carrier gas flow remains on while hydrogen gas flow, WF$_6$ gas flow, and nitrogen gas flow are turned off. During WF$_6$ dose 760B, carrier gas flow and WF$_6$ gas flow are turned on while hydrogen gas and nitrogen gas flows are turned off. During purge phase 770B, carrier gas flow remains on while hydrogen gas, WF$_6$ gas, and nitrogen gas flows are turned off.

FIGS. 8-11 show example tungsten deposition cycle pulse sequences. Such cycles may be ALD or sequential CVD deposition cycles. Although four examples are depicted, these examples are not limiting. While N$_2$ is depicted in these examples, it will be understood that in some embodiments oxygen or ammonia may be used instead. Although WF$_6$ is depicted in FIGS. 8-11, it will be understood that other tungsten-containing precursors may be used. Additionally, although tungsten is mentioned in combination with FIGS. 8-11, it will be understood that other metal-containing precursors may be used to deposit other metal. For example, ruthenium-containing precursors may be used to deposit ruthenium, molybdenum-containing precursors may be used to deposit molybdenum, and cobalt-containing precursors may be used to deposit cobalt.

Figure 8:
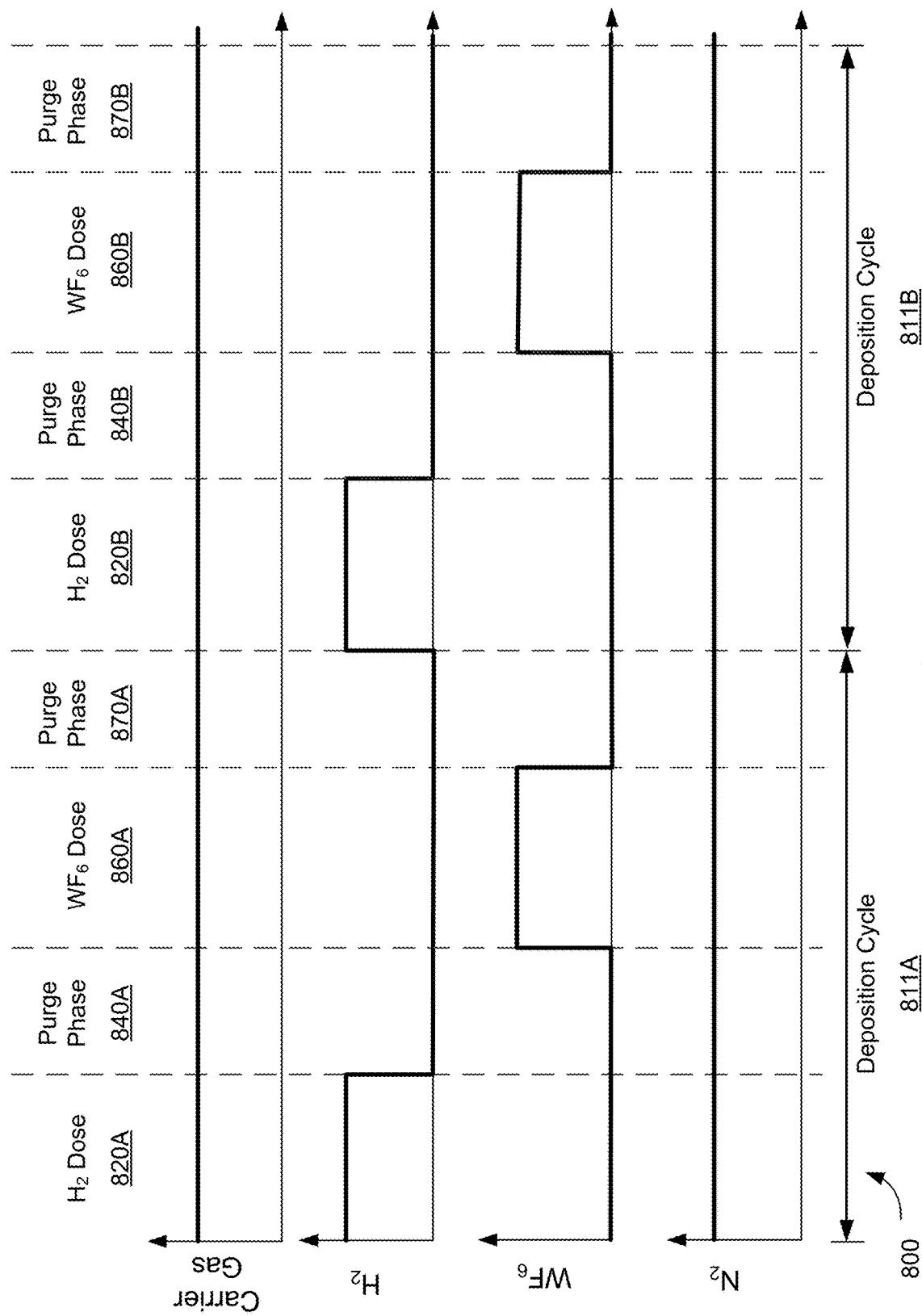

The sequence shown in FIG. 8 shows a process 800 where N$_2$ continuously flows during sequential CVD whereby a tungsten-containing precursor and reducing agent H$_2$ are pulsed alternately with purge or carrier gas such as argon flowed between pulses. FIG. 8 depicts a process 800 having two deposition cycles 811A and 811B. Deposition cycle 811A includes hydrogen dose 820A, purge phase 840A, WF$_6$ dose 860A, and purge phase 870A. Throughout the deposition cycles 811A and 811B, nitrogen is continuously flowed. During hydrogen dose 820A, carrier gas, hydrogen, and nitrogen gas flows are on while WF$_6$ gas flow is turned off. During purge phase 840A, carrier gas and nitrogen gas flows are on while H$_2$ and WF$_6$ gas flows are turned off. Given that the gas used to prevent tungsten-tungsten bonding in this example is flowed continuously and WF$_6$ is used as the example tungsten-containing precursor, it will be understood that NH$_3$ would not be used to flow continuously to reduce the tungsten-tungsten bonding to avoid a reaction between NH$_3$ and WF$_6$ that may result in undesirable by-products. During WF$_6$ dose 860A, carrier gas, WF$_6$ gas, and nitrogen gas flows are turned on while H$_2$ gas is turned off. During purge phase 870A, carrier gas and nitrogen gas flows are turned on while H$_2$ and WF$_6$ gas flows are turned off. The cycle is repeated in deposition cycle 811B, which includes hydrogen dose 820B, purge phase 840B, WF$_6$ dose 860B, and purge phase 870B. During hydrogen dose 820B, like hydrogen dose 820A, carrier gas, hydrogen, and nitrogen gas flows are on while WF$_6$ gas flow is turned off. During purge phase 840B, carrier gas and nitrogen gas flows are on while H$_2$ and WF$_6$ gas flows are turned off. During WF$_6$ dose 860B, carrier gas, WF$_6$, and nitrogen gas flows are on while H$_2$ gas flow is turned off. During purge phase 870B, carrier gas and nitrogen gas flows remain on while hydrogen and WF$_6$ gas flows are turned off.

Figure 9:
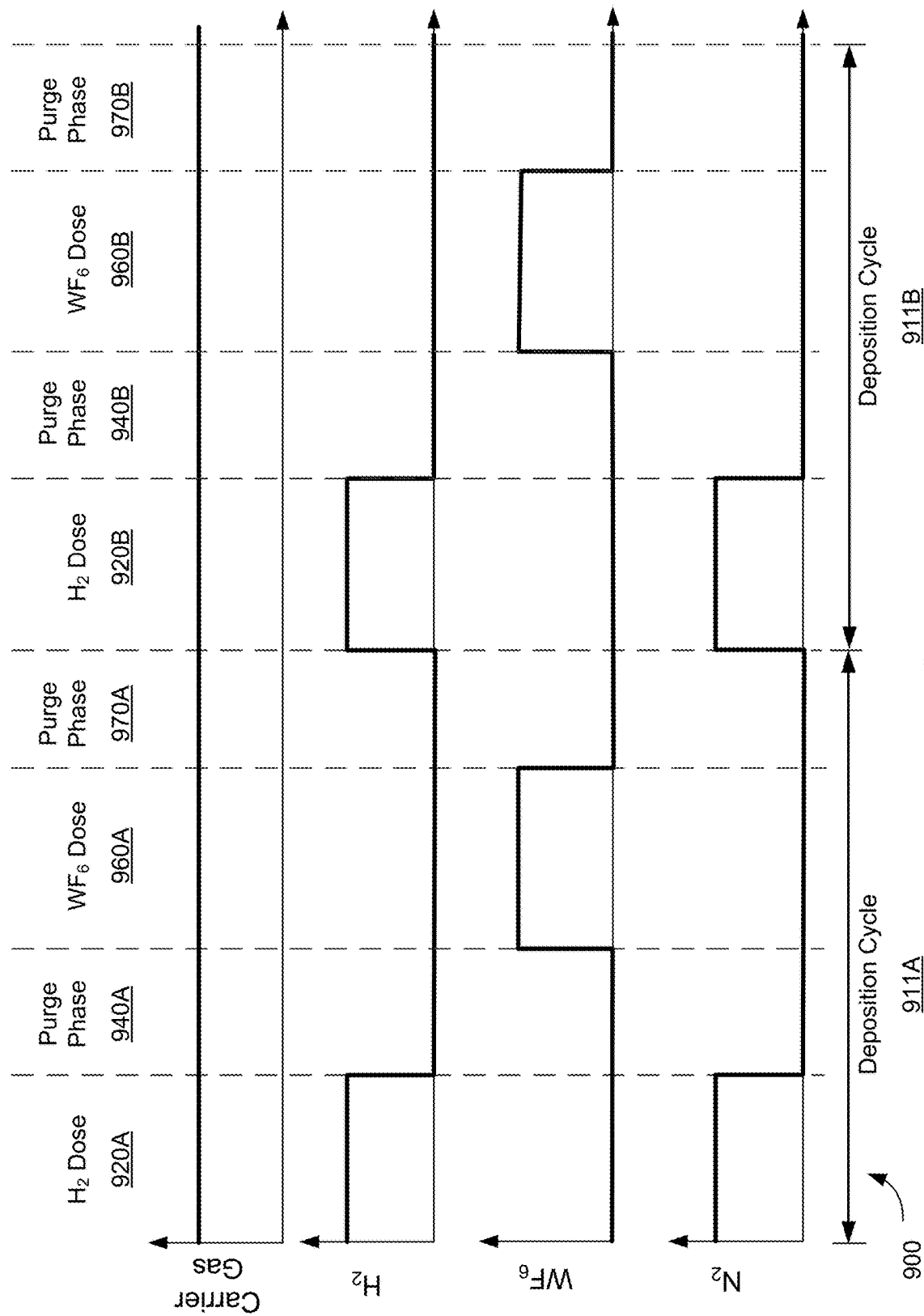

The sequence shown in FIG. 9 shows a process 900 where N$_2$ used during a reducing agent H$_2$ dose. FIG. 9 depicts a process 900 having two deposition cycles 911A and 911B. Deposition cycle 911A includes hydrogen dose 920A, purge phase 940A, WF$_6$ dose 960A, and purge phase 970A. During hydrogen dose 920A, carrier gas, hydrogen, and nitrogen gas flow are turned on while WF$_6$ gas flow is turned off. During purge phase 940A, carrier gas flow is turned on while H$_2$, WF$_6$, and nitrogen gas flows are turned off. During WF$_6$ dose 960A, carrier gas flow and WF$_6$ gas flows are turned on while hydrogen and nitrogen gas flows remain off. During purge phase 970A, carrier gas flow remains on while H$_2$, WF$_6$, and nitrogen gas flows are turned off. The cycle is repeated in deposition cycle 911B, which includes hydrogen dose 920B, purge phase 940B, WF$_6$ dose 960B, and purge phase 970B. During hydrogen dose 920B, carrier gas, hydrogen gas, and nitrogen gas flows are on while WF$_6$ gas flow is turned off. During purge phase 940B, carrier gas flow remains on while H$_2$, WF$_6$, and N$_2$ gas flows are turned off. During WF$_6$ dose 960B, carrier gas and WF$_6$ gas flows are on while H$_2$ and nitrogen gas flows are turned off. During purge phase 970B, carrier gas flow remains on while H$_2$, WF$_6$, and N$_2$ gas flows are turned off.

Figure 10:
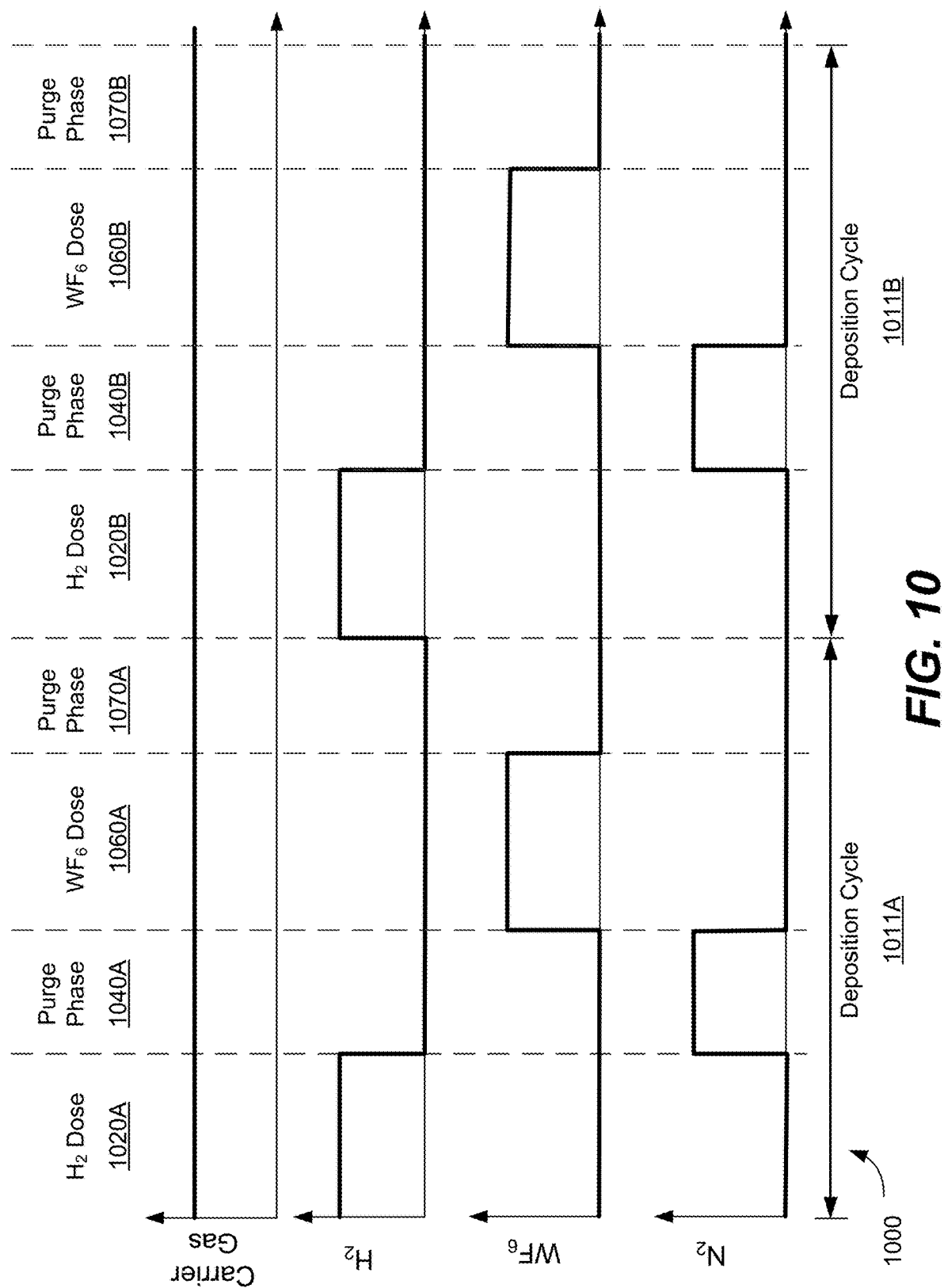

The sequence shown in FIG. 10 shows a process 1000 where N$_2$ used during argon pulses that are used after a reducing agent H$_2$ dose and prior to a tungsten-containing precursor dose. Deposition cycle 1011A includes hydrogen dose 1020A, purge phase 1040A, WF$_6$ dose 1060A, and purge phase 1070A. During hydrogen dose 1020A, carrier gas and hydrogen gas flows are on while WF$_6$ and nitrogen gas flows are off. During purge phase 1040A, carrier gas and nitrogen gas flows are turned on, while hydrogen and WF$_6$ gas flows are turned off. During WF$_6$ dose 1060A, carrier gas and WF$_6$ gas flows are turned on while hydrogen and nitrogen gas flows are turned off. During purge phase 1070A, carrier gas flow remains on while H$_2$, WF$_6$, and N$_2$ gas flows are turned off. The cycle is repeated in deposition cycle 1011B, which includes hydrogen dose 1020B, purge phase 1040B, WF$_6$ dose 1060B, and purge phase 1070B. During hydrogen dose 1020B, carrier gas and hydrogen gas flows are turned on while WF$_6$ and nitrogen gas flows remain off. During purge phase 1040B, carrier gas is flowed with nitrogen gas, and nitrogen gas and WF$_6$ gas flows are turned off. During WF$_6$ dose 1060B, carrier gas and WF$_6$ gas flows are on while hydrogen and nitrogen gas flows are turned off. During purge phase 1070B, carrier gas flow is on while H$_2$, WF$_6$, and N$_2$ gas flows are off.

Figure 11:
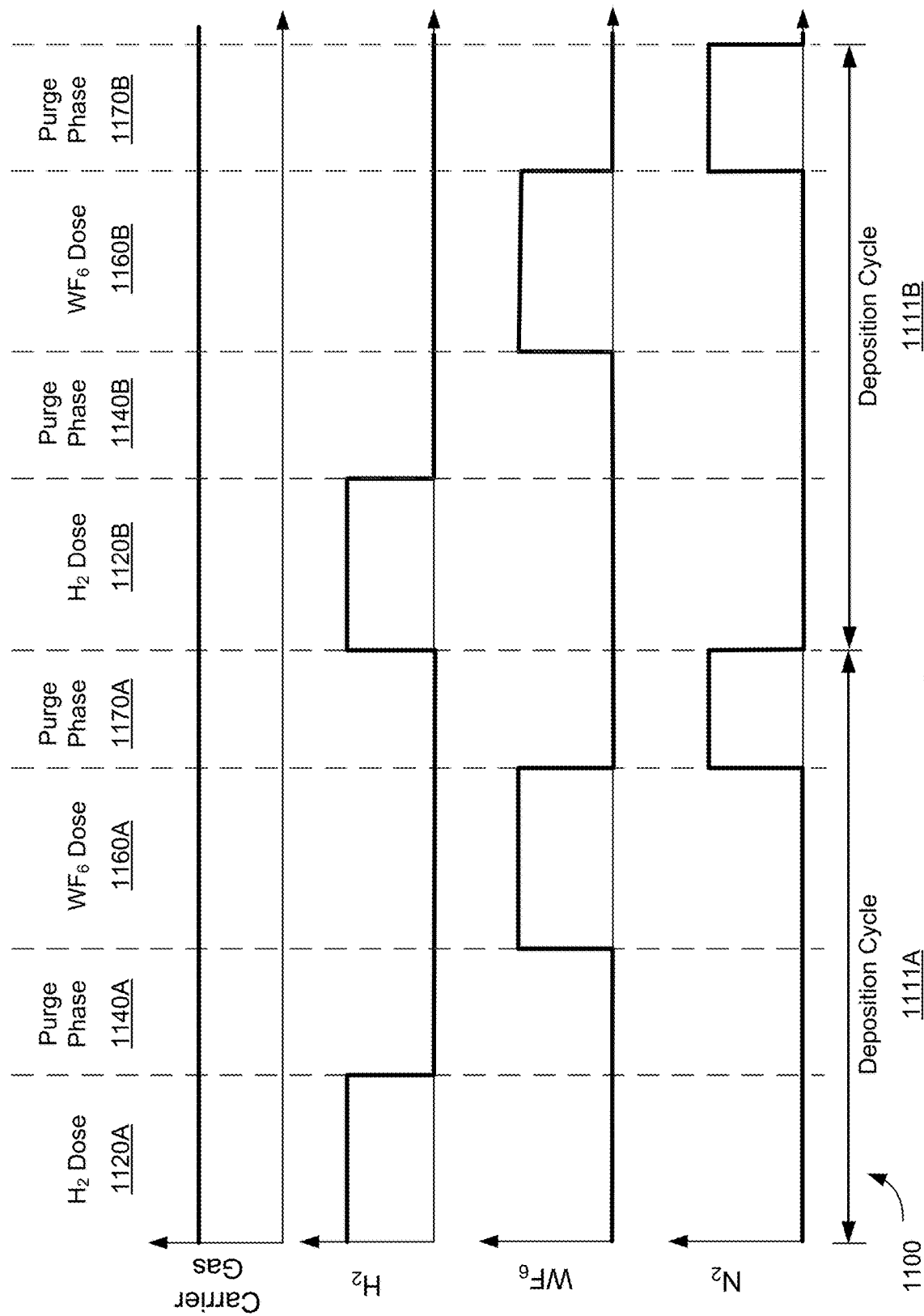

The sequence shown in FIG. 11 shows N$_2$ used during argon pulses that are used prior to a reducing agent H$_2$ dose and after a tungsten-containing precursor dose. Deposition cycle 1111A includes hydrogen dose 1120A, purge phase 1140A, WF$_6$ dose 1160A, and purge phase 1170A. During hydrogen dose 1120A, carrier gas and hydrogen gas flows are turned on while WF$_6$ and nitrogen gas flows are turned off. During purge phase 1140A, carrier gas flow is on while H$_2$, WF$_6$, and N$_2$ gas flows are turned off. During WF$_6$ dose 1160A, carrier gas and WF$_6$ gas flows are turned on while hydrogen and nitrogen gas flows are turned off. During purge phase 1170A, carrier gas and nitrogen gas flows are turned on while hydrogen and WF$_6$ gas flows are turned off. The cycle is repeated in deposition cycle 1111B, which includes hydrogen dose 1120B, purge phase 1140B, WF$_6$ dose 1160B, and purge phase 1170B. During hydrogen dose 1120B, carrier gas and hydrogen gas flows are turned on while WF$_6$ and nitrogen gas flows are turned off. During purge phase 1140B, carrier gas flow remains on while H$_2$, WF$_6$, and nitrogen gas flows are turned off. During WF$_6$ dose 1160B, carrier gas and WF$_6$ gas flows are on while hydrogen and nitrogen gas flows are off. During purge phase 1170B, carrier gas and nitrogen gas flows are turned on while hydrogen and WF$_6$ gas flows are turned off.

While WF$_6$ is depicted in these examples, it will be understood that other tungsten-containing precursors may be used such as WCl$_6$, and/or WCl$_5$. Additionally, for depositing other metals such as ruthenium, molybdenum, or cobalt, a suitable ruthenium-containing precursor, molybdenum-containing precursor, or cobalt-containing precursor may be used, respectively.

Disclosed embodiments may have various applications in tungsten deposition processes. For example, in some embodiments, a feature may be filled by depositing a tungsten nucleation layer by ALD cycles of alternating pulses of a reducing agent (e.g., a borane, a silane, or a germane) and WF$_6$ with periodic exposure to nitrogen, followed by bulk tungsten deposition by sequential CVD with periodic exposure to nitrogen as described above with respect to FIG. 4B.

In another example, in some embodiments, a tungsten nucleation layer may be deposited using ALD cycles of a reducing agent and WF$_6$, followed by bulk tungsten deposition using a combination of CVD of fluorine-free tungsten using a reducing agent and a fluorine-free tungsten-containing precursor (e.g., a metal-organic tungsten precursor), and sequential CVD as described above with respect to FIG. 4B where the substrate is periodically exposed to nitrogen to prevent line bending. Fluorine-free tungsten precursors may also include tungsten carbonyl (W(CO)$_6$), and tungsten chlorides (WCl$_x$) such as tungsten pentachloride (WCl$_5$) and tungsten hexachloride (WCl$_6$).

In another example, a tungsten nucleation layer may be deposited on a feature by ALD cycles of alternating pulses of a reducing agent and WF$_6$, and tungsten bulk may be deposited by alternating between sequential CVD as described above with respect to FIG. 4B and non-sequential CVD where the substrate is periodically exposed to nitrogen to prevent line bending. For example, bulk tungsten may be deposited using a number of cycles of sequential CVD between pre-determined durations of non-sequential CVD. In a specific example, bulk tungsten may be deposited using about 5 cycles of sequential CVD, followed by 5 seconds of non-sequential CVD, followed by 5 cycles of sequential CVD, and another 5 seconds of non-sequential CVD.

In another example, a feature may be filled by first depositing a tungsten nucleation layer by ALD cycles of alternating pulses of a reducing agent and WF$_6$, then partially filling the feature using sequential CVD, and filling the rest of the feature by non-sequential CVD where the substrate is periodically exposed to nitrogen to prevent line bending.

In another example, a feature may be filled by depositing a tungsten nucleation layer by ALD cycles of alternating pulses of a reducing agent and WF$_6$, followed by partial deposition of bulk tungsten by sequential CVD, and complete bulk fill by CVD of fluorine-free tungsten (such as using a metal-organic tungsten precursor) where the substrate is periodically exposed to nitrogen to prevent line bending. For example, a number of cycles of sequential CVD may be performed to partially fill a feature with bulk tungsten, followed by CVD using simultaneous exposure to MDNOW and H$_2$ to fill the rest of the feature. Note in some embodiments, a feature may be filled without depositing a nucleation layer, but a nucleation layer may help reduce growth delay of bulk tungsten.

It will be understood that various combinations of the applications described herein may be used to deposit tungsten and methods are not limited to the examples provided herein where the substrate is periodically exposed to nitrogen to prevent line bending. For example, chlorine-containing tungsten precursors (WCl$_x$) such as tungsten pentachloride (WCl$_5$) and tungsten hexachloride (WCl$_6$) may be used instead of or in combination with WF$_6$ in embodiments described herein.

In various embodiments, a soak or surface treatment operation may be performed prior to depositing a nucleation layer. Example soak or surface treatments include exposing the substrate to silane (SiH$_4$), disilane (Si$_2$H$_6$), trisilane (Si$_3$H$_8$), germane (GeH$_4$), argon (Ar), tungsten hexafluoride (WF$_6$), diborane (B$_2$H$_6$), hydrogen (H$_2$), nitrogen (N$_2$) gas, or combinations thereof. In some embodiments, the substrate may be soaked using one or more gases. For example, in some embodiments, the substrate may be exposed to silane for a first duration, and then exposed to diborane for a second duration. Such operations may also be repeated in cycles. In another example, the substrate may be exposed to diborane for a first duration, and then exposed to silane for a second duration. In another example, the substrate may be exposed to diborane for a first duration, and then exposed to hydrogen for a second duration. In another example, the substrate may be exposed to silane for a first duration, and then exposed to hydrogen for a second duration. In some embodiments, the substrate may be exposed to nitrogen gas in combination with any of the above described soaking processes. In any of the disclosed embodiments, a chamber housing the substrate may be purged between one or more soak operations. Purging may be performed by flowing an inert gas such as argon into the chamber. For example, in one example, the substrate may be exposed to diborane for a first duration, the chamber may then be purged, and then the substrate may be exposed to silane for a second duration.

Nucleation layers deposited in accordance with certain disclosed embodiments prior to deposition of a bulk tungsten layer may be deposited by alternating between a tungsten-containing precursor and a reducing agent, such as silane ($SiH_4$), disilane ($Si_2H_6$), trisilane ($Si_3H_8$), germane ($GeH_4$), or diborane ($B_2H_6$). In some embodiments, the nucleation layer is deposited by exposing the substrate to alternating pulses of a tungsten-containing precursor and silane. In some embodiments, the nucleation layer is deposited by exposing the substrate to alternating pulses of a tungsten-containing precursor and diborane. In some embodiments, the nucleation layer is deposited by exposing the substrate to alternating pulses of a tungsten-containing precursor and silane, then exposing the substrate to alternating pulses of a tungsten-containing precursor and diborane. In some embodiments, the nucleation layer is deposited by exposing the substrate to alternating pulses of a tungsten-containing precursor and diborane, then exposing the substrate to alternating pulses of a tungsten-containing precursor and silane. In some embodiments, the nucleation layer is deposited by exposing the substrate to alternating pulses of a tungsten-containing precursor and silane, then exposing the substrate to alternating pulses of a tungsten-containing precursor and diborane, then exposing the substrate to alternating pulses of a tungsten-containing precursor and silane. In some embodiments, the nucleation layer is deposited by exposing the substrate to alternating pulses of a tungsten-containing precursor and diborane, then exposing the substrate to alternating pulses of a tungsten-containing precursor and silane, then exposing the substrate to alternating pulses of a tungsten-containing precursor and diborane. In any of the disclosed embodiments, a chamber housing the substrate may be purged between one or more dose operations for depositing a nucleation layer. Purging may be performed by flowing an inert gas such as argon into the chamber. Any suitable inert gas may be used for purging. For example, in some embodiments, a substrate may be exposed to a pulse of tungsten-containing precursor, then the chamber may be purged, then the substrate may be exposed to a pulse of silane, and the chamber may be purged again, and such operations may be repeated in cycles.

Nucleation layer deposition that may be used in any of the above described implementations may include co-flowing any one of hydrogen ($H_2$), argon (Ar), nitrogen ($N_2$), or combinations thereof during the entire nucleation deposition process, or during a silane dose, or during a diborane dose, or during a tungsten-containing precursor dose such as $WF_6$ dose, or during any purge times. In some embodiments, a surface treatment operation may be performed during or after nucleation growth by exposing the substrate to any of silane, disilane, trisilane, germane, diborane, hydrogen, tungsten hexafluoride, nitrogen, argon, and combinations thereof. For example, during deposition of a nucleation layer, the substrate may be exposed to alternating pulses of silane and $WF_6$, then the substrate may be exposed to a silane soak, then the substrate may resume being exposed to alternating pulses of silane and $WF_6$. Such operations may be performed in cycles. For example, in some embodiments, the following cycle may be repeated one or more times to deposit a nucleation layer: alternating pulses of $SiH_4$ and $WF_6$ and exposure to a surface treatment.

In some embodiments, the nucleation layer may be deposited by exposing the substrate to any combination of the tungsten-containing precursor and any one or more of the following gases in any sequence and order, in one or more cycles: diborane, silane, disilane, trisilane, hydrogen, nitrogen, and germane ($GeH_4$). For example, in some embodiments, a nucleation layer may be deposited by exposing the substrate to diborane, exposing the substrate to tungsten hexafluoride, exposing the substrate to silane, and exposing the substrate to hydrogen. Such operations may be repeated in one or more cycles. In another example, in some embodiments, a nucleation layer may be deposited by exposing the substrate to silane, exposing the substrate to tungsten hexafluoride, and exposing the substrate to hydrogen. Such operations may be repeated in one or more cycles. In another example, in some embodiments, a nucleation layer may be deposited by exposing the substrate to diborane, exposing the substrate to hydrogen, and exposing the substrate to tungsten hexafluoride. Such operations may be repeated in one or more cycles. In another example, in some embodiments, a nucleation layer may be deposited by exposing the substrate to nitrogen, exposing the substrate to diborane, and exposing the substrate to tungsten hexafluoride. Such operations may be repeated in one or more cycles. In another example, in some embodiments, a nucleation layer may be deposited by exposing the substrate to silane, exposing the substrate to nitrogen, and exposing the substrate to tungsten hexafluoride. Such operations may be repeated in one or more cycles. In any of the described embodiments, the substrate may be exposed to surface treatment and/or soaking operations before, during, or after deposition of the nucleation cycle using any available gas. In some embodiments, additional gases may be co-flowed with any of the above described gases during one or more exposures of the nucleation deposition process. In any of the disclosed embodiments, a chamber housing the substrate may be purged between one or more dose operations for depositing a nucleation layer. Purging may be performed by flowing an inert gas such as argon into the chamber. Any suitable inert gas may be used for purging. It will be understood that in some embodiments, the substrate may be periodically exposed to nitrogen during deposition of a tungsten nucleation layer.

Bulk tungsten deposition may be deposited using any of the disclosed embodiments described herein and in U.S. patent application Ser. No. 14/723,275 filed on May 27, 2015, which is herein incorporated by reference in its entirety. In any of the above described implementations, bulk tungsten may also be deposited periodically, with re-nucleation and/or soak and/or surface treatment and/or conventional CVD deposition operations performed between bulk depositions. For example, in some embodiments, bulk tungsten may be deposited using disclosed embodiments as described above with respect to FIG. 4B, then bulk tungsten deposition may be paused, then the substrate may be exposed to alternating pulses of silane and $WF_6$, or diborane and $WF_6$ to re-nucleate the surface of the substrate, then the bulk tungsten deposition may be resumed using disclosed embodiments as described above with respect to FIG. 4B. Such operations may be repeated in any number of cycles. In another example, in some embodiments, bulk tungsten may be deposited using disclosed embodiments as described above with respect to FIG. 4B, then bulk tungsten deposition may be paused, then the substrate may be exposed to a soak or surface treatment by flowing any of silane, disilane, trisilane, germane, diborane, hydrogen, tungsten hexafluoride, nitrogen, argon, and combinations thereof, to treat the surface of the substrate, then the bulk tungsten deposition may be resumed using disclosed embodiments as described above with respect to FIG.

4B. Bulk tungsten deposition may be performed by exposing the substrate to a tungsten-containing precursor such as $WF_6$ and any one or more of the following gases: hydrogen, silane, disilane, trisilane, diborane, nitrogen, argon, and germane. Bulk tungsten may also be deposited using a combination of sequential CVD and conventional CVD as described above. Conventional CVD may be performed before, during (such as by cycling between sequential and conventional CVD), or after depositing bulk tungsten using sequential CVD. It will be understood that in some embodiments, the substrate may be periodically exposed to nitrogen during deposition of a tungsten bulk layer.

In some embodiments, the substrate may be annealed at any suitable temperature before depositing bulk tungsten and after depositing the nucleation layer. In some embodiments, the substrate may be annealed at any suitable temperature after depositing the bulk tungsten layer. In some embodiments, the substrate may be annealed at any suitable temperature during intermediate times during deposition of the bulk tungsten. Annealing may be performed in any suitable gas environment, such as an environment including one or more of the following gases: tungsten-containing gas such as $WF_6$, hydrogen, silane, disilane, trisilane, diborane, nitrogen, argon, and germane.

In various embodiments, the chamber housing the substrate may be pumped or purged before or after doses of the tungsten-containing precursor and reducing agent for depositing bulk tungsten in accordance with disclosed embodiments as described above with respect to FIG. 4B. In some embodiments, delay time may be incorporated into a dose or purge step of sequential CVD deposition as described herein. In some embodiments, one or more gases may be co-flowed during a dose or purge operation using one or more of any of the following gases: $WF_6$, hydrogen, silane, disilane, trisilane, diborane, nitrogen, argon, and germane.

The temperature of the substrate during nucleation deposition may not be the same as the temperature of the substrate during sequential CVD as described above with respect to FIG. 4B. The temperature of the substrate will be understood to mean the temperature at which the pedestal holding the substrate is set. Disclosed embodiments may be performed at any suitable pressure, such as pressures greater than about 10 Torr, or pressures less than about 10 Torr. For a multi-station chamber, each pedestal may be set at different temperatures. In some embodiments, each pedestal is set at the same temperature. Substrates may be cycled from station to station during any or all of any of the above described operations in accordance with disclosed embodiments. Chamber pressure may also be modulated in one or more operations of certain disclosed embodiments. In some embodiments, chamber pressure during nucleation deposition is different from chamber pressure during bulk deposition. In some embodiments, chamber pressure during nucleation deposition is the same as the chamber pressure during bulk deposition.

During any of the above described exposures, the gases may be pulsed or flowed continuously. For example, in some embodiments, during a $WF_6$ dose of a sequential CVD operation, $WF_6$ may be pulsed one or more times during a single dose. Likewise, in some embodiments, during a purge, an inert gas may be pulsed during one or more times during a single purge operation. Such pulsing operations may be performed during any operation of nucleation deposition or any operation of bulk deposition or any combination thereof. In some embodiments, one or more changes to one or more parameters such as pressure, flow rate, and temperature, may be used. In some embodiments, the pedestal may be moved during any operation of the nucleation deposition or bulk deposition or both such that the gap between the substrate and a showerhead over the pedestal may be modulated. Moving the pedestal may be used in combination with altering one or more parameters such as pressure, temperature, or flow rate. Modulating the gap between the substrate and the showerhead can affect the pressure, temperature, or flow rate that may be used in accordance with certain disclosed embodiments. It will be understood that any of the processes described herein may be applicable to techniques involving ALD.

Apparatus

Any suitable chamber may be used to implement the disclosed embodiments. Example deposition apparatuses include various systems, e.g., ALTUS® and ALTUS® Max, available from Lam Research Corp., of Fremont, California, or any of a variety of other commercially available processing systems. In some embodiments, sequential chemical vapor deposition (CVD) may be performed at a first station that is one of two, five, or even more deposition stations positioned within a single deposition chamber. Thus, for example, hydrogen ($H_2$) and tungsten hexafluoride ($WF_6$) may be alternately introduced to the surface of the semiconductor substrate, at the first station, using an individual gas supply system that creates a localized atmosphere at the substrate surface. Another station may be used for fluorine-free tungsten deposition, or non-sequential CVD. Another station may be used to deposit the tungsten nucleation layer at low pressure. Another station may be used for periodic nitrogen exposure. In some embodiments, periodic nitrogen exposure is performed in the same station as deposition. Two or more stations may be used to deposit tungsten in a parallel processing. Alternatively a wafer may be indexed to have deposition operations performed over two or more stations sequentially.

Figure 12:
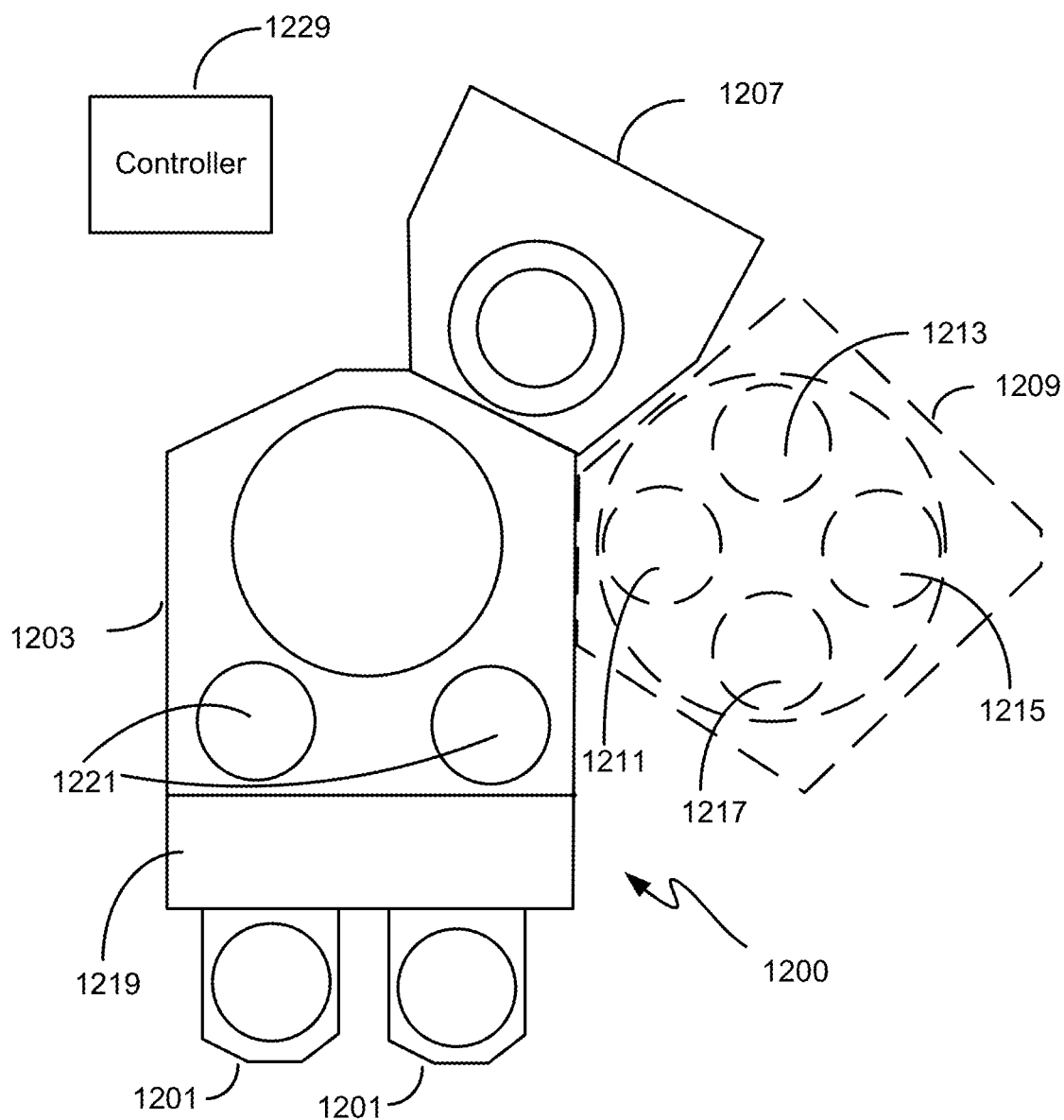
FIG. 12 is a schematic diagram of an example process tool for performing disclosed embodiments.
Figure 13:
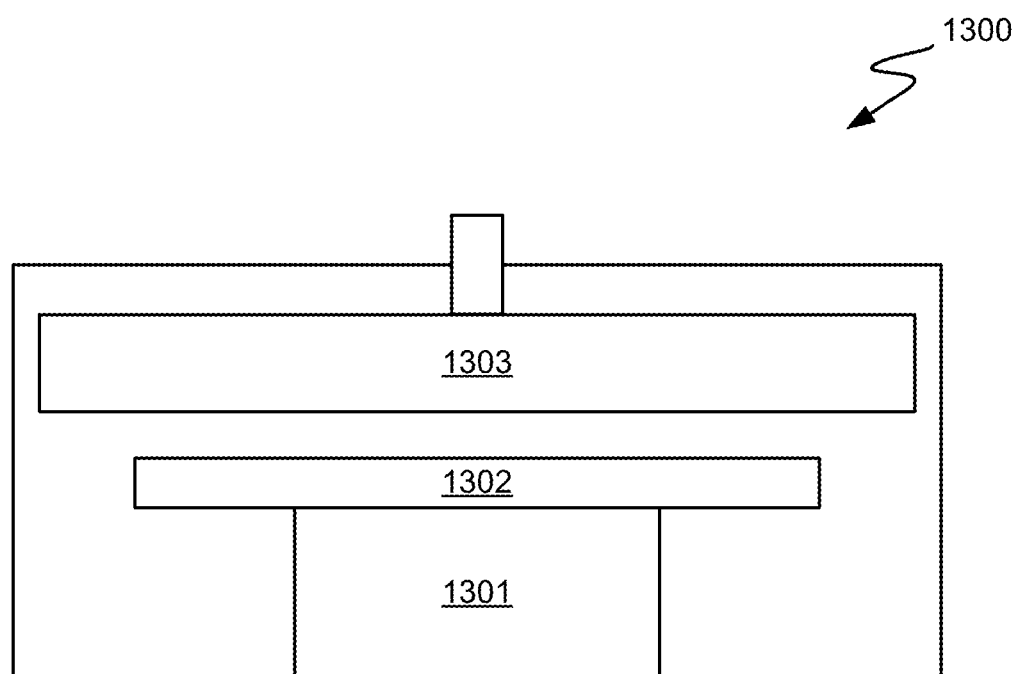
FIG. 13 is a schematic diagram of an example station for performing disclosed embodiments.

FIG. 12 is a block diagram of a processing system suitable for conducting tungsten thin film deposition processes in accordance with embodiments. The system 1200 includes a transfer module 1203. The transfer module 1203 provides a clean, pressurized environment to minimize risk of contamination of substrates being processed as they are moved between various reactor modules. Mounted on the transfer module 1203 is a multi-station reactor 1209 capable of performing atomic layer deposition (ALD), and sequential CVD with nitrogen or inhibition gas exposure according to embodiments. Multi-station reactor 1209 may also be used to perform fluorine-free tungsten deposition and/or non-sequential CVD in some embodiments. Reactor 1209 may include multiple stations 1211, 1213, 1215, and 1217 that may sequentially perform operations in accordance with disclosed embodiments. For example, reactor 1209 could be configured such that station 1211 performs nucleation layer deposition by ALD, station 1213 performs sequential CVD, station 1215 performs fluorine-free tungsten deposition, and station 1217 performs non-sequential CVD. Stations may be configured to expose the wafer to periodic pulses or continuous flow of nitrogen, oxygen, or ammonia gas to prevent line bending on the substrate. Stations may include a heated pedestal or substrate support, one or more gas inlets or showerhead or dispersion plate. An example of a deposition station 1300 is depicted in FIG. 13, including substrate support 1302 and showerhead 1303. A heater may be provided in pedestal portion 1301.

Also mounted on the transfer module 1203 may be one or more single or multi-station modules 1207 capable of performing plasma or chemical (non-plasma) pre-cleans. The module may also be used for various treatments to, for example, prepare a substrate for a deposition process. The system 1200 also includes one or more wafer source modules 1201, where wafers are stored before and after processing. An atmospheric robot (not shown) in the atmospheric transfer chamber 1219 may first remove wafers from the source modules 1201 to loadlocks 1221. A wafer transfer device (generally a robot arm unit) in the transfer module 1203 moves the wafers from loadlocks 1221 to and among the modules mounted on the transfer module 1203.

In various embodiments, a system controller 1229 is employed to control process conditions during deposition. The controller 1229 will typically include one or more memory devices and one or more processors. A processor may include a CPU or computer, analog and/or digital input/output connections, stepper motor controller boards, etc.

The controller 1229 may control all of the activities of the deposition apparatus. The system controller 1229 executes system control software, including sets of instructions for controlling the timing, mixture of gases, chamber pressure, chamber temperature, wafer temperature, radio frequency (RF) power levels, wafer chuck or pedestal position, and other parameters of a particular process. Other computer programs stored on memory devices associated with the controller 1229 may be employed in some embodiments.

Typically there will be a user interface associated with the controller 1229. The user interface may include a display screen, graphical software displays of the apparatus and/or process conditions, and user input devices such as pointing devices, keyboards, touch screens, microphones, etc.

System control logic may be configured in any suitable way. In general, the logic can be designed or configured in hardware and/or software. The instructions for controlling the drive circuitry may be hard coded or provided as software. The instructions may be provided by "programming." Such programming is understood to include logic of any form, including hard coded logic in digital signal processors, application-specific integrated circuits, and other devices which have specific algorithms implemented as hardware. Programming is also understood to include software or firmware instructions that may be executed on a general purpose processor. System control software may be coded in any suitable computer readable programming language.

The computer program code for controlling the germanium-containing reducing agent pulses, hydrogen flow, and tungsten-containing precursor pulses, and other processes in a process sequence can be written in any conventional computer readable programming language: for example, assembly language, C, C++, Pascal, Fortran, or others. Compiled object code or script is executed by the processor to perform the tasks identified in the program. Also as indicated, the program code may be hard coded.

The controller parameters relate to process conditions, such as, for example, process gas composition and flow rates, temperature, pressure, cooling gas pressure, substrate temperature, and chamber wall temperature. These parameters are provided to the user in the form of a recipe, and may be entered utilizing the user interface.

Signals for monitoring the process may be provided by analog and/or digital input connections of the system controller 1229. The signals for controlling the process are output on the analog and digital output connections of the deposition apparatus 1200.

The system software may be designed or configured in many different ways. For example, various chamber component subroutines or control objects may be written to control operation of the chamber components necessary to carry out the deposition processes in accordance with the disclosed embodiments. Examples of programs or sections of programs for this purpose include substrate positioning code, process gas control code, pressure control code, and heater control code.

In some implementations, a controller 1229 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 1229, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings in some systems, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 1229, in some implementations, may be a part of or coupled to a computer that is integrated with, coupled to the system, otherwise networked to the system, or a combination thereof. For example, the controller 1229 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a CVD chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The controller 1229 may include various programs. A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition, flow rates, pulse times, and optionally for flowing gas into the chamber prior to deposition in order to stabilize the pressure in the chamber. A pressure control program may include code for controlling the pressure in the chamber by regulating, e.g., a throttle valve in the exhaust system of the chamber. A heater control program may include code for controlling the current to a heating unit that is used to heat the substrate. Alternatively, the heater control program may control delivery of a heat transfer gas such as helium to the wafer chuck.

Examples of chamber sensors that may be monitored during deposition include mass flow controllers, pressure sensors such as manometers, and thermocouples located in the pedestal or chuck. Appropriately programmed feedback and control algorithms may be used with data from these sensors to maintain desired process conditions.

The foregoing describes implementation of disclosed embodiments in a single or multi-chamber semiconductor processing tool. The apparatus and process described herein may be used in conjunction with lithographic patterning tools or processes, for example, for the fabrication or manufacture of semiconductor devices, displays, LEDs, photovoltaic panels, and the like. Typically, though not necessarily, such tools/processes will be used or conducted together in a common fabrication facility. Lithographic patterning of a film typically includes some or all of the following steps, each step provided with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

Figure 14:
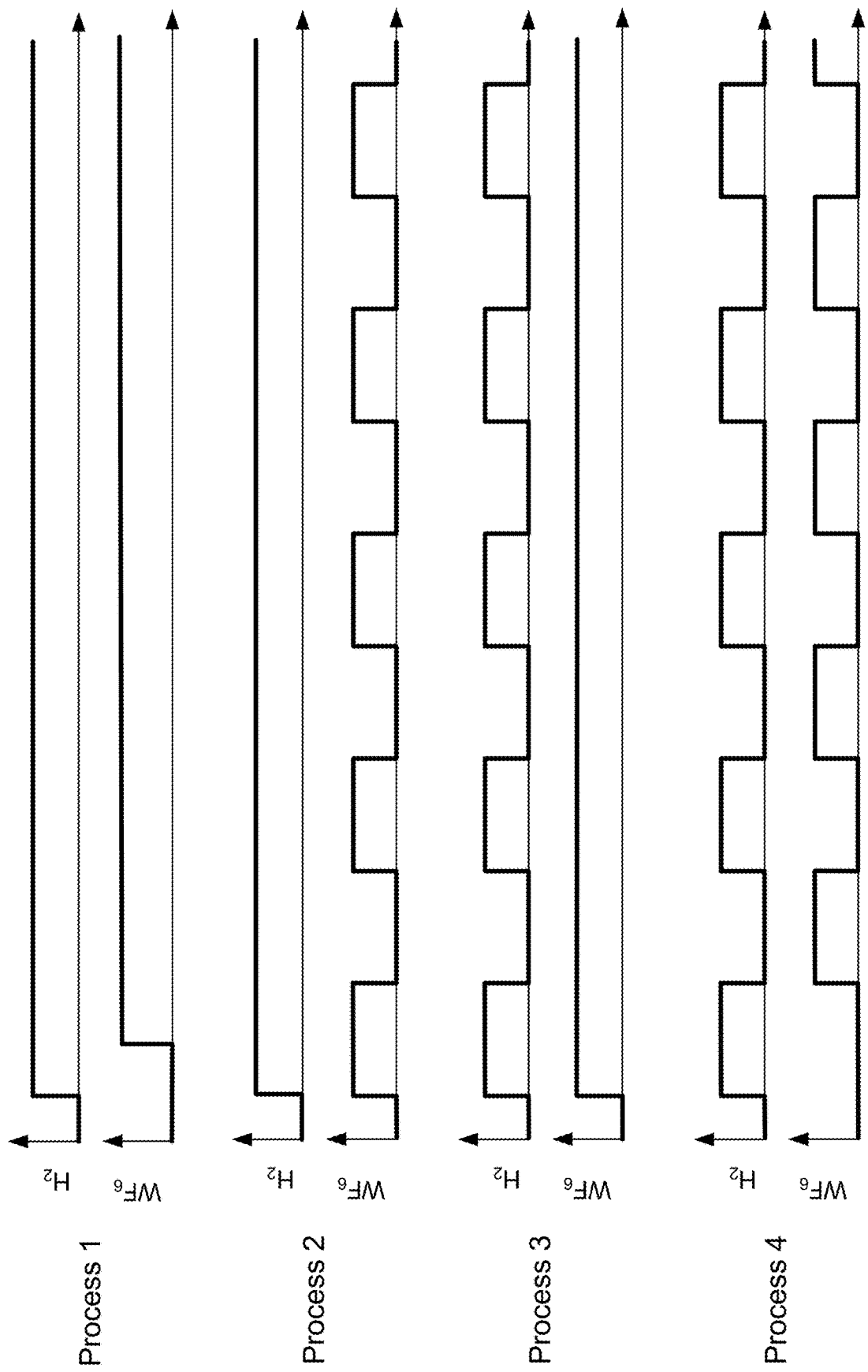
FIG. 14 depicts various timing sequence diagrams.

An experiment was conducted for four processes for depositing bulk tungsten at 395° C. at a pressure of 40 Torr. In each process, bulk tungsten was deposited on a tungsten nucleation layer deposited using atomic layer deposition (ALD) alternating cycles of diborane ($B_2H_6$) and tungsten hexafluoride ($WF_6$). FIG. 14 provides example pulsing schemes for each of these four processes. In Process 1, $H_2$ and $WF_6$ are simultaneously and continuously flowed into the chamber, such as during traditional chemical vapor deposition (CVD). In Process 2, $H_2$ is continuously flowed while $WF_6$ is pulsed (e.g., pulsed CVD). In Process 3, $WF_6$ is continuously flowed while $H_2$ is pulsed (e.g., pulsed CVD). In Process 4, $H_2$ and $WF_6$ are alternately pulsed using a method such as that described above with respect to FIG. 4B (e.g., sequential CVD). The thickness of the tungsten nucleation layer, the stress, nonuniformity, and resistivity of films deposited using each of these four processes were measured and compiled in Table 1 below.

TABLE 1

Resistivity and Stress

| Process | Nucleation Layer Thickness (Å) | Stress (Mpa) | Nonuniformity (%) | Resistivity (μohm-cm) |
|---|---|---|---|---|
| 1 | 507 | 2251 | 10.89 | 13.32 |
| 2 | 533 | 2207 | 4.31 | 12.79 |
| 3 | 517 | 2275 | 41.56 | 13.20 |
| 4 | 673 | 1634 | 21.77 | 10.81 |

As shown in Table 1, both the stress and the resistivity of the tungsten film deposited using Process 4 are significantly lower than the films deposited using any of Processes 1-3.

Experiment 2

Figure 15:
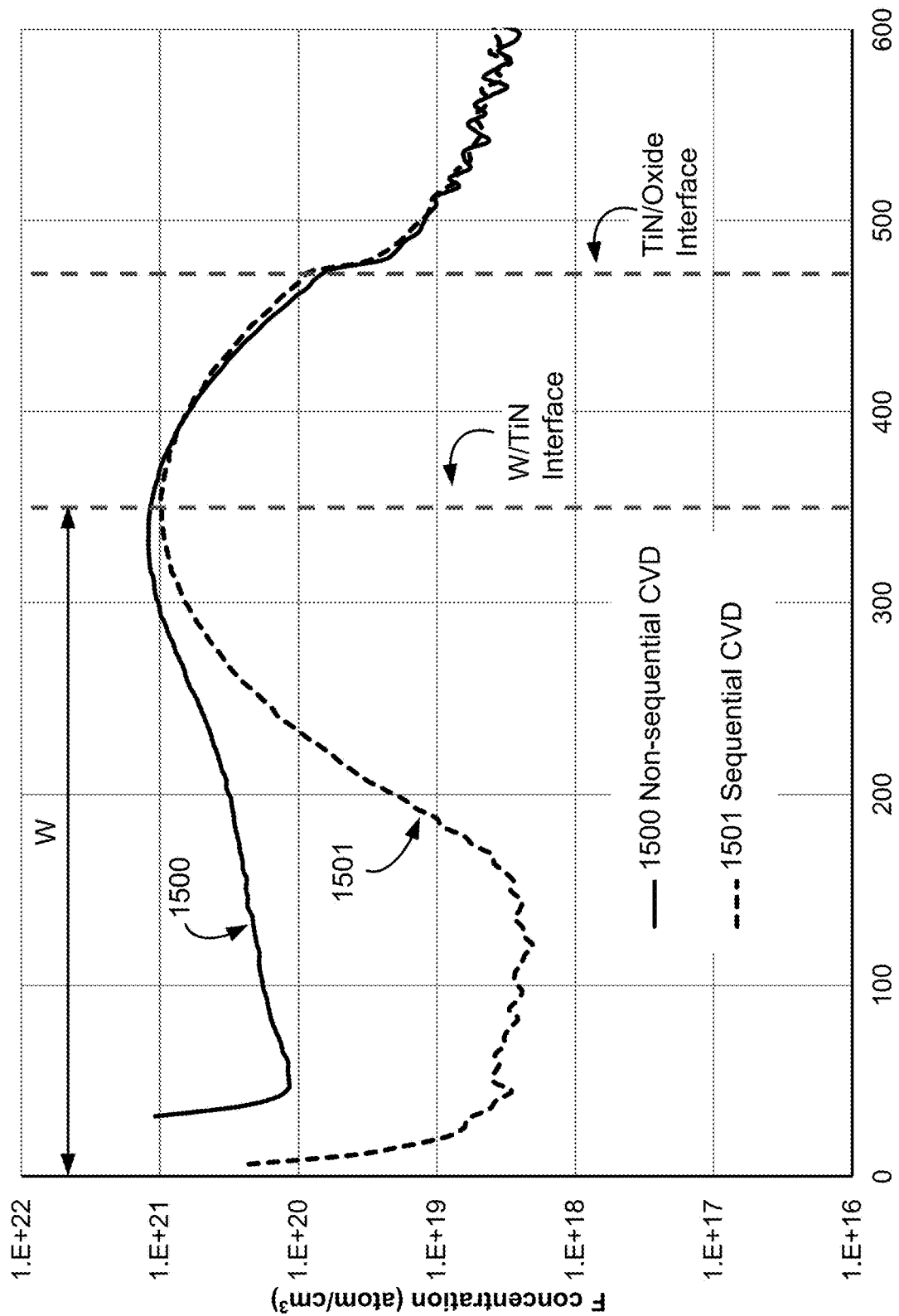
FIGS. 15, 16, 17, 18A-18B, and 19A-19B are plots of experimental results.

An experiment was conducted for processes for depositing bulk tungsten on two substrates, both substrates including a titanium nitride (TiN) barrier layer and a tungsten nucleation layer deposited by ALD alternating cycles of $B_2H_6$ and $WF_6$. One substrate involved deposition of bulk tungsten using non-sequential CVD, involving exposing the substrate to $WF_6$ and $H_2$ simultaneously at 300° C. Another substrate involved deposition of bulk tungsten using sequential CVD as described above with respect to FIG. 4B, involving alternating pulses of $WF_6$ and $H_2$ at a chamber pressure of 10 Torr. The fluorine concentration was measured for both substrates. The conditions for this experiment are shown in Table 2. The results are plotted in FIG. 15.

TABLE 2

| | 1500<br>Non-sequential CVD | 1501<br>Sequential CVD |
|---|---|---|
| Barrier Layer | TiN | TiN |
| Nucleation Layer | ALD<br>$B_2H_6/WF_6$ | ALD<br>$B_2H_6/WF_6$<br>10 Torr |
| Bulk Tungsten<br>Layer | CVD<br>$WF_6$ and $H_2$<br>300° C. | Sequential CVD<br>$WF_6/H_2$<br>10 Torr |

Line 1500 shows the fluorine concentration for the substrate with tungsten deposited by non-sequential CVD. Line 1501 shows the fluorine concentration for the substrate with tungsten deposited by sequential CVD. The W/TiN interface line at about 350 Å represents the interface between the tungsten nucleation layer and the TiN barrier layer. The TiN/Oxide interface dotted line at about 475 Å represents the interface between the TiN barrier layer and the oxide. Note that the fluorine concentration on the y-axis of the plot is by orders of magnitude, and the sequential CVD fluorine concentration 1501 is substantially lower than the non-sequential CVD fluorine concentration 1500—up to two orders of magnitude lower in fluorine concentration at some substrate depths.

Experiment 3

Figure 16:
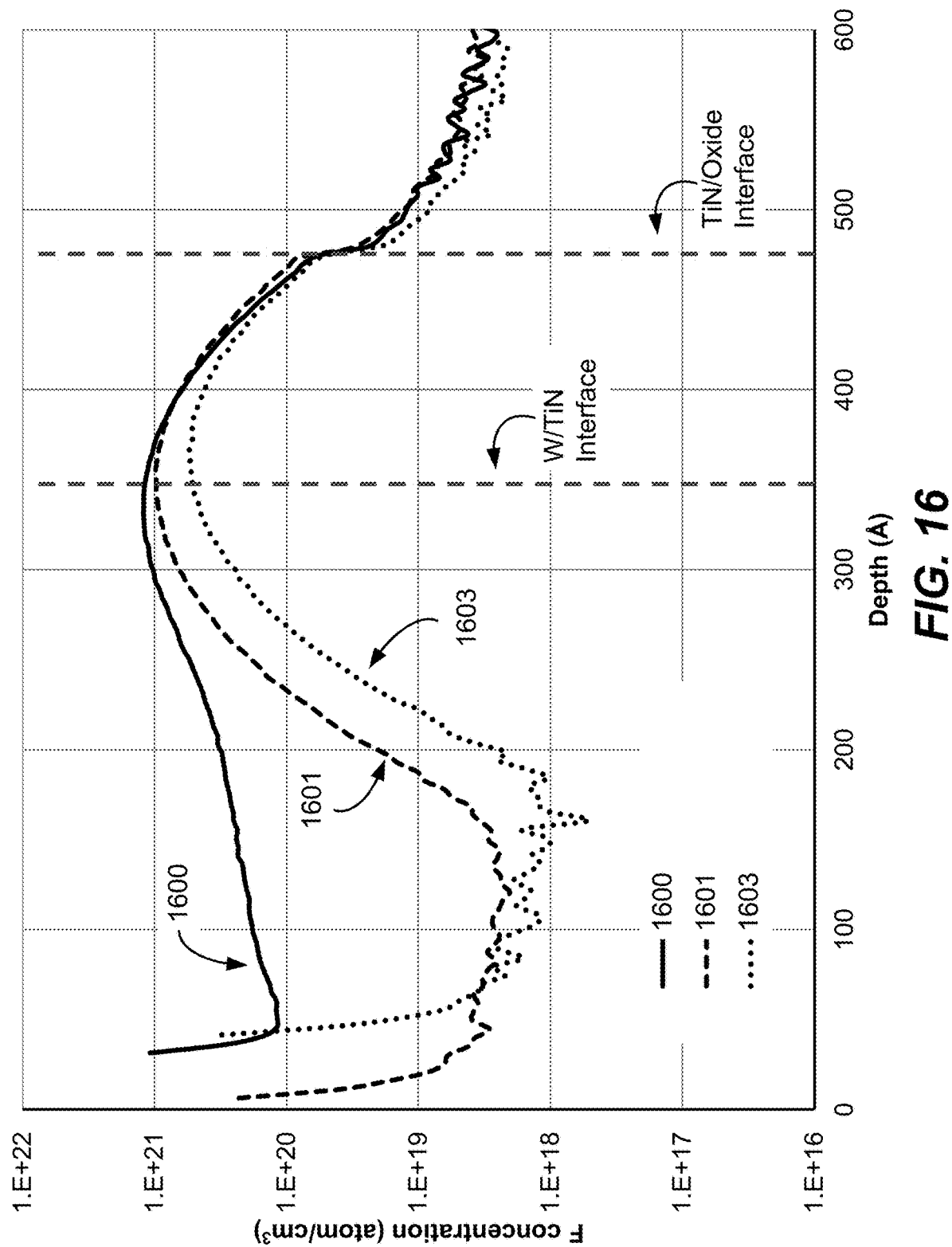

An experiment was conducted for processes for depositing bulk tungsten on substrates at different pressures. Three substrates each included a TiN barrier layer. One substrate involved deposition of a tungsten nucleation layer deposited by ALD alternating cycles of $B_2H_6$ and $WF_6$ at 10 Torr followed by CVD of bulk tungsten by exposing the substrate to $WF_6$ and $H_2$ at 300° C. Another substrate involved deposition of a tungsten nucleation layer deposited by ALD alternating cycles of $B_2H_6$ and $WF_6$ at 10 Torr followed by sequential CVD of bulk tungsten by alternating pulses of $WF_6$ and $H_2$ at 10 Torr. A third substrate involved ALD of a tungsten nucleation layer deposited by alternating cycles of $B_2H_6$ and $WF_6$ at 3 Torr followed by sequential CVD of bulk tungsten using alternating pulses of $WF_6$ and $H_2$ at 10 Torr. The fluorine concentration was measured for all three substrates. The conditions for this experiment are shown in Table 3. The results are plotted in FIG. 16.

TABLE 3

| | 1600<br>Non-sequential<br>CVD | 1601<br>Sequential CVD<br>at High P | 1603<br>Sequential CVD<br>at Low P |
|---|---|---|---|
| Barrier Layer | TiN | TiN | TiN |
| Nucleation Layer | ALD<br>$B_2H_6/WF_6$ | ALD<br>$B_2H_6/WF_6$<br>10 Torr | ALD<br>$B_2H_6/WF_6$<br>3 Torr |
| Bulk Tungsten<br>Layer | CVD<br>$WF_6$ and $H_2$<br>300° C. | Sequential CVD<br>$WF_6/H_2$<br>10 Torr | Sequential CVD<br>$WF_6/H_2$<br>10 Torr |

Line 1600 represents the fluorine concentration for the first substrate where bulk tungsten was deposited by non-sequential CVD. Dashed line 1601 represents the fluorine concentration for the second substrate where the nucleation layer was deposited at 10 Torr, followed by bulk tungsten deposited by sequential CVD. Dotted line 1603 represents the fluorine concentration for the third substrate where the nucleation layer was deposited at 3 Torr, followed by bulk tungsten deposited by sequential CVD. The results show that low pressure nucleation layer followed by sequential CVD (803) exhibited lower fluorine concentration than the second substrate (1601), even at the W/TiN interface and even in the TiN layer (between 350 Å and 475 Å). This suggests there may be reduced fluorine diffusion into the TiN layer and the oxide due to the reduced amount of fluorine concentration in the tungsten film.

Experiment 4

An experiment was conducted for processes for depositing bulk tungsten on substrates using different combinations of tungsten deposition. Three substrates were compared. One substrate included 1 kÅ of thermal oxide, 30 Å TiN, 18 Å tungsten nucleation layer deposited at 3 Torr using ALD alternating pulses of $WF_6$ and $B_2H_6$, and bulk tungsten deposited at 10 Torr using sequential CVD pulses of $WF_6$ and $H_2$. The fluorine concentration of this substrate is depicted by dashed line 912 in FIG. 17. Another substrate included 1 kÅ of thermal oxide, 30 Å TiN, 10 Å of fluorine-free tungsten, 12 Å tungsten nucleation layer deposited at 3 Torr using ALD alternating pulses of $WF_6$ and $B_2H_6$, and bulk tungsten deposited by sequential CVD at 10 Torr using pulses of $WF_6$ and $H_2$. The fluorine concentration of this second substrate is depicted by line 911 in FIG. 17. A third substrate included 5 kÅ of TEOS-deposited oxide, 30 Å of fluorine-free tungsten, 12 Å tungsten nucleation layer deposited at 3 Torr using ALD alternating pulses of $WF_6$ and $B_2H_6$, and bulk tungsten deposited by sequential CVD at 10 Torr using $WF_6$ and $H_2$. The fluorine concentration of this substrate is depicted by dotted line 1713 in FIG. 9. The layers as deposited on each substrate for this experiment are summarized in Table 4.

TABLE 4

| | 1711 | 1712 | 1713 |
|---|---|---|---|
| 1st Layer | 1 kÅ Thermal<br>Oxide | 1 kÅ Thermal<br>Oxide | 5 kÅ TEOS-<br>deposited Oxide |
| 2nd Layer | 30 Å TiN | 30 Å TiN | 30 Å Fluorine-<br>Free Tungsten |
| 3rd Layer | 10 Å Fluorine-<br>Free Tungsten | 18 Å ALD<br>Nucleation Layer<br>$B_2H_6/WF_6$<br>3 Torr | 12 Å ALD<br>Nucleation Layer<br>$B_2H_6/WF_6$<br>3 Torr |
| 4th Layer | 12 Å ALD<br>Nucleation Layer<br>$B_2H_6/WF_6$<br>3 Torr | Bulk W by<br>Sequential CVD<br>$WF_6/H_2$<br>10 Torr | Bulk W by<br>Sequential CVD<br>$WF_6/H_2$<br>10 Torr |
| 5th Layer | Bulk W by<br>Sequential CVD<br>$WF_6/H_2$<br>10 Torr | | |

Figure 17:
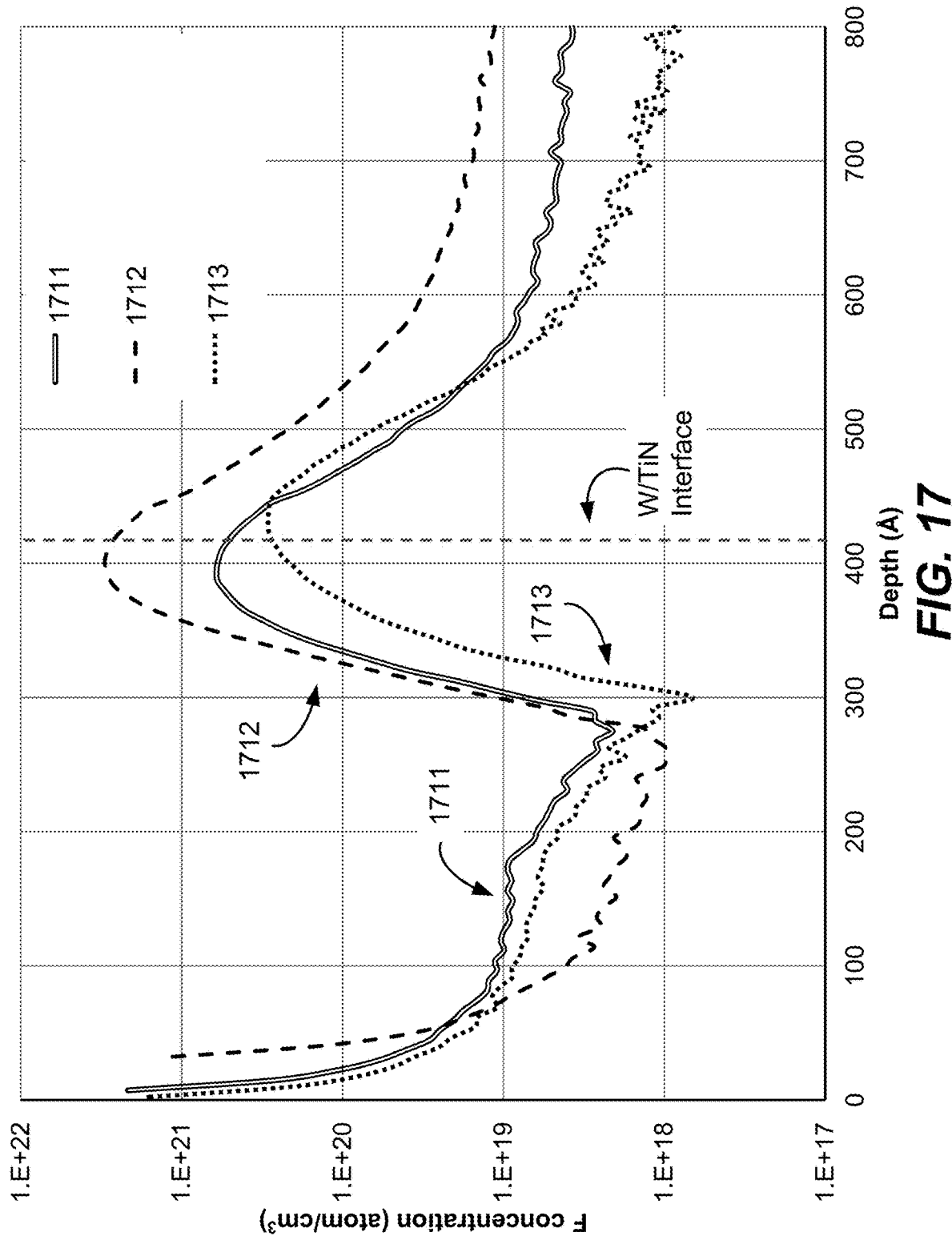

As shown in FIG. 17, fluorine concentration for films deposited using a combination of fluorine-free tungsten, low pressure nucleation layer, and sequential CVD had less fluorine diffusion (see lines 1711 and lines 1713 beyond the W/TiN interface where depths are greater than 425 Å). Fluorine concentration near the nucleation layer was lowest between 300 Å and 425 Å for the film with more fluorine-free tungsten deposited on the substrate, while bulk tungsten for the film deposited using sequential CVD and low pressure nucleation without a fluorine-free tungsten layer had lower fluorine concentration between about 50 Å and 300 Å (see line 1712). These results suggest that a combination of depositing fluorine-free tungsten and sequential CVD of tungsten may result in tungsten films achieving extremely low fluorine concentrations and reduced fluorine diffusion.

Experiment 5

Figure 18A:
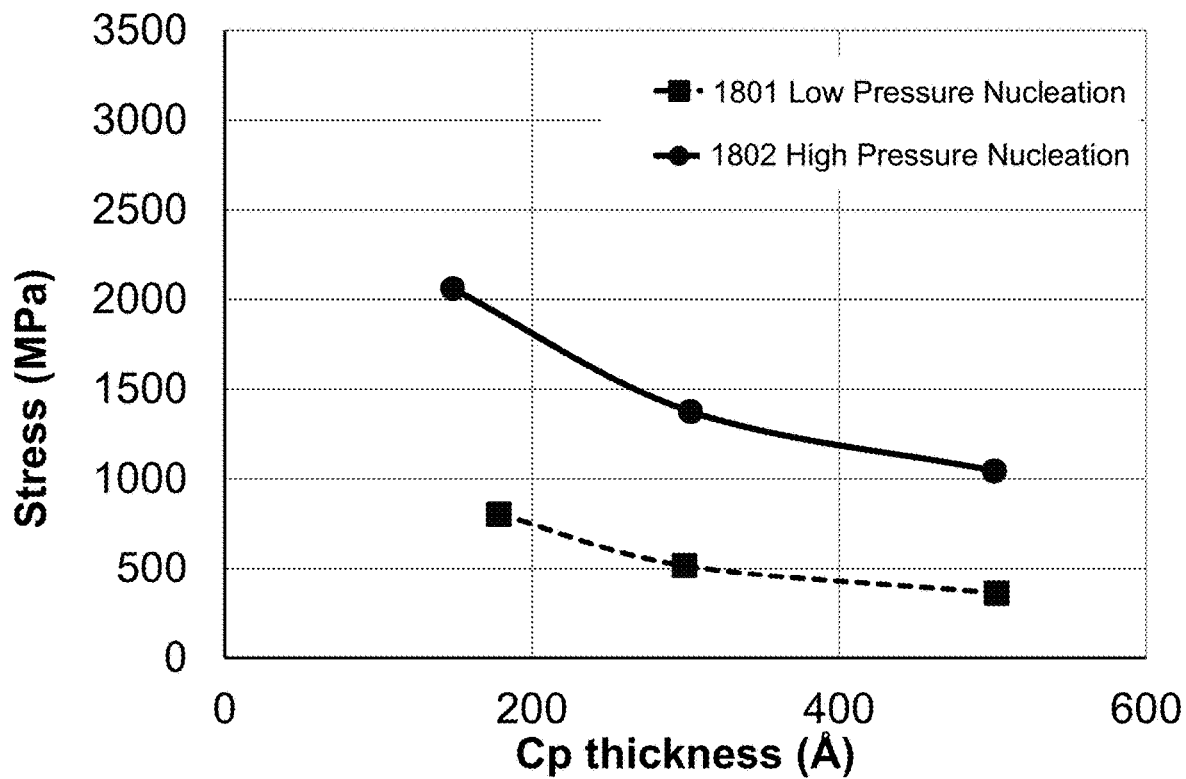
Figure 18B:
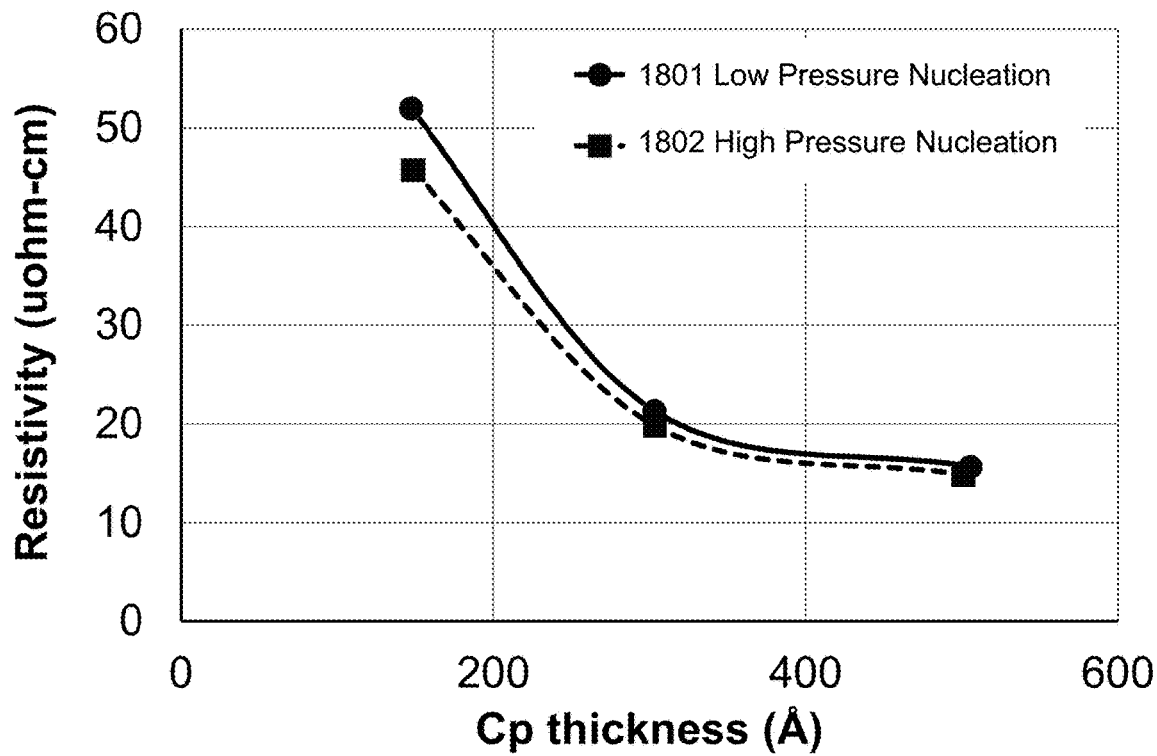

An experiment was conducted for processes films deposited by sequential CVD in combination with low pressure versus high pressure nucleation layer deposition. One substrate included a tungsten nucleation layer deposited using ALD alternating cycles of $WF_6$ and $B_2H_6$ at 10 Torr with bulk tungsten deposition by sequential CVD in accordance with FIG. 4B as described above using alternating pulses of $WF_6$ and $H_2$ at 10 Torr. The stress and resistivity of the film was measured at various thicknesses and is shown as line 1801 "low pressure nucleation" in FIGS. 18A and 18B. Another substrate included a tungsten nucleation layer deposited using ALD alternating cycles of $WF_6$ and $B_2H_6$ at 40 Torr with bulk tungsten deposition by sequential CVD in accordance with FIG. 4B as described above using alternating pulses of $WF_6$ and $H_2$ at 10 Torr. The stress and resistivity of the film was measured at various thicknesses and is shown as line 1802 "high pressure nucleation" in FIGS. 18A and 18B. Conditions for the nucleation and bulk layer depositions are shown in Table 5.

TABLE 5

Experiment 5 Conditions

|  | 1801 Low Pressure Nucleation | 1802 High Pressure Nucleation |
| --- | --- | --- |
| Nucleation Layer | ALD $B_2H_6/WF_6$ 10 Torr | ALD $B_2H_6/WF_6$ 40 Torr |
| Bulk Tungsten Layer | Sequential CVD $WF_6/H_2$ 10 Torr | Sequential CVD $WF_6/H_2$ 10 Torr |
| Temperature | 300° C. | |

As shown in the results, the substrate with the nucleation layer deposited at low pressure had substantially lower stress than the substrate with the nucleation layer deposited at high pressure, while the resistivity remained approximately the same.

Experiment 6

Figure 19A:
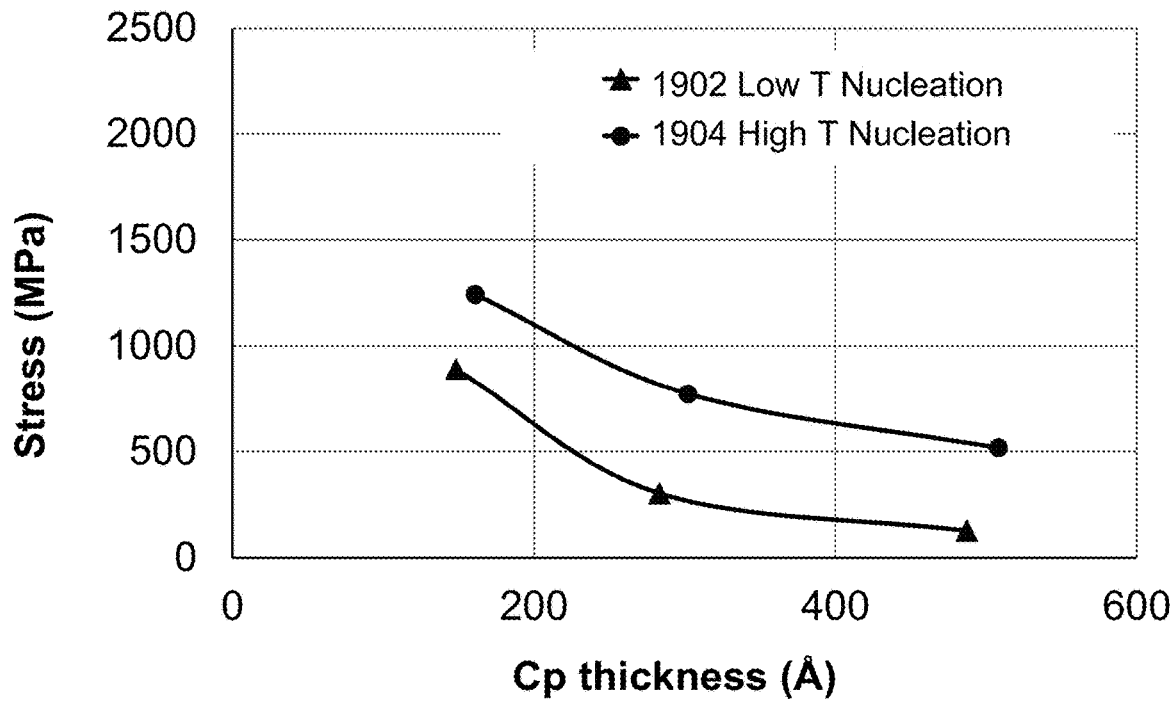
Figure 19B:
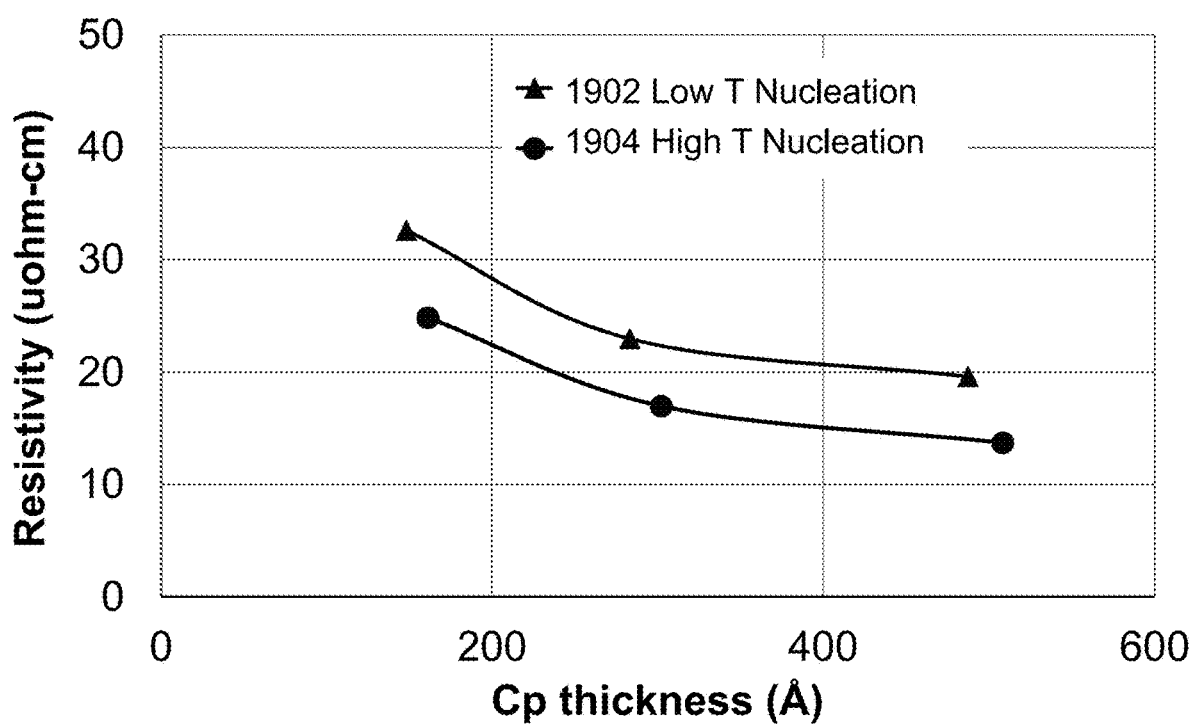

An experiment was conducted for processes films deposited by sequential CVD in combination with low temperature versus high temperature nucleation layer deposition. One substrate included a tungsten nucleation layer deposited using ALD alternating cycles of $WF_6$ and $B_2H_6$ at 10 Torr and 250° C. with bulk tungsten deposition by sequential CVD in accordance with FIG. 4B as described above using alternating pulses of $WF_6$ and $H_2$ at 10 Torr. The stress and resistivity of the film was measured at various thicknesses and is shown as line 1902 "low T nucleation" in FIGS. 19A and 19B. Another substrate included a tungsten nucleation layer deposited using ALD alternating cycles of $WF_6$ and $B_2H_6$ at 10 Torr and 300° C. with bulk tungsten deposition by sequential CVD in accordance with FIG. 4B as described above using alternating pulses of $WF_6$ and $H_2$ at 10 Torr. The stress and resistivity of the film was measured at various thicknesses and is shown as line 1904 "high T nucleation" in FIGS. 19A and 19B. Conditions for the nucleation and bulk layer depositions are shown in Table 6.

TABLE 6

Experiment 6 Conditions

|  | 1902 Low Temp Nucleation | 1904 High Temp Nucleation |
| --- | --- | --- |
| Nucleation Layer | ALD $B_2H_6/WF_6$ 10 Torr 250° C. | ALD $B_2H_6/WF_6$ 10 Torr 300° C. |
| Bulk Tungsten Layer | Sequential CVD $WF_6/H_2$ 10 Torr | Sequential CVD $WF_6/H_2$ 10 Torr |

As shown in the results, the substrate with the nucleation layer deposited at low temperature had substantially lower stress than the substrate with the nucleation layer deposited at high temperature, while the resistivity of the film deposited at higher temperature was slightly lower than the resistivity of the film deposited at lower temperature. These results suggest that lower temperature deposition of the nucleation layer in combination with sequential CVD bulk deposition can significantly reduce the stress of the film.

Experiment 7

An experiment was conducted for bWL fill with and without nitrogen addition. Nitrogen was added during hydrogen exposure for repetitions of the following cycle: tungsten-containing precursor exposure, purge using argon, reducing agent hydrogen gas exposure, and purge using argon. For the substrate where no nitrogen was used, deposition was performed at 430° C. involving deposition of a nucleation layer and repeated deposition cycles for depositing tungsten as described above. Line bending analysis is performed by measuring the line width and roughness of the trenches filled with metal (i.e. tungsten). The line bending analysis involves imaging the metal at the top of the device opening with plan-view microscopy and measuring the metal width at multiple points on multiple lines. For each line, the line width is measured across 100 points. From each line, one then calculates the average line width and the variation of the line width, sometimes defined as roughness. The "Line width mean" is the average of all the individual lines' average line width measured during analysis. For line bending two main metrics are defined as following: (i) line-to-line (LTL) variation is the standard deviation of the average line widths, thereby capturing the variation of line width changes across different lines on the image (ii) line width roughness (LWR) is the average of line roughness (variation of line width within each line) from all the measured lines, thereby capturing the average line width variation within single lines. These two metrics, LTL and LWR are combined into single variation metric, σ total, as described above. Furthermore, LTL and σ total are normalized with respect to line width mean, described as LTL % and σ total %. Examples of these calculations are depicted in Table 7 below.

For the substrate where nitrogen gas flow was introduced during reducing agent hydrogen gas exposure where 50% of the flow rate was nitrogen gas flow, the deposition was performed at 435° C. A nucleation layer was deposited and cycles of tungsten-containing precursor, argon purge, hydrogen and nitrogen co-flow, and argon purge were performed. The resulting line width mean, LTL, and LWR and the variance total, LTL percentage and variance total percentage are depicted in Table 7 below.

TABLE 7

Experiment 7 Results

|  | Without $N_2$ | With $N_2$ |
|---|---|---|
| Deposition Temperature | 430° C. | 435° C. |
| Line width mean (nm) | 19.74 | 21.11 |
| LTL (nm) | 2.68 | 1.15 |
| LWR (nm) | 1.11 | 0.97 |
| σ total (nm) | 2.90 | 1.51 |
| LTL % | 13.57 | 5.47 |
| σ total % | 14.70 | 7.13 |

These results are based on a cross section and top-down SEM image analysis. The pulse sequence used involved $N_2$ exposure during the reducing agent $H_2$ conversion. The results indicate that fill was good and line bending was minimal, with 50% $N_2$ in the bulk process. Line bending in the substrate where $N_2$ was used was substantially less than the line bending found in the substrate where $N_2$ was not used.

CONCLUSION

Although the foregoing embodiments have been described in some detail for purposes of clarity of understanding, it will be apparent that certain changes and modifications may be practiced within the scope of the appended sample claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
    providing a substrate having a dielectric surface to a chamber; and
    exposing the substrate to pulses of a molybdenum-containing precursor and a continuous flow of a reactant to deposit an elemental molybdenum film directly on the dielectric surface, wherein the molybdenum film is deposited at a chamber pressure of less than 10 torr, wherein the reactant is a borane, a germane, a phosphine, or any combination thereof, and wherein the wherein the molybdenum-containing precursor is a molybdenum chloride.

2. The method of claim 1, wherein the molybdenum-containing precursor is a molybdenum halide.

3. The method of claim 1, wherein the reactant comprises hydrogen ($H_2$).

4. The method of claim 3, wherein nitrogen is flowed with the $H_2$.

5. The method of claim 1, wherein the reactant is other than $H_2$.

6. The method of claim 1, wherein the substrate comprises a feature and the molybdenum film is deposited in the feature.

7. The method of claim 6, wherein the molybdenum film fills the feature.

8. The method of claim 1, wherein the molybdenum-containing precursor is adsorbed on the dielectric surface.

9. The method of claim 8, wherein the reactant reacts with the molybdenum-containing precursor.

10. The method of claim 1, wherein the reactant is adsorbed on the dielectric surface.

11. The method of claim 10, wherein the molybdenum-containing precursor reacts with the adsorbed reactant.

12. The method of claim 1, further comprising purging the chamber between the pulses of the molybdenum-containing precursor and the reactant.

13. The method of claim 1, wherein the deposition of the molybdenum film comprises a self-limiting reaction.

14. The method of claim 1, wherein the deposition of the molybdenum film is not self-limiting.

* * * * *